US010031392B2

(12) United States Patent
Nakada et al.

(10) Patent No.: US 10,031,392 B2
(45) Date of Patent: Jul. 24, 2018

(54) DISPLAY PANEL, INPUT/OUTPUT DEVICE, DATA PROCESSOR, AND METHOD FOR MANUFACTURING DISPLAY PANEL

(71) Applicant: Semiconductor Energy Laboratory Co., Ltd., Atsugi-shi, Kanagawa-ken (JP)

(72) Inventors: Masataka Nakada, Tochigi (JP); Masahiro Katayama, Tochigi (JP); Seiji Yasumoto, Tochigi (JP); Hiroki Adachi, Tochigi (JP); Masataka Sato, Tochigi (JP); Koji Kusunoki, Kanagawa (JP); Yoshiharu Hirakata, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/285,096

(22) Filed: Oct. 4, 2016

(65) Prior Publication Data
US 2017/0102598 A1    Apr. 13, 2017

(30) Foreign Application Priority Data

Oct. 12, 2015    (JP) .................................. 2015-201639

(51) Int. Cl.
*G02F 1/1362*        (2006.01)
*G06F 3/01*          (2006.01)
(Continued)

(52) U.S. Cl.
CPC .... *G02F 1/136286* (2013.01); *G02F 1/13338* (2013.01); *G06F 3/0412* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001403856 A | 3/2003 |
| CN | 001714380 A | 12/2005 |

(Continued)

OTHER PUBLICATIONS

International Search Report (Application No. PCT/IB2016/055898) dated Jan. 24, 2017.
(Continued)

*Primary Examiner* — Ashok Patel
(74) *Attorney, Agent, or Firm* — Fish & Richardson P.C.

(57) ABSTRACT

Provided is a novel display panel that is highly convenient or highly reliable, a novel input/output device that is highly convenient or highly reliable, or a method for manufacturing a novel display panel that is highly convenient or highly reliable. The present inventors conceived a structure including a first intermediate film, a first electrode including a region in contact with the first intermediate film, a pixel that includes a first display element including the first electrode and a pixel circuit electrically connected to the first display element, a signal line electrically connected to the pixel, and a terminal that includes a third conductive film electrically connected to the signal line and a second intermediate film including a region in contact with the third conductive film.

13 Claims, 33 Drawing Sheets

(51) Int. Cl.
*G02F 1/1335* (2006.01)
*G06F 3/041* (2006.01)
*G02F 1/1345* (2006.01)
*G02F 1/1333* (2006.01)
*H01L 27/12* (2006.01)

(52) U.S. Cl.
CPC .. *G06F 2203/04103* (2013.01); *H01L 27/124* (2013.01); *H01L 27/1225* (2013.01); *H01L 27/1255* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,248,235 B2 | 7/2007 | Fujii et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,830,424 B2 | 9/2014 | Hirakata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0168491 A1* | 8/2005 | Takahara .............. G09G 3/006 345/690 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0072047 A1 | 4/2006 | Sekiguchi |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0152934 A1* | 7/2007 | Maeda ................ G09G 3/3233 345/92 |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0242031 A1 | 10/2007 | Kimura et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0157216 A1 | 6/2011 | Yamazaki et al. |
| 2011/0205468 A1 | 8/2011 | Hirakata et al. |
| 2011/0242070 A1 | 10/2011 | Yamazaki et al. |
| 2013/0337596 A1* | 12/2013 | Hung .................. H01L 51/56 438/34 |
| 2014/0014960 A1 | 1/2014 | Yamazaki et al. |
| 2014/0234664 A1 | 8/2014 | Yasumoto et al. |
| 2015/0348961 A1* | 12/2015 | Isobe ................ H01L 27/0266 361/56 |
| 2015/0364073 A1 | 12/2015 | Ogawa |
| 2016/0042702 A1 | 2/2016 | Hirakata et al. |
| 2016/0118420 A1* | 4/2016 | Yang .................. H01L 27/1255 257/40 |
| 2016/0283028 A1 | 9/2016 | Yamazaki et al. |
| 2016/0299387 A1 | 10/2016 | Yamazaki et al. |
| 2016/0313769 A1 | 10/2016 | Yoshitani et al. |
| 2017/0040402 A1 | 2/2017 | Yasumoto et al. |

FOREIGN PATENT DOCUMENTS

| | | |
|---|---|---|
| CN | 102844873 A | 12/2012 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-196702 A | 7/2002 |
| JP | 2002-289859 A | 10/2002 |

(56) References Cited

FOREIGN PATENT DOCUMENTS

| | | |
|---|---|---|
| JP | 2003-076302 A | 3/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-350312 A | 12/2006 |
| JP | 2011-191750 A | 9/2011 |
| JP | 2011-227479 A | 11/2011 |
| JP | 2014-032960 A | 2/2014 |
| JP | 2014-187356 A | 10/2014 |
| KR | 2014-0009024 A | 1/2014 |
| WO | WO-2004/053819 | 6/2004 |
| WO | WO-2004/114391 | 12/2004 |

OTHER PUBLICATIONS

Written Opinion (Application No. PCT/IB2016/055898) dated Jan. 24, 2017.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technology Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—In-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semicunductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID 07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshop, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 :Proceedings of the 15th International Display Workshops, Dec. 2, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 1A
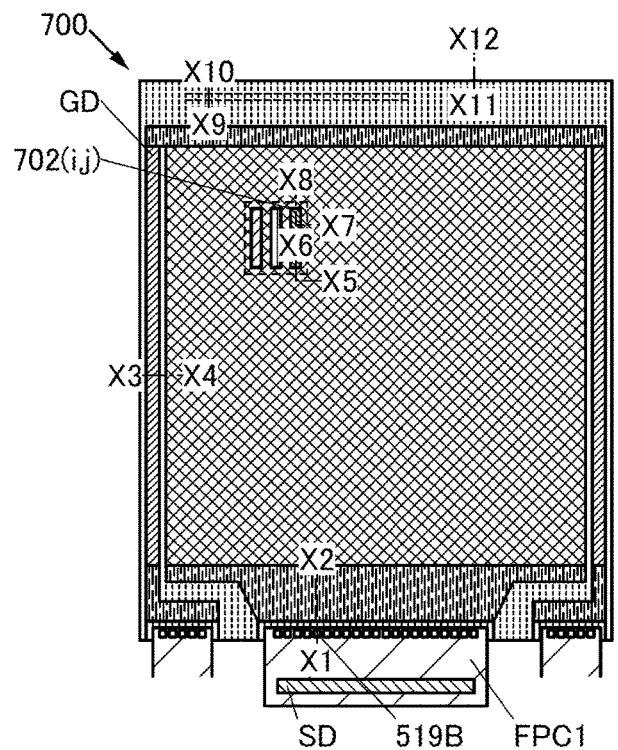
FIG. 1B1
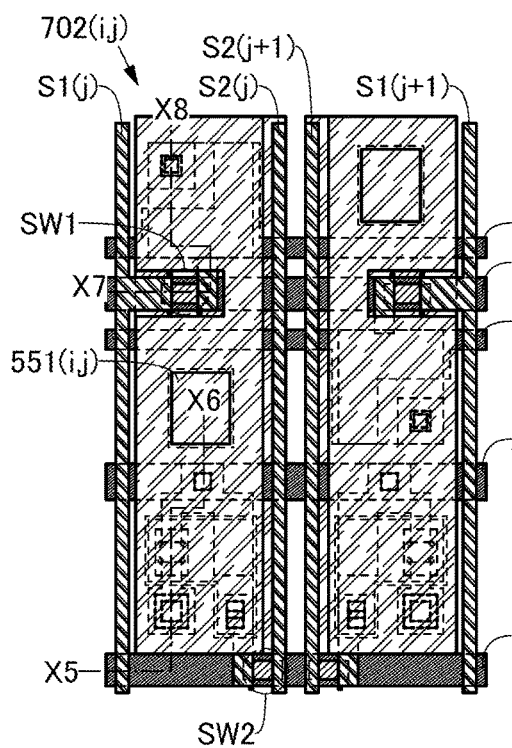
FIG. 1B2
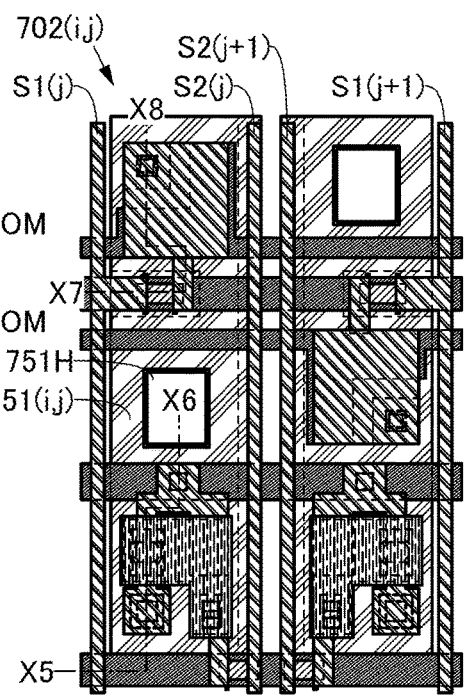

FIG. 5A
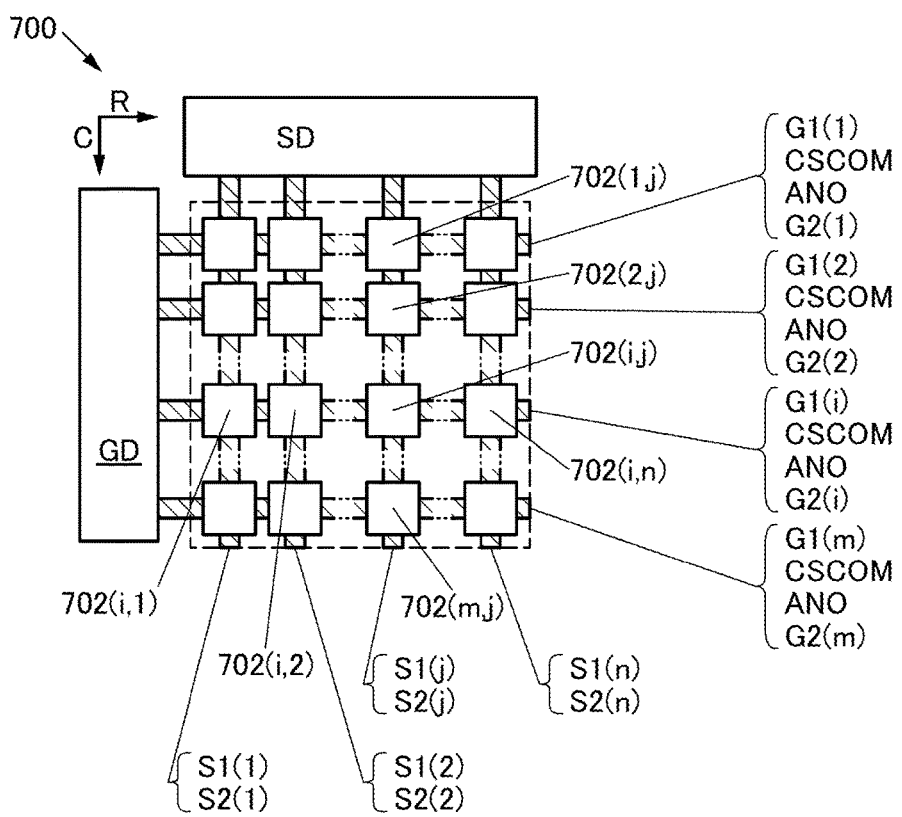
FIG. 5B1
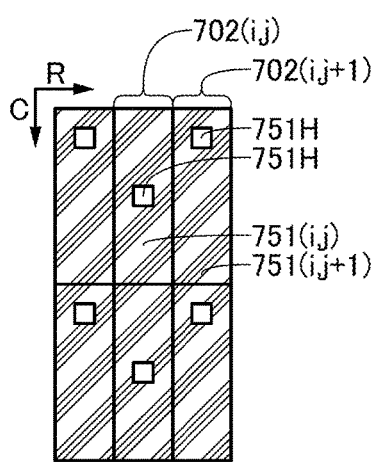
FIG. 5B2
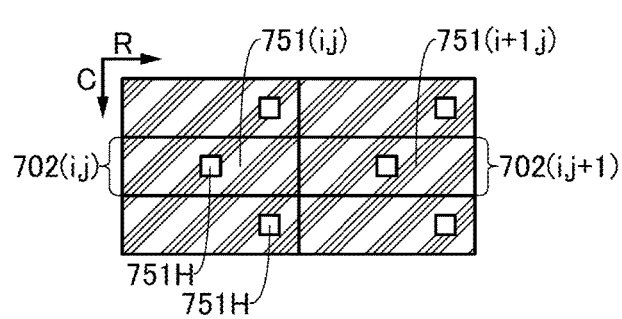

FIG. 6A
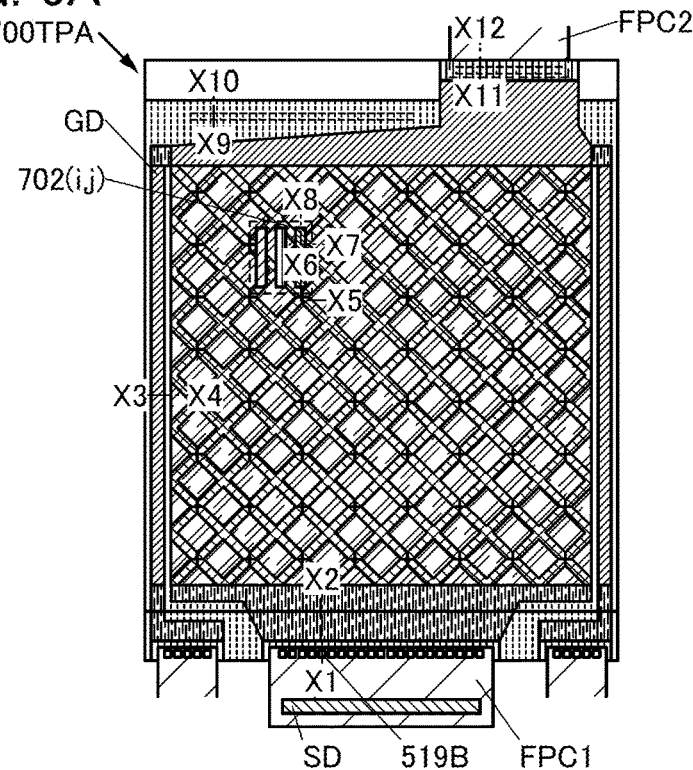
FIG. 6B1
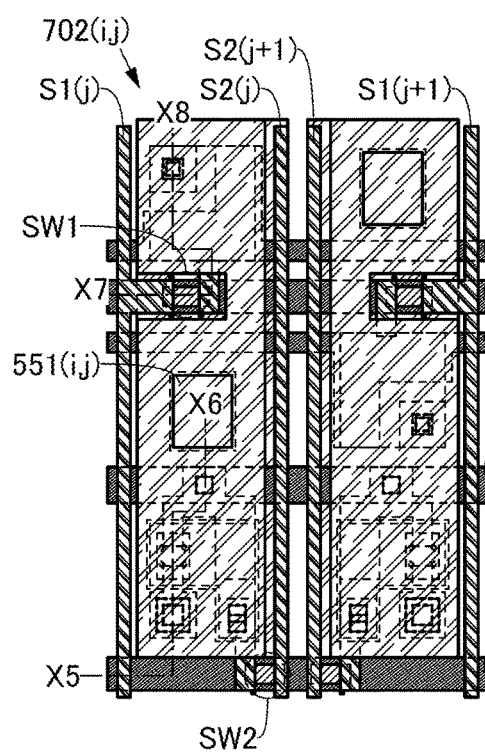
FIG. 6B2
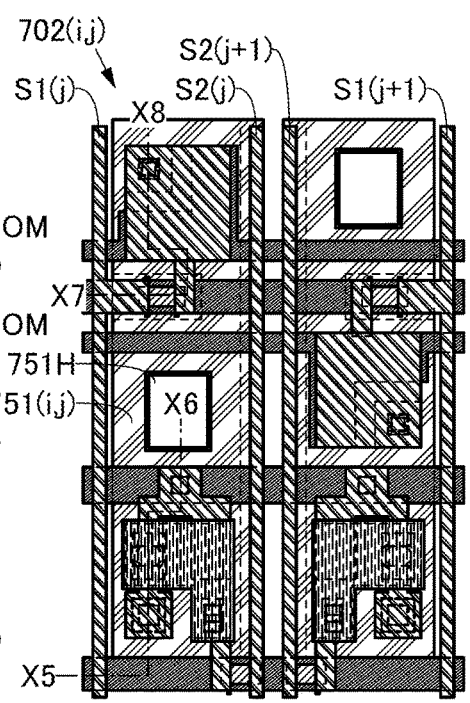

FIG. 9A
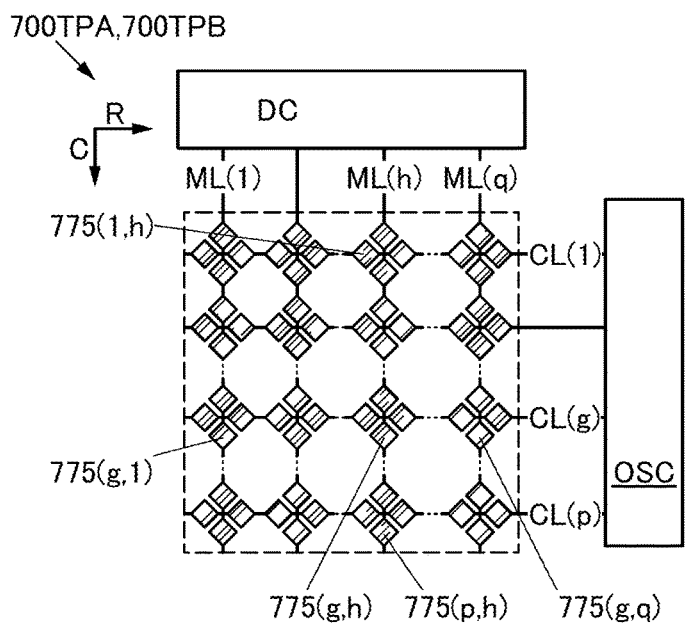
FIG. 9B1
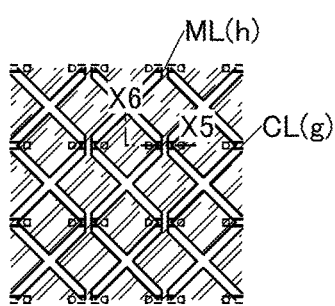
FIG. 9B2
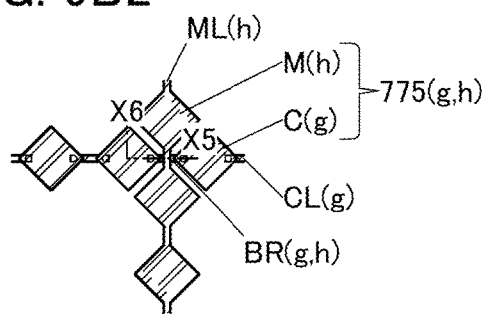

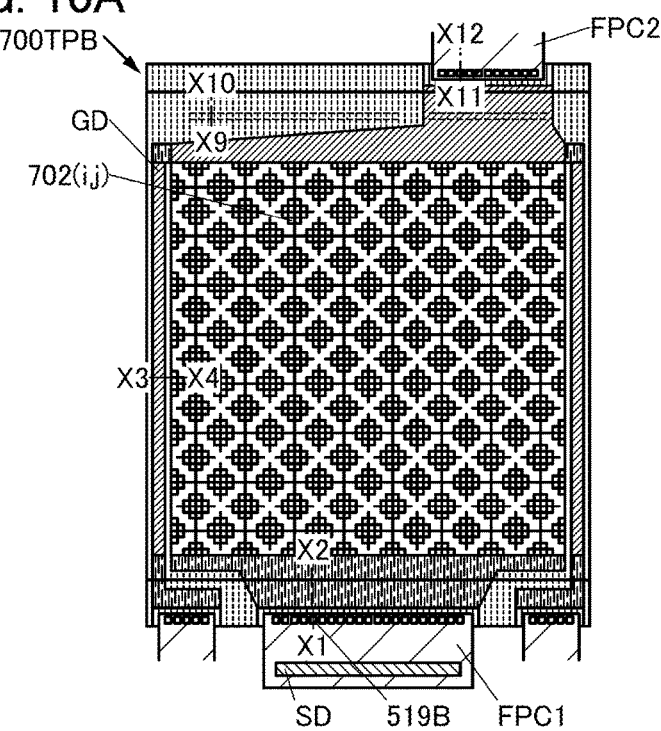
FIG. 10A
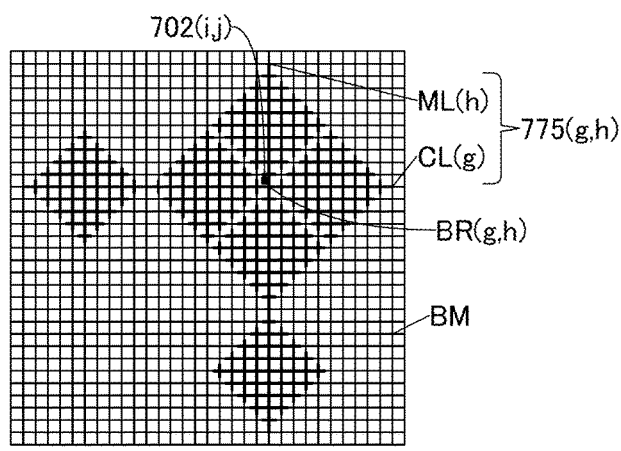
FIG. 10B1
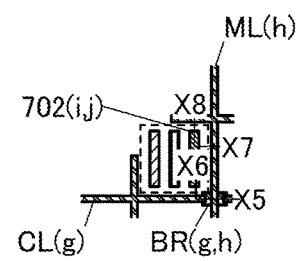
FIG. 10B2

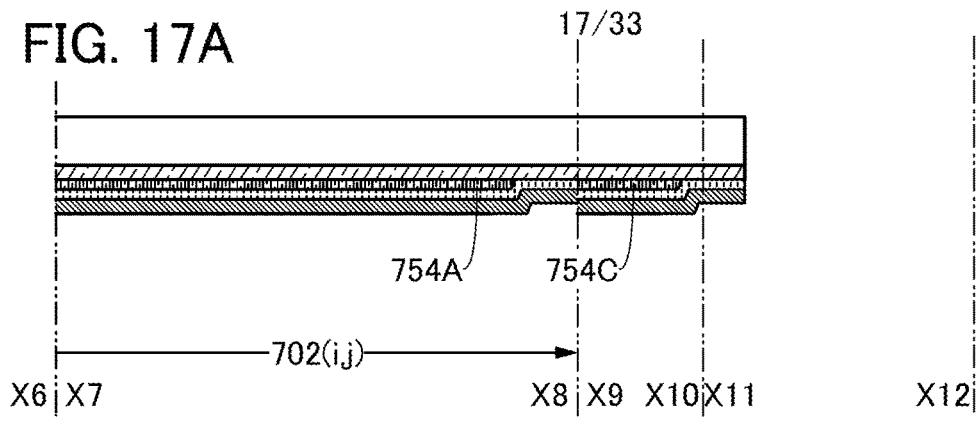
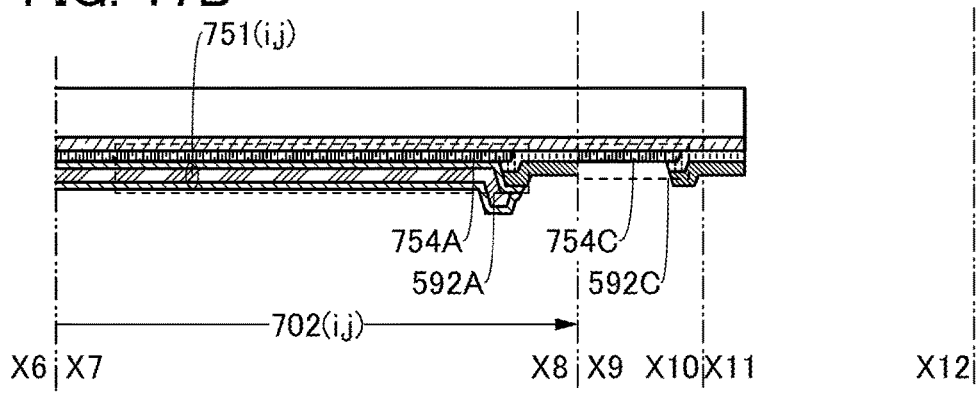
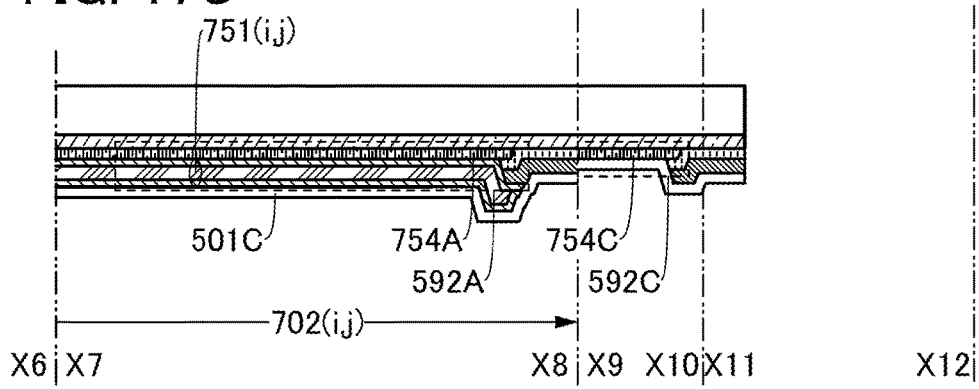

DISPLAY PANEL, INPUT/OUTPUT DEVICE, DATA PROCESSOR, AND METHOD FOR MANUFACTURING DISPLAY PANEL

TECHNICAL FIELD

One embodiment of the present invention relates to a display panel, an input/output device, a data processor, a semiconductor device, or a method for manufacturing a semiconductor device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A liquid crystal display device in which a light-condensing means and a pixel electrode are provided on the same surface side of a substrate and a region transmitting visible light in the pixel electrode is provided so as to overlap with an optical axis of the light-condensing means, and a liquid crystal display device that includes an anisotropic light-condensing means having a condensing direction X and a non-condensing direction Y that is along a longitudinal direction of a region transmitting visible light in a pixel electrode are known (Patent Document 1).

REFERENCE

Patent Document

[Patent Document 1] Japanese Published Patent Application No. 2011-191750

DISCLOSURE OF INVENTION

An object of one embodiment of the present invention is to provide a novel display panel that is highly convenient or highly reliable. Another object is to provide a novel input/output device that is highly convenient or highly reliable. Another object is to provide a method for manufacturing a novel display panel that is highly convenient or highly reliable. Another object is to provide a novel display panel, a novel input/output device, a novel method for manufacturing a display panel, or a novel semiconductor device.

Note that the descriptions of these objects do not disturb the existence of other objects. In one embodiment of the present invention, there is no need to achieve all the objects. Other objects are apparent from and can be derived from the description of the specification, the drawings, the claims, and the like.

(1) One embodiment of the present invention is a display panel including a signal line, a pixel, and a terminal.

The pixel is electrically connected to the signal line. The pixel includes a pixel circuit, a second display element, a second conductive film, a first conductive film, a first insulating film, a first display element, and a first intermediate film.

The pixel circuit is electrically connected to the signal line.

The second display element is electrically connected to the pixel circuit.

The second conductive film is electrically connected to the pixel circuit.

The first conductive film includes a region overlapping with the second conductive film.

The first insulating film includes a region between the second conductive film and the first conductive film. The first insulating film includes an opening in the region between the first conductive film and the second conductive film.

The second conductive film is electrically connected to the first conductive film in the opening.

The first display element is electrically connected to the first conductive film. The first display element includes a first electrode electrically connected to the first conductive film.

The first conductive film is between a region of the first intermediate film and the first insulating film. The first intermediate film includes a region in contact with the first electrode.

The terminal is electrically connected to the signal line. The terminal includes a third conductive film and a second intermediate film.

The third conductive film is electrically connected to the signal line.

The second intermediate film includes a region in contact with the third conductive film. The region where the second intermediate film is in contact with the third conductive film is larger than the region where the first intermediate film is in contact with the first electrode.

(2) Another embodiment of the present invention is the display panel in which the first intermediate film contains a conductive oxide or an oxide semiconductor and the second intermediate film contains a conductive oxide or an oxide semiconductor.

(3) Another embodiment of the present invention is the display panel in which the region where the first intermediate film is in contact with the first electrode has an area greater than or equal to 400 $\mu m^2$ and less than or equal to 1900 $\mu m^2$.

(4) Another embodiment of the present invention is the display panel in which the region where the second intermediate film is in contact with the third conductive film has an area greater than or equal to 0.02 $mm^2$.

The display panel of one embodiment of the present invention includes the first intermediate film, the first electrode that includes the region in contact with the first intermediate film, the pixel that includes the first display element including the first electrode and the pixel circuit electrically connected to the first display element, the signal line electrically connected to the pixel, and the terminal that includes the third conductive film electrically connected to the signal line and the second intermediate film including the region in contact with the third conductive film.

Accordingly, a signal used to drive the first display element can be supplied to the third conductive film in contact with the second intermediate film. Alternatively, the signal can be used to drive the first display element that includes the first electrode in contact with the first intermediate film. As a result, a novel display panel that is highly convenient or highly reliable can be provided.

(5) Another embodiment of the present invention is the display panel including a second insulating film.

The second insulating film includes a first opening and a second opening.

The first opening includes a region overlapping with the first intermediate film and the first electrode or a region overlapping with the first intermediate film and the first insulating film.

The second opening includes a region overlapping with the second intermediate film and the third conductive film.

The second insulating film includes a region that is along an outer edge of the first opening and is between the first intermediate film and the first insulating film. The second insulating film also includes a region that is along an outer edge of the second opening and is between the second intermediate film and the third conductive film.

(6) Another embodiment of the present invention is the display panel in which the first intermediate film includes a side end portion covered with the second insulating film and the second intermediate film includes a side end portion covered with the second insulating film.

The display panel of one embodiment of the present invention includes the second insulating film. The second insulating film includes the first opening including the region overlapping with the first intermediate film and the first electrode or the region overlapping with the first intermediate film and the first insulating film, and includes the second opening overlapping with the second intermediate film and the third conductive film. Accordingly, the first intermediate film in contact with the first electrode and the second intermediate film in contact with the third conductive film can be made uncovered by the second insulating film while impurities are prevented from being diffused into the pixel circuit and the second display element. As a result, a novel display panel that is highly convenient or highly reliable can be provided.

(7) Another embodiment of the present invention is the display panel in which the second display element is positioned so that display using the second display element can be seen from part of a region where display using the first display element can be seen.

Accordingly, display using the second display element can be seen from part of the region where display using the first display element can be seen. Alternatively, users can see display without changing the attitude or the like of the display panel. As a result, a novel display panel that is highly convenient or highly reliable can be provided.

(8) Another embodiment of the present invention is the display panel in which the second display element is configured to perform display in a region surrounded by a region where the first display element performs display.

(9) Another embodiment of the present invention is the display panel in which the first display element includes a reflective film and is configured to control an intensity of reflected light.

The reflective film is configured to reflect incident light. The reflective film includes an opening.

The second display element is configured to emit light toward the opening.

(10) Another embodiment of the present invention is the display panel including a group of pixels, another group of pixels, and a scan line.

The pixel is included in the group of pixels. The group of pixels are arranged in a row direction.

The pixel is also included in the another group of pixels. The another group of pixels are arranged in a column direction intersecting the row direction.

The scan line is electrically connected to the group of pixels arranged in the row direction.

The another group of pixels arranged in the column direction are electrically connected to the signal line.

A pixel adjacent to one pixel in the row direction or the column direction includes an opening in a position different from that of an opening in the one pixel.

The display panel of one embodiment of the present invention includes the first display element, the first conductive film electrically connected to the first display element, the second conductive film including the region overlapping with the first conductive film, the first insulating film including the region between the second conductive film and the first conductive film, the first intermediate film, the pixel circuit electrically connected to the second conductive film, and the second display element electrically connected to the pixel circuit. The first intermediate film includes a region; the first conductive film is between the region and the second conductive film. The first insulating film includes the opening. The second conductive film is electrically connected to the first conductive film in the opening.

Accordingly, for example, the first display element and the second display element that performs display using a method different from that of the first display element can be driven using pixel circuits that can be formed in the same process. As a result, a novel display panel that is highly convenient or highly reliable can be provided.

(11) Another embodiment of the present invention is an input/output device including the display panel and an input portion.

The input portion includes a region overlapping with the display panel. The input portion is configured to sense an object approaching the region overlapping with the display panel. The input portion includes a control line, a signal line, and a sensing element.

The control line extends in a row direction. The signal line extends in a column direction intersecting the row direction.

The sensing element has a light-transmitting property. The sensing element includes a first electrode electrically connected to the control line and a second electrode electrically connected to the signal line.

The second electrode is positioned so that an electric field that is partly blocked by the object approaching the region overlapping with the display panel is generated between the first electrode and the second electrode.

(12) Another embodiment of the present invention is the input/output device in which the sensing element includes a region overlapping with the pixel.

The first electrode includes a light-transmitting conductive film. The second electrode includes a light-transmitting conductive film.

The input/output device of one embodiment of the present invention includes the light-transmitting sensing element in the region overlapping with the pixel. Accordingly, an object that approaches the region overlapping with the display panel can be sensed without disturbing display of the display panel. As a result, a novel input/output device that is highly convenient or highly reliable can be provided.

(13) Another embodiment of the present invention is a data processor including any of the above display panels and one or more of a keyboard, a hardware button, a pointing device, a touch sensor, an illuminance sensor, an imaging device, an audio input device, a sight input device, and an attitude detection device.

Thus, power consumption can be reduced and excellent visibility can be obtained even in a bright place. As a result, a novel data processor that is highly convenient or highly reliable can be provided.

(14) Another embodiment of the present invention is a manufacturing method of a display panel including first to twelfth steps.

In the first step, a first intermediate film and a second intermediate film each including a region overlapping with a process substrate are formed.

In the second step, a second insulating film is formed so as to cover the first intermediate film and the second intermediate film.

In the third step, the second insulating film is heated.

In the fourth step, a first opening and a second opening are formed in the second insulating film.

In the fifth step, a first conductive film including a region overlapping with the first intermediate film is formed.

In the sixth step, a first insulating film is formed.

In the seventh step, one opening is formed in the first insulating film in a region overlapping with the first conductive film; another opening is formed in the first insulating film in a region overlapping with the second intermediate film; and a second conductive film overlapping with the one opening, a third conductive film overlapping with the another opening, and the pixel circuit are formed.

In the eighth step, a second display element electrically connected to the pixel circuit is formed.

In the ninth step, a second substrate is stacked such that the second display element is located between the process substrate and the second substrate.

In the tenth step, separation from the process substrate is performed.

In the eleventh step, an alignment film is formed such that the first intermediate film is located between the first conductive film and the alignment film.

In the twelfth step, a substrate is stacked such that the alignment film is located between the first conductive film and the substrate.

The method for manufacturing a display panel of one embodiment of the present invention includes the step of forming the first intermediate film and the second intermediate film, the step of forming the second insulating film that covers the first intermediate film and the second intermediate film, and the step of separation from the process substrate. Accordingly, a region where the first intermediate film is not covered with the second insulating film and a region where the second intermediate film is not covered with the second insulating film can be formed. As a result, a method for manufacturing a novel display panel that is highly convenient or highly reliable can be provided.

Although the block diagram attached to this specification shows components classified by their functions in independent blocks, it is difficult to classify actual components according to their functions completely, and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

Note that in this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

Note that in this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor so that current, voltage, or a potential can be supplied or transmitted.

In this specification, even when different components are connected to each other in a circuit diagram, there is actually a case where one conductive film has functions of a plurality of components such as a case where part of a wiring serves as an electrode. The term "connection" in this specification also means such a case where one conductive film has functions of a plurality of components.

Furthermore, in this specification, one of a first electrode and a second electrode of a transistor refers to a source electrode and the other refers to a drain electrode.

One embodiment of the present invention can provide a novel display panel that is highly convenient or highly reliable, a novel input/output device that is highly convenient or reliable, a method for manufacturing a novel display panel that is highly convenient or reliable, a novel display panel, a novel input/output device, a novel method for manufacturing a display panel, or a novel semiconductor device.

Note that the descriptions of these effects do not preclude the existence of other effects. One embodiment of the present invention does not necessarily have all the effects listed above. Other effects are apparent from and can be derived from the description of the specification, the drawings, the claims, and the like.

BRIEF DESCRIPTION OF DRAWINGS

FIGS. 1A, 1B1, and 1B2 illustrate the structure of a display panel of one embodiment.

FIGS. 5A, 5B1, and 5B2 are a block diagram and schematic diagrams each illustrating the structure of a display panel of one embodiment.

FIGS. 6A, 6B1, and 6B2 illustrate the structure of an input/output device of one embodiment.

FIGS. 9A, 9B1, and 9B2 illustrate the structure of a sensing element of an input/output device of one embodiment.

FIGS. 10A, 10B1, and 10B2 illustrate the structure of an input/output device of one embodiment.

FIGS. 17A to 17C illustrate a method for manufacturing a display panel of one embodiment.

BEST MODE FOR CARRYING OUT THE INVENTION

Figure 2A:
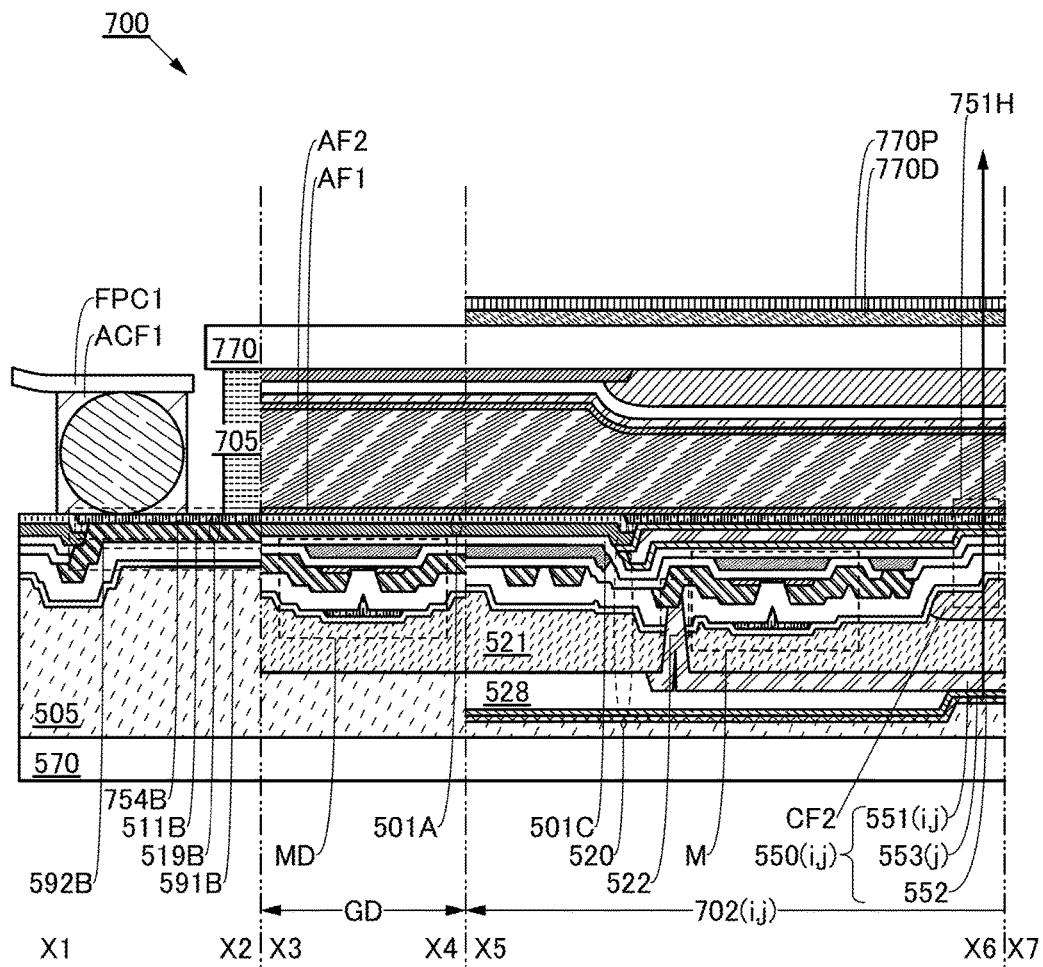
FIGS. 2A and 2B are cross-sectional views illustrating a cross-sectional structure of a display panel of one embodiment.

A display panel of one embodiment of the present invention includes a first intermediate film, a first electrode that includes a region in contact with the first intermediate film, a pixel that includes a first display element including the first electrode and a pixel circuit electrically connected to the first display element, a signal line electrically connected to the pixel, and a terminal that includes a third conductive film electrically connected to the signal line and a second intermediate film including a region in contact with the third conductive film.

Accordingly, a signal used to drive the first display element can be supplied to the third conductive film in contact with the second intermediate film. Alternatively, the signal can be used to drive the first display element that includes the first electrode in contact with the first intermediate film. As a result, a novel display panel that is highly convenient or highly reliable can be provided.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments. Note that in structures of the present invention described below, the same portions or portions having similar functions are denoted by the same reference numerals in different drawings, and a description thereof is not repeated.

Embodiment 1

In this embodiment, the structure of a display panel of one embodiment of the present invention will be described with reference to FIGS. 1A, 1B1, and 1B2, FIGS. 2A and 2B, FIGS. 3A and 3B, FIG. 4, and FIGS. 5A, 5B1, and 5B2.

FIGS. 1A, 1B1, and 1B2 illustrate the structure of a display panel 700 of one embodiment of the present invention. FIG. 1A is a top view of the display panel 700 of one embodiment of the present invention. FIG. 1B1 is a bottom view illustrating part of FIG. 1A. FIG. 1B2 is a bottom view omitting some components illustrated in FIG. 1B1.

Figure 2B:
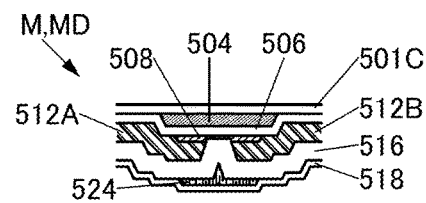

FIGS. 2A and 2B illustrate the structure of the display panel 700 of one embodiment of the present invention. FIG. 2A is a cross-sectional view taken along cutting plane lines X1-X2, X3-X4, and X5-X6 in FIG. 1A. FIG. 2B is a cross-sectional view illustrating some components of the display panel.

Figure 3A:
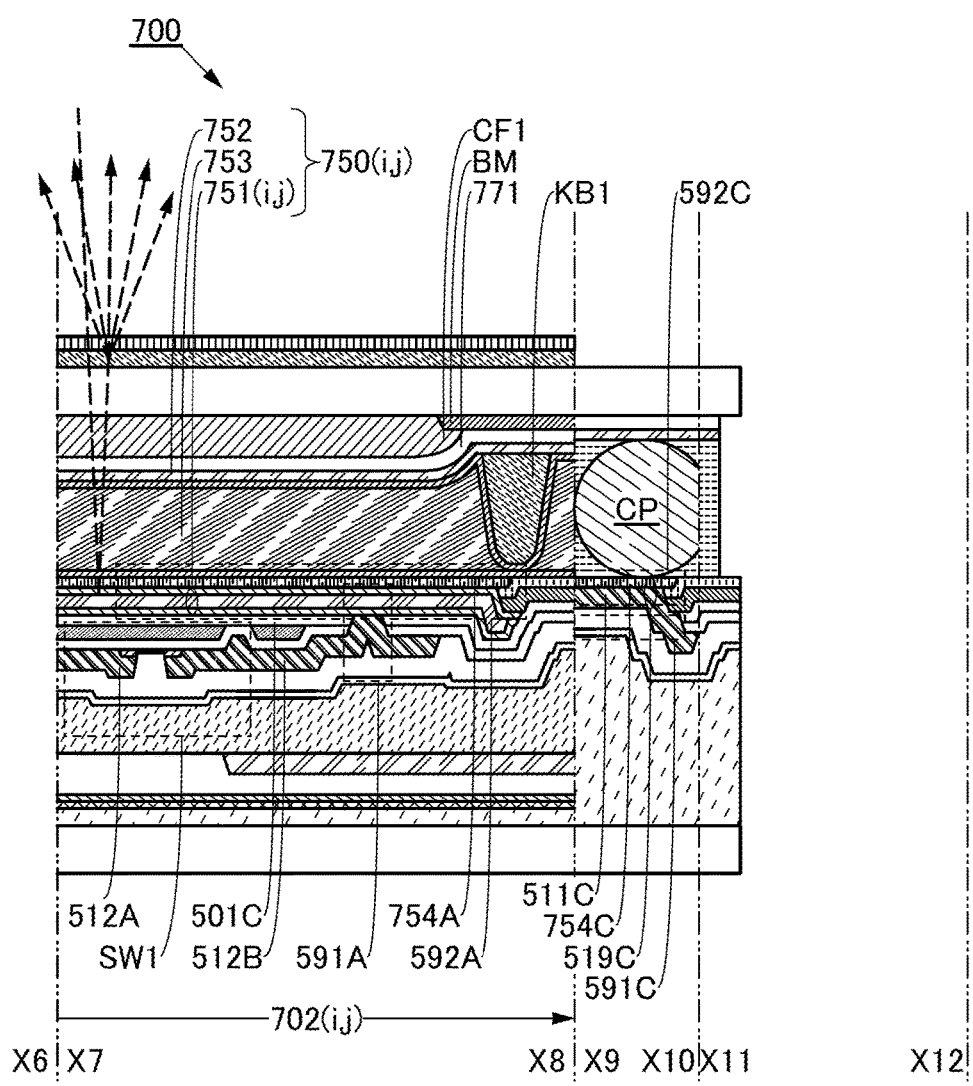
FIGS. 3A and 3B are cross-sectional views illustrating a cross-sectional structure of a display panel of one embodiment.
Figure 3B:
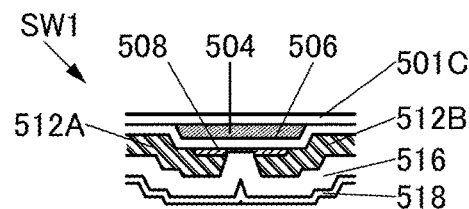

FIGS. 3A and 3B illustrate the structure of the display panel 700 of one embodiment of the present invention. FIG. 3A is a cross-sectional view taken along cutting plane lines X7-X8, X9-X10, and X11-X12 in FIG. 1A. FIG. 3B is a cross-sectional view illustrating some components of the display panel.

Figure 4:
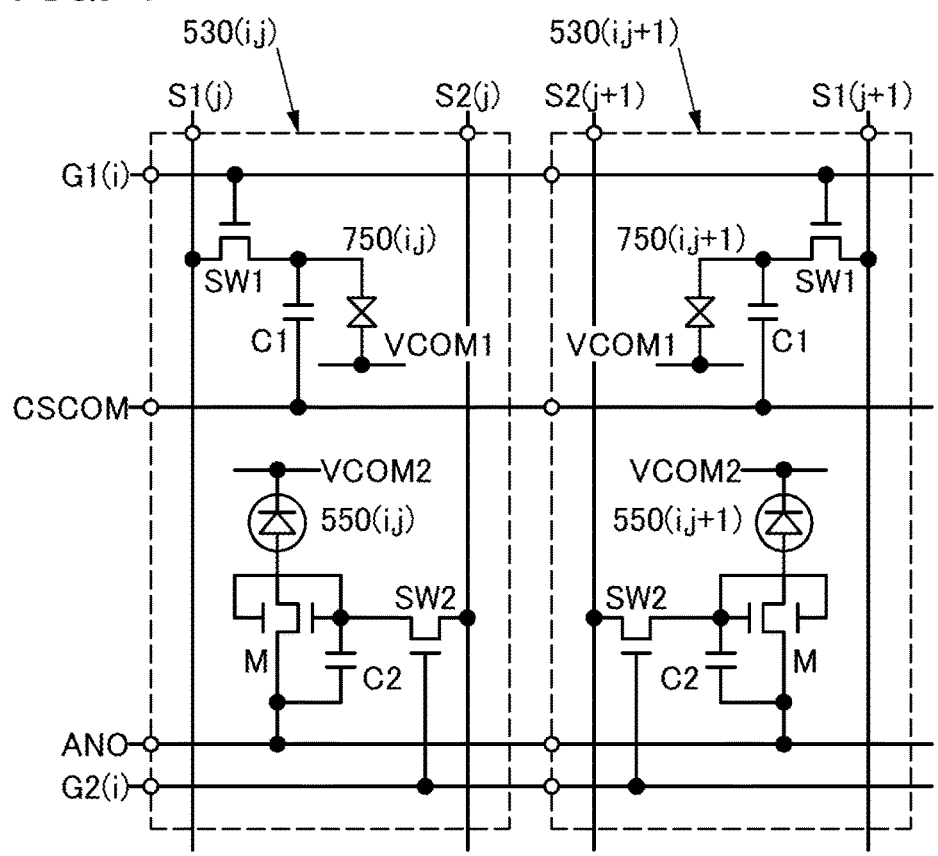
FIG. 4 is a circuit diagram illustrating the structure of a display panel of one embodiment.

FIG. 4 is a circuit diagram illustrating a pixel circuit $530(i, j)$ and a pixel circuit $530(i, j+1)$ that can be used as pixel circuits included in the display panel 700 of one embodiment of the present invention.

FIG. 5A is a block diagram illustrating arrangement of pixels, wirings, and the like that can be used in the display panel 700 of one embodiment of the present invention. FIGS. 5B1 and 5B2 are schematic diagrams each illustrating arrangement of openings 751H that can be used in the display panel 700 of one embodiment of the present invention.

Note that in this specification, an integral variable of 1 or more may be used for reference numerals. For example, "(p)" where p is an integral variable of 1 or more may be used for part of a reference numeral that specifies any one of components (p components in maximum). For another example, "(m, n)" where m and n are each an integral variable of 1 or more may be used for part of a reference numeral that specifies any one of components (m×n components in maximum).

STRUCTURE EXAMPLE 1 OF DISPLAY PANEL

The display panel 700 described in this embodiment includes a signal line S1(j), a pixel 702(i, j), and a terminal 519B (see FIG. 1A and FIG. 1B1).

The pixel 702(i, j) is electrically connected to the signal line S1(j) (see FIG. 1B1 or FIG. 1B2).

The pixel 702(i, j) includes the pixel circuit 530(i, j), a second display element 550(i, j), a second conductive film, a first conductive film, an insulating film 501C, a first display element 750(i, j), and a first intermediate film 754A (see FIGS. 2A and 2B, FIGS. 3A and 3B, and FIG. 4).

The pixel circuit 530(i, j) is electrically connected to the signal line S1(j).

The second display element 550(i, j) is electrically connected to the pixel circuit 530(i, j).

The second conductive film is electrically connected to the pixel circuit 530(i, j). The first conductive film includes a region overlapping with the second conductive film. The second conductive film can be used for a conductive film 512B functioning as a source electrode or a drain electrode of a transistor that can be used for a switch SW1, for example. The first conductive film can be used for a first electrode 751(i, j) of the first display element 750(i, j), for example (see FIG. 3A).

The insulating film 501C includes a region between the second conductive film and the first conductive film. The insulating film 501C includes an opening 591A in the region between the first conductive film and the second conductive film. The insulating film 501C also includes a region between an insulating film 501A and a third conductive film 511B. The insulating film 501C includes an opening 591B and an opening 591C in the region between the insulating film 501A and the third conductive film 511B.

The second conductive film is electrically connected to the first conductive film in the opening 591A. For example, the conductive film 512B that also serves as the second conductive film is electrically connected to the first electrode 751(i, j) that also serves as the first conductive film. Note that the first conductive film that is electrically connected to the second conductive film in the opening 591A provided in the insulating film 501C can be referred to as a through electrode.

The first display element 750(i, j) is electrically connected to the first conductive film. The first display element 750(i, j) includes the first electrode 751(i, j) electrically connected to the first conductive film.

The first conductive film is between a region of the first intermediate film 754A and the insulating film 501C. The first intermediate film 754A includes a region in contact with the first electrode 751(i, j).

The terminal 519B is electrically connected to the signal line S1(j). The terminal 519B includes the third conductive film 511B and a second intermediate film 754B (see FIG. 2A).

The third conductive film 511B is electrically connected to the signal line S1(j).

The second intermediate film 754B includes a region in contact with the third conductive film 511B. The region where the second intermediate film 754B is in contact with the third conductive film 511B is larger than the region where the first intermediate film 754A is in contact with the first electrode 751(i, j).

Note that a conductive film in contact with the second intermediate film 754B and the third conductive film 511B can be provided between, for example, the third conductive film 511B and the second intermediate film 754B including the region in contact with the third conductive film 511B. In that case, the area of a region of the second intermediate film 754B which is in contact with the conductive film and overlaps with a region where the conductive film is in contact with the third conductive film 511B can be regarded as the area of the region where the second intermediate film 754B is in contact with the third conductive film 511B.

Note that the terminal 519B can be electrically connected to a flexible printed circuit FPC1 using a conductive material ACF1, for example.

In the display panel described in this embodiment, the first intermediate film 754A contains a conductive oxide or an oxide semiconductor and the second intermediate film 754B contains a conductive oxide or an oxide semiconductor.

In the display panel described in this embodiment, the first intermediate film 754A includes the region in contact with the first electrode 751(i, j). The area of the region is greater than or equal to 400 µm² and less than or equal to 1900 µm².

In the display panel described in this embodiment, the second intermediate film 754B includes the region in contact with the third conductive film 511B. The area of the region is greater than or equal to 0.02 mm².

The display panel described in this embodiment includes the first intermediate film, the first electrode that includes the region in contact with the first intermediate film, the pixel that includes the first display element including the first electrode and the pixel circuit electrically connected to the first display element, the signal line electrically connected to the pixel, and the terminal that includes the third conductive film electrically connected to the signal line and the second intermediate film including the region in contact with the third conductive film.

Accordingly, a signal used to drive the first display element can be supplied to the third conductive film in contact with the second intermediate film. Alternatively, the signal can be used to drive the first display element that includes the first electrode in contact with the first intermediate film. As a result, a novel display panel that is highly convenient or highly reliable can be provided.

The display panel described in this embodiment includes the insulating film 501A.

The insulating film 501A includes a first opening 592A and a second opening 592B. The insulating film 501A also includes an opening 592C (see FIG. 2A or FIG. 3A).

The first opening 592A includes a region overlapping with the first intermediate film 754A and the first electrode 751(i, j) or a region overlapping with the first intermediate film 754A and the insulating film 501C.

The second opening 592B includes a region overlapping with the second intermediate film 754B and the third conductive film 511B. The opening 592C includes a region overlapping with an intermediate film 754C.

The insulating film 501A includes a region that is along an outer edge of the first opening 592A and is between the first intermediate film 754A and the insulating film 501C. The insulating film 501A also includes a region that is along an outer edge of the second opening 592B and is between the second intermediate film 754B and the third conductive film 511B.

In the display panel described in this embodiment, the first intermediate film 754A includes a side end portion covered with the insulating film 501A and the second intermediate film 754B includes a side end portion covered with the insulating film 501A.

The display panel described in this embodiment includes the second insulating film. The second insulating film includes the first opening including the region overlapping with the first intermediate film and the first electrode or the region overlapping with the first intermediate film and the first insulating film, and includes the second opening overlapping with the second intermediate film and the third conductive film.

Accordingly, the first intermediate film in contact with the first electrode and the second intermediate film in contact with the third conductive film can be made uncovered by the second insulating film while impurities are prevented from being diffused into the pixel circuit and the second display element. As a result, a novel display panel that is highly convenient or highly reliable can be provided.

The second display element 550(i, j) of the display panel described in this embodiment is positioned so that display using the second display element 550(i, j) can be seen from part of a region where display using the first display element 750(i, j) can be seen.

Accordingly, display using the second display element can be seen from part of the region where display using the first display element can be seen. Alternatively, users can see the display without changing the attitude or the like of the display panel. As a result, a novel display panel that is highly convenient or highly reliable can be provided.

In addition, the second display element 550(i, j) of the display panel described in this embodiment has a function of performing display in a region surrounded by a region where the first display element 750(i, j) performs display.

In the display panel described in this embodiment, the first display element 750(i, j) includes a reflective film and has a function of controlling the intensity of reflected light. Note that the first conductive film, the first electrode 751(i, j), or the like can be used for the reflective film of the first display element 750(i, j).

The reflective film has a function of reflecting incident light. The reflective film includes the opening 751H.

The second display element 550(i, j) has a function of emitting light toward the opening 751H.

The display panel described in this embodiment includes the pixel 702(i, j), a group consisting of pixels 702(i, 1) to 702(i, n), another group consisting of pixels 702(1, j) to 702(m, j), and a scan line G1(i) (see FIG. 5A). Note that i is an integer greater than or equal to 1 and less than or equal to m, j is an integer greater than or equal to 1 and less than or equal to n, and each of m and n is an integer greater than or equal to 1.

The group consisting of the pixels 702(i, 1) to 702 (i, n) includes the pixel 702(i, j). The pixels 702(i, 1) to 702(i, n) in the group are arranged in a row direction (indicated by an arrow R in the drawing).

The another group consisting of the pixels 702(1, j) to 702 (m, j) includes the pixel 702(i, j). The pixels 702(1, j) to 702 (m, j) in the another group are arranged in a column direction (indicated by an arrow C in the drawing) intersecting the row direction.

The scan line G1(i) is electrically connected to the group consisting of the pixels 702(i, 1) to 702(i, n) arranged in the row direction.

The signal line S1(i) is electrically connected to the another group consisting of the pixels 702(1, j) to 702 (m, j) arranged in the column direction.

A pixel adjacent to one pixel in the row direction or the column direction includes the opening 751H in a position different from that of the opening 751H in the one pixel.

For example, the pixel 702(i, j+1) adjacent to the pixel 702(i, j) in the row direction includes an opening in a position different from that of the opening 751H in the pixel 702(i, j) (see FIG. 5B1).

For another example, the pixel 702(i+1, j) adjacent to the pixel 702(i, j) in the column direction includes an opening in a position different from that of the opening 751H in the pixel 702(i, j) (see FIG. 5B2). Note that the first electrode 751(i, j) can be used for the reflective film, for example.

The display panel described in this embodiment includes the first display element, the first conductive film electrically connected to the first display element, the second conductive film including the region overlapping with the first conductive film, the first insulating film including the region between the second conductive film and the first conductive film, the first intermediate film, the pixel circuit electrically connected to the second conductive film, and the second display element electrically connected to the pixel circuit. The first intermediate film includes a region; the first conductive film is between the region of the first intermediate film and the second conductive film. The first insulating film includes the opening. The second conductive film is electrically connected to the first conductive film in the opening.

Accordingly, for example, the first display element and the second display element that performs display using a method different from that of the first display element can be driven using pixel circuits that can be formed in the same process. As a result, a novel display panel that is highly convenient or highly reliable can be provided.

The display panel described in this embodiment includes a scan line G2(i), a wiring CSCOM, and a wiring ANO (see FIG. 5A).

In addition, the first display element 750(i, j) of the display panel described in this embodiment includes a layer 753 containing a liquid crystal material, the first electrode 751(i, j), and a second electrode 752. Note that the second electrode 752 is positioned so that an electric field that controls the alignment of the liquid crystal material is generated between the second electrode 752 and the first electrode 751(i, j) (see FIG. 2A and FIG. 3A).

The display panel described in this embodiment also includes an alignment film AF1 and an alignment film AF2. The alignment film AF2 is positioned so that the layer 753 containing a liquid crystal material lies between the alignment films AF1 and AF2.

In addition, the second display 550(i, j) of the display panel described in this embodiment includes a third electrode 551(i, j), a fourth electrode 552, and a layer 553(j) containing a light-emitting material.

The fourth electrode 552 includes a region overlapping with the third electrode 551(i, j). The layer 553(i) containing a light-emitting material includes a region between the third electrode 551(i, j) and the fourth electrode 552. The third electrode 551(i, j) is electrically connected to the pixel circuit 530(i, j) at a contact portion 522.

The display panel described in this embodiment also includes a coloring film CF1, a light-blocking film BM, an insulating film 771, a functional film 770P, a functional film 770D, and a coloring film CF2.

The coloring film CF1 includes a region overlapping with the first display element 750(i, j). The light-blocking film BM includes an opening in a region overlapping with the first display element 750(i, j). The coloring film CF2 is between the insulating film 501C and the second display element 550(i, j) and includes a region overlapping with the opening 751H.

The insulating film 771 lies between the coloring film CF1 and the layer 753 containing a liquid crystal material or between the light-blocking film BM and the layer 753 containing a liquid crystal material. Thus, unevenness due to the thickness of the coloring film CF1 can be canceled out. Alternatively, impurities can be prevented from being diffused from the light-blocking film BM, the coloring film CF1, or the like to the layer 753 containing a liquid crystal material.

The functional film 770P includes a region overlapping with the first display element 750(i, j).

The functional film 770D includes a region overlapping with the first display element 750(i, j). The functional film 770D is positioned so that a substrate 770 lies between the functional film 770D and the first display element 750(i, j). Thus, for example, light reflected by the first display element 750(i, j) can be diffused.

The display panel described in this embodiment includes a substrate 570, the substrate 770, and a functional layer 520.

The substrate 770 includes a region overlapping with the substrate 570.

The functional layer 520 includes a region between the substrate 570 and the substrate 770. The functional layer 520 includes the pixel circuit 530(i, j), the second display element 550(i, j), an insulating film 521, and an insulating film 528. Furthermore, the functional layer 520 includes an insulating film 518 and an insulating film 516 (see FIGS. 2A and 2B).

The insulating film 521 lies between the pixel circuit 530(i, j) and the second display element 550(i, j).

The insulating film 528 lies between the insulating film 521 and the substrate 570 and has an opening in a region overlapping with the second display element 550(i, j). The insulating film 528 that is along an edge of the third electrode 551(i, j) can avoid a short circuit between the third electrode 551(i, j) and the fourth electrode 552.

The insulating film 518 includes a region between the insulating film 521 and the pixel circuit 530(i, j). The insulating film 516 includes a region between the insulating film 518 and the pixel circuit 530(i, j).

The display panel described in this embodiment also includes a bonding layer 505, a sealant 705, and a structure body KB1.

The bonding layer 505 lies between the functional layer 520 and the substrate 570 and has a function of bonding the functional layer 520 and the substrate 570 together.

The sealant 705 lies between the functional layer 520 and the substrate 770 and has a function of bonding the functional layer 520 and the substrate 770 together.

The structure body KB1 has a function of providing a predetermined gap between the functional layer 520 and the substrate 770.

The display panel described in this embodiment also includes a terminal 519C. The terminal 519C includes a conductive film 511C and the intermediate film 754C.

The conductive film 511C is electrically connected to a wiring VCOM1, and the intermediate film 754C includes a region in contact with the conductive film 511C, for example.

The region where the intermediate film 754C is in contact with the conductive film 511C is larger than the region where the first intermediate film 754A is in contact with the first electrode 751(i, j).

A conductor CP lies between the terminal 519C and the second electrode 752 and electrically connects the terminal 519C and the second electrode 752. A conductive particle can be used as the conductor CP, for example.

The display panel described in this embodiment also includes a driver circuit GD and a driver circuit SD (see FIG. 1A and FIG. 5A).

The driver circuit GD is electrically connected to the scan line G1(i). The driver circuit GD includes a transistor MD, for example. Specifically, a transistor including a semiconductor film that can be formed in the same step as a semiconductor film of the transistor included in the pixel circuit 530(i, j) can be used as the transistor MD (see FIGS. 2A and 2B).

The driver circuit SD is electrically connected to the signal line S1(j). The driver circuit SD is electrically connected to, for example, the terminal 519B.

Individual components of the display panel will be described below. Note that these components cannot be clearly distinguished from each other and one component may also serve as another component or include part of another component.

For example, the first conductive film can be used for the first electrode 751(i, j) and the reflective film.

In addition, the second conductive film can be used for the conductive film 512B functioning as a source electrode or a drain electrode of a transistor.

<<Structure Example>>

The display panel of one embodiment of the present invention includes the substrate 570, the substrate 770, the structure body KB1, the sealant 705, or the bonding layer 505.

The display panel of one embodiment of the present invention also includes the functional layer 520, the insulating film 521, or the insulating film 528.

The display panel of one embodiment of the present invention includes the signal line S1(j), a signal line S2(j), the scan line G1(i), the scan line G2(i), the wiring CSCOM, or the wiring ANO.

The display panel of one embodiment of the present invention includes the first conductive film or the second conductive film.

The display panel of one embodiment of the present invention includes the terminal 519B, the terminal 519C, the conductive film 511B, or the conductive film 511C.

The display panel of one embodiment of the present invention includes the pixel circuit 530(i, j) or the switch SW1.

The display panel of one embodiment of the present invention includes the first display element 750(i, j), the first electrode 751(i, j), the reflective film, the opening 751H, the layer 753 containing a liquid crystal material, or the second electrode 752.

The display panel of one embodiment of the present invention includes the alignment film AF1, the alignment film AF2, the coloring film CF1, the light-blocking film BM, the insulating film 771, the functional film 770P, or the functional film 770D.

The display panel of one embodiment of the present invention includes the second display element 550(i, j), the third electrode 551(i, j), the fourth electrode 552, or the layer 553(j) containing a light-emitting material.

Furthermore, the display panel of one embodiment of the present invention includes the insulating film 501A or the insulating film 501C.

In addition, the display panel of one embodiment of the present invention includes the driver circuit GD or the driver circuit SD.

<<Substrate 570>>

The substrate 570 or the like can be formed using a material having heat resistance high enough to withstand heat treatment in the manufacturing process. For example, a material with a thickness greater than or equal to 0.1 mm and less than or equal to 0.7 mm can be used for the substrate 570. Specifically, non-alkali glass with a thickness of 0.7 mm can be used. Alternatively, non-alkali glass polished to a thickness of approximately 0.1 mm can be used.

A large-sized glass substrate, for example, having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material such as glass, ceramics, or metal can be used for the substrate 570 or the like.

Specifically, non-alkali glass, soda-lime glass, potash glass, crystal glass, aluminosilicate glass, tempered glass, chemically tempered glass, quartz, sapphire, or the like can be used for the substrate 570 or the like. Specifically, an inorganic oxide film, an inorganic nitride film, an inorganic oxynitride film, or the like can be used for the substrate 570 or the like. For example, a silicon oxide film, a silicon nitride film, a silicon oxynitride film, an aluminum oxide film, or the like can be used for the substrate 570 or the like. For example, stainless steel or aluminum can be used for the substrate 570 or the like.

For example, a single crystal semiconductor substrate or a polycrystalline semiconductor substrate of silicon or silicon carbide, a compound semiconductor substrate of silicon germanium, or an SOI substrate can be used as the substrate 570 or the like. Thus, a semiconductor element can be formed over the substrate 570 or the like.

For example, an organic material such as a resin, a resin film, or plastic can be used for the substrate 570 or the like. Specifically, a resin film or a resin plate of polyester, polyolefin, polyamide, polyimide, polycarbonate, an acrylic resin, or the like can be used for the substrate 570 or the like.

For example, a composite material, such as a resin film to which a metal plate, a thin glass plate, or an inorganic film is bonded can be used for the substrate 570 or the like. For example, a composite material formed by dispersing fibrous or particulate metal, glass, an inorganic material, or the like into a resin film can be used for the substrate 570 or the like. For example, a composite material formed by dispersing a fibrous or particulate resin, an organic material, or the like into an inorganic material can be used for the substrate 570 or the like.

A single-layer material or a stacked-layer material in which a plurality of layers are stacked can be used for the substrate 570 or the like. For example, a stacked-layer material in which a base, an insulating film that prevents diffusion of impurities contained in the base, and the like are stacked can be used for the substrate 570 or the like. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the substrate 570. Alternatively, a stacked-layer material in which a resin and a film for preventing diffusion of impurities that penetrate the resin, such as a silicon oxide film, a silicon nitride film, or a silicon oxynitride film, are stacked can be used for the substrate 570 or the like.

Specifically, a resin film, a resin plate, a stacked-layer material, or the like containing polyester, polyolefin, polyamide, polyimide, polycarbonate, an acrylic resin, or the like can be used as the substrate 570 or the like.

Specifically, a material including polyester, polyolefin, polyamide (e.g., nylon or aramid), polyimide, polycarbonate, polyurethane, an acrylic resin, an epoxy resin, a resin having a siloxane bond, such as silicone, or the like can be used for the substrate 570 or the like.

Specifically, polyethylene terephthalate (PET), polyethylene naphthalate (PEN), polyethersulfone (PES), acrylic, or the like can be used for the substrate 570 or the like.

Alternatively, paper, wood, or the like can be used for the substrate 570 or the like.

For example, a flexible substrate can be used as the substrate 570 or the like.

Note that a transistor, a capacitor, or the like can be directly formed on the substrate. Alternatively, a transistor, a capacitor, or the like can be formed over a substrate for use in manufacturing processes that can withstand heat applied in the manufacturing process and can be transferred to the substrate 570 or the like. Thus, a transistor, a capacitor, or the like can be formed over a flexible substrate, for example.

<<Substrate 770>>

A light-transmitting material can be used for the substrate 770, for example. Specifically, a material selected from the materials that can be used for the substrate 570 can be used for the substrate 770.

For example, aluminosilicate glass, tempered glass, chemically tempered glass, sapphire, or the like can be favorably used for the substrate 770 that is on a side closer to a user of the display panel. This can prevent breakage or damage of the display panel caused by the use.

A material with a thickness greater than or equal to 0.1 mm and less than or equal to 0.7 mm can be also used for the substrate 770, for example. In that case, the functional film 770D can be close to the first display element 750($i, j$). As a result, image blur can be reduced and an image can be displayed clearly. Note that the thickness of the substrate can be made thin by polishing, for example.

<<Structure Body KB1>>

An organic material, an inorganic material, or a composite material of an organic material and an inorganic material can be used for, for example, the structure body KB1 or the like. Thus, components between which the structure body KB1 or the like is provided can have a predetermined gap.

Specifically, for the structure body KB1, polyester, polyolefin, polyamide, polyimide, polycarbonate, polysiloxane, an acrylic resin, or the like, or a composite material of a plurality of kinds of resins selected from these can be used. Alternatively, a photosensitive material may be used.

<<Sealant 705>>

For the sealant 705 or the like, an inorganic material, an organic material, a composite material of an inorganic material and an organic material, or the like can be used.

For example, an organic material such as a thermally fusible resin or a curable resin can be used for the sealant 705 or the like.

For the sealant 705 or the like, an organic material such as a reactive curable adhesive, a light-curable adhesive, a thermosetting adhesive, and/or an anaerobic adhesive can be used.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used for the sealant 705 or the like.

<<Bonding Layer 505>>

For the bonding layer 505, a material that can be used for the sealant 705 can be used, for example.

<<Insulating Film 521>>

For the insulating film 521 or the like, an insulating inorganic material, an insulating organic material, or an insulating composite material containing an inorganic material and an organic material can be used, for example.

Specifically, an inorganic oxide film, an inorganic nitride film, an inorganic oxynitride film, or a material in which any of these films are stacked can be used for the insulating film 521 or the like. For example, a film including any of a silicon oxide film, a silicon nitride film, a silicon oxynitride film, an aluminum oxide film, and the like, or a film containing a material in which any of these films are stacked can be used for the insulating film 521 or the like.

Specifically, polyester, polyolefin, polyamide, polyimide, polycarbonate, polysiloxane, an acrylic resin, or the like, or a stacked or composite material including resins selected from these, or the like can be used for the insulating film 521 or the like. Alternatively, a photosensitive material may be used.

Thus, steps due to various components overlapping with the insulating film 521, for example, can be reduced.

<<Insulating Film 528>>

For the insulating film 528 or the like, a material that can be used for the insulating film 521 can be used, for example. Specifically, a 1-µm-thick film containing polyimide can be used for the insulating film 528.

<<Insulating Film 501A>>

A material that can be used for the insulating film 521 can be used for the insulating film 501A, for example. Alternatively, for example, a material having a function of supplying hydrogen can be used for the insulating film 501A.

Specifically, a material in which a material containing silicon and oxygen and a material containing silicon and nitrogen are stacked can be used for the insulating film 501A. A material having functions of releasing hydrogen by heating or the like and supplying the released hydrogen to another component can be used for the insulating film 501A, for example. Specifically, a material having a function of releasing hydrogen taken in the manufacturing process, by heating or the like, to supply the hydrogen to another component can be used for the insulating film 501A.

For example, a film containing silicon and oxygen that is formed by a chemical vapor deposition method using silane or the like as a source gas can be used as the insulating film 501A.

Specifically, a material in which a 200- to 600-nm-thick material containing silicon and oxygen and a material containing silicon and nitrogen with a thickness of approximately 200 nm are stacked can be used for the insulating film 501A.

<<Insulating Film 501C>>

A material that can be used for the insulating film 521 can be used for the insulating film 501C, for example. Specifically, a material containing silicon and oxygen can be used for the insulating film 501C. Thus, impurity diffusion into the pixel circuit, the second display element, or the like can be suppressed.

For example, a 200-nm-thick film containing silicon, oxygen, and nitrogen can be used as the insulating film 501C.

<<Intermediate Film 754A, Intermediate Film 754B, Intermediate Film 754C>>

A film with a thickness greater than or equal to 10 nm and less than or equal to 500 nm, preferably greater than or equal to 10 nm and less than or equal to 100 nm, can be used for the intermediate film 754A, the intermediate film 754B, or the intermediate film 754C, for example. Note that in this this specification, the intermediate film 754A, the intermediate film 754B, or the intermediate film 754C is referred to as an intermediate film.

For example, a material having a function of allowing hydrogen passage and supplying hydrogen can be used for the intermediate film.

For example, a conductive material can be used for the intermediate film.

For example, a light-transmitting material can be used for the intermediate film.

Specifically, a material containing indium and oxygen, a material containing indium, gallium, zinc, and oxygen, a material containing indium, tin, and oxygen, or the like can be used for the intermediate film. Note that the above material is permeable to hydrogen.

Specifically, a 50- or 100-nm-thick film containing indium, gallium, zinc, and oxygen can be used as the intermediate film.

Note that a material in which films serving as etching stoppers are stacked can be used for the intermediate film. Specifically, a material in which a 50-nm-thick film containing indium, gallium, zinc, and oxygen and a 20-nm-thick film containing indium, tin, and oxygen, are stacked in this order can be used for the intermediate film.

<<Wiring, Terminal, Conductive Film>>

A conductive material can be used for the wiring or the like. Specifically, the conductive material can be used for the signal line S1(j), the signal line S2(j), the scan line G1(i), the scan line G2(i), the wiring CSCOM, the wiring ANO, the terminal 519B, the terminal 519C, a terminal 719, the conductive film 511B, the conductive film 511C, or the like.

For example, an inorganic conductive material, an organic conductive material, a metal material, conductive ceramics, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy including any of the above-described metal elements, or the like can be used for the wiring or the like. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film including graphene oxide is formed and is subjected to reduction, so that a film including graphene can be formed. As a reducing method, a method using heat, a method using a reducing agent, or the like can be employed.

A film containing a metal nanowire can be used for the wiring or the like, for example. Specifically, a nanowire containing silver can be used.

Specifically, a conductive high molecule can be used for the wiring or the like.

<<First Conductive Film, Second Conductive Film>>

A material that can be used for the wiring or the like can be used for the first conductive film or the second conductive film, for example.

The first electrode $751(i, j)$, the wiring, or the like can be used for the first conductive film.

The conductive film 512B functioning as the source electrode or the drain electrode of the transistor that can be used for the switch SW1, the wiring, or the like can be used for the second conductive film.

<<Pixel Circuit $530(i, j)$>>

The pixel circuit $530(i, j)$ is electrically connected to the signal line $S1(j)$, the signal line $S2(j)$, the scan line $G1(i)$, the scan line $G2(i)$, the wiring CSCOM, and the wiring ANO (see FIG. 4).

The pixel circuit $530(i, j+1)$ is electrically connected to a signal line $S1(j+1)$, a signal line $S2(j+1)$, the scan line $G1(i)$, the scan line $G2(i)$, the wiring CSCOM, and the wiring ANO.

In the case where a voltage of a signal supplied to the signal line $S2(j)$ is different from a voltage of a signal supplied to the signal line $S1(j+1)$, the signal line $S1(j+1)$ is positioned apart from the signal line $S2(j)$. Specifically, the signal line $S2(j+1)$ is positioned adjacent to the signal line $S2(j)$.

The pixel circuit $530(i, j)$ includes the switch SW1, a capacitor C1, a switch SW2, a transistor M, and a capacitor C2.

A transistor including a gate electrode electrically connected to the scan line $G1(i)$ and a first electrode electrically connected to the signal line $S1(j)$ can be used for the switch SW1, for example.

The capacitor C1 includes a first electrode electrically connected to a second electrode of the transistor used for the switch SW1 and a second electrode electrically connected to the wiring CSCOM.

For example, a transistor including a gate electrode electrically connected to the scan line $G2(i)$ and a first electrode electrically connected to the signal line $S2(j)$ can be used for the switch SW2.

The transistor M includes a gate electrode electrically connected to a second electrode of the transistor used for the switch SW2 and a first electrode electrically connected to the wiring ANO.

Note that a transistor including a conductive film provided so that a semiconductor film is interposed between a gate electrode and the conductive film can be used as the transistor M. For example, a conductive film electrically connected to a wiring that can supply a potential the same as that of the gate electrode of the transistor M can be used.

The capacitor C2 includes a first electrode electrically connected to the second electrode of the transistor used for the switch SW2 and a second electrode electrically connected to the first electrode of the transistor M.

Note that the first electrode of the first display element $750(i, j)$ can be electrically connected to the second electrode of the transistor used for the switch SW1, and the second electrode of the first display element $750(i, j)$ can be electrically connected to the wiring VCOM1, so that the first display element $750(i, j)$ can be driven.

In addition, the first electrode of the second display element $550(i, j)$ can be electrically connected to the second electrode of the transistor M, and the second electrode of the second display element $550(i, j)$ can be electrically connected to the wiring VCOM2, so that the second display element $550(i, j)$ can be driven.

<<Switch SW1, Switch SW2, Transistor M, Transistor MD>>

For the switch SW1, the switch SW2, the transistor M, the transistor MD, or the like, a bottom-gate transistor, a top-gate transistor, or the like can be used, for example.

For example, a transistor whose semiconductor film contains a semiconductor containing an element of Group 14 can be used. Specifically, a semiconductor containing silicon can be used for the semiconductor film. For example, single crystal silicon, polysilicon, microcrystalline silicon, or amorphous silicon can be used for the semiconductor film of the transistor.

For example, a transistor whose semiconductor film contains an oxide semiconductor can be used. Specifically, an oxide semiconductor containing indium or an oxide semiconductor containing indium, gallium, and zinc can be used for a semiconductor film.

For example, a transistor having lower leakage current in an off state than a transistor that uses amorphous silicon for a semiconductor film can be used for the switch SW1, the switch SW2, the transistor M, the transistor MD, or the like. Specifically, a transistor in which an oxide semiconductor is used for the semiconductor film 508 can be used for the switch SW1, the switch SW2, the transistor M, the transistor MD, or the like.

Thus, a pixel circuit can hold an image signal for a longer time than a pixel circuit including a transistor that uses amorphous silicon for a semiconductor film. Specifically, a selection signal can be supplied at a frequency of lower than 30 Hz, preferably lower than 1 Hz, further preferably less than once per minute while flickering is suppressed. Consequently, eyestrain on a user of the data processor can be reduced, and power consumption for driving can be reduced.

The transistor that can be used for the switch SW1 includes the semiconductor film 508 and a conductive film 504 that includes a region overlapping with the semiconductor film 508 (see FIG. 3B). The transistor that can be used for the switch SW1 includes a conductive film 512A and the conductive film 512B each of which functions as the source electrode or the drain electrode.

Note that the conductive film 504 and an insulating film 506 serve as a gate electrode and a gate insulating film, respectively. The conductive film 512A has one of a function as a source electrode and a function as a drain electrode, and the conductive film 512B has the other.

A transistor in which the semiconductor film 508 is provided between the conductive film 504 and a conductive film 524 can be used for the transistor M (see FIG. 2B).

A conductive film in which a 10-nm-thick film containing tantalum and nitrogen and a 300-nm-thick film containing copper are stacked in this order can be used as the conductive film 504, for example.

A material in which a 400-nm-thick film containing silicon and nitrogen and a 200-nm-thick film containing silicon, oxygen, and nitrogen are stacked can be used for the insulating film 506, for example.

A 25-nm-thick film containing indium, gallium, and zinc can be used as the semiconductor film 508, for example.

A conductive film in which a 50-nm-thick film containing tungsten, a 400-nm-thick film containing aluminum, and a 100-nm-thick film containing titanium are stacked in this order can be used as the conductive film 512A or 512B, for example.

<<First Display Element 750(i, j)>>

As the first display element 750(i, j) or the like, for example, a display element having a function of controlling transmission or reflection of light can be used. For example, a combined structure of a polarizing plate and a liquid crystal element or a MEMS shutter display element can be used. Specifically, the use of a reflective display element can reduce power consumption of the display panel. For example, a reflective liquid crystal display element can be used as the first display element 750(i, j).

A liquid crystal element driven in any of the following driving modes can be used, for example: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

<<Layer 753 Containing Liquid Crystal Material>>

A thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used for the layer 753 containing a liquid crystal material, for example. Alternatively, a liquid crystal material that exhibits a cholesteric phase, a smectic phase, a cubic phase, a chiral nematic phase, an isotropic phase, or the like can be used. Alternatively, a liquid crystal material that exhibits a blue phase can be used.

<<First Electrode 751(i, j)>>

A material that can be used for the wiring or the like can be used for the first electrode 751(i, j), for example. Specifically, a reflective film can be used for the first electrode 751(i, j). For example, a material in which a light-transmitting conductive material and a reflective film including an opening are stacked can be used for the first electrode 751(i, j).

<<Reflective Film>>

A material reflecting visible light can be used for the reflective film, for example. Specifically, a material containing silver can be used for the reflective film. For example, a material containing silver, palladium, and the like or a material containing silver, copper, and the like can be used for the reflective film.

The reflective film reflects light that passes through the layer 753 containing a liquid crystal material, for example.

This allows the first display element 750 to serve as a reflective liquid crystal element. Furthermore, for example, a material with an uneven surface can be used for the reflective film. In that case, incident light can be reflected in various directions so that a white image can be displayed.

Note that the first electrode 751(i, j) is not necessarily used for the reflective film. For example, a structure in which the reflective film lies between the layer 753 containing a liquid crystal material and the first electrode 751(i, j), or a structure in which the first electrode 751(i, j) having light-transmitting properties lies between the reflective film and the layer 753 containing a liquid crystal material can be used.

<<Opening 751H>>

If the ratio of the total area of the opening 751H to the total area except for the opening is too high, display performed using the first display element 750(i, j) is dark. If the ratio of the total area of the opening 751H to the total area except for the opening is too low, display performed using the second display element 550(i, j) is dark.

The opening 751H may have a polygonal shape, a quadrangular shape, an elliptical shape, a circular shape, a cross-like shape, a stripe shape, a slit-like shape, or a checkered pattern, for example. The opening 751H may be positioned close to an adjacent pixel. The opening 751H of one pixel is preferably provided close to an opening of another pixel that emits light of the same color as the one pixel, in which case a phenomenon in which light emitted from the second display element 550(i, j) enters a coloring film of a different color in the adjacent pixel, which is called cross talk, can be suppressed.

<<Second Electrode 752>>

A material having a visible-light-transmitting property and conductivity can be used for the second electrode 752, for example.

For example, a conductive oxide, a metal film thin enough to transmit light, or a metal nanowire can be used for the second electrode 752.

Specifically, a conductive oxide containing indium, a metal thin film whose thickness is more than or equal to 1 nm and less than or equal to 10 nm, or a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

<<Alignment Film AF1, Alignment Film AF2>>

For the alignment film AF1 or the alignment film AF2, a material containing polyimide or the like can be used, for example. Specifically, a material formed by rubbing treatment or an optical alignment technique such that a liquid crystal material has a predetermined alignment can be used.

A film containing soluble polyimide can be used for the alignment film AF1 or the alignment film AF2, for example, in which case temperature required to form the alignment film AF1 or the alignment film AF2 can be low. As a result, damage to other components caused when the alignment film AF1 or the alignment film AF2 is formed can be reduced.

<<Coloring Film CF1, Coloring Film CF2>>

A material that transmits light of a predetermined color can be used for the coloring film CF1 or the coloring film CF2. In that case, the coloring film CF1 or the coloring film CF2 can be used as a color filter, for example. Note that a material having a function of converting emitted light into light of a predetermined color can be used for the coloring film CF2. Specifically, quantum dots can be used for the coloring film CF2. Thus, display with high color purity can be achieved.

A material transmitting light of blue, green, red, yellow, or white can be used for the coloring film CF1 or the coloring film CF2, for example.

<<Light-Blocking Film BM>>

The light-blocking film BM can be formed with a material that prevents light transmission and thus can be used as a black matrix, for example.

<<Insulating Film 771>>

The insulating film 771 can be formed of, for example, polyimide, an epoxy resin, an acrylic resin, or the like.

<<Functional Film 770P, Functional Film 770D>>

An anti-reflection film, a polarizing film, a retardation film, a light diffusion film, a condensing film, or the like can be used for the functional film 770P or the functional film 770D, for example.

Specifically, a film containing a dichromatic pigment can be used for the functional film 770P or the functional film 770D. Alternatively, a material with a columnar structure having an axis along the direction intersecting a surface of a base can be used for the functional film 770P or the functional film 770D. In that case, light can be transmitted in the direction along the axis and scattered in other directions easily.

Alternatively, an antistatic film preventing the attachment of a foreign substance, a water repellent film suppressing the attachment of stain, a hard coat film suppressing generation of a scratch in use, or the like can be used for the functional film 770P.

Specifically, a circularly polarizing film can be used for the functional film 770P. Furthermore, a light diffusion film can be used for the functional film 770D.

<<Second Display Element 550($i, j$)>>

A light-emitting element can be used for the second display element 550($i, j$), for example. Specifically, an organic electroluminescent element, an inorganic electroluminescent element, a light-emitting diode, or the like can be used for the second display element 550($i, j$).

For example, a light-emitting organic compound can be used for the layer 553($j$) containing a light-emitting material.

For the layer 553($j$) containing a light-emitting material, quantum dots can be used, for example, in which case bright color light with a narrow full width at half maximum can be obtained.

A stacked-layer material for emitting blue light, green light, or red light can be used for the layer 553($j$) containing a light-emitting material, for example.

For example, a belt-like stacked-layer material that extends in the column direction along the signal line SW) can be used for the layer 553($j$) containing a light-emitting material. Furthermore, a belt-like stacked-layer material that extends in the column direction along the signal line S1($j$+1) and emits light of a color different from that of light emitted from the layer 553($f$) containing a light-emitting material can be used for a layer 553($j$+1) containing a light-emitting material.

For example, a stacked-layer material for emitting white light can be used for the layer 553($j$) containing a light-emitting material and the layer 553($j$+1) containing a light-emitting material. Specifically, a stacked-layer material containing a light-emitting material containing a fluorescent material that emits blue light, a layer containing a material that is other than a fluorescent material and that emits green light and red light, or a layer containing a material that is other than a fluorescent material and that emits yellow light can be used for the layer 553($j$) containing a light-emitting material and the layer 553($j$+1) containing a light-emitting material.

For example, a material that can be used for the wiring or the like can be used for the third electrode 551($i, j$).

For example, a material that transmits visible light and can be used for the wiring or the like can be used for the third electrode 551($i, j$).

Specifically, a conductive oxide, an indium-containing conductive oxide, indium oxide, an indium tin oxide, an indium zinc oxide, zinc oxide, zinc oxide to which gallium is added, or the like can be used for the third electrode 551($i, j$). Alternatively, a metal film that is thin enough to transmit light can be used for the third electrode 551($i, j$). Further alternatively, a metal film that transmits part of light and reflects another part of light can be used for the third electrode 551($i, j$). Accordingly, the second display element 550($i, j$) can have a microcavity structure. As a result, light of a predetermined wavelength can be extracted more efficiently than light of other wavelengths.

A material that can be used for the wiring or the like can be used for the fourth electrode 552, for example. Specifically, a material that reflects visible light can be used for the fourth electrode 552.

<<Driver Circuit GD>>

Any of a variety of sequential circuits, such as a shift register, can be used as the driver circuit GD. For example, the transistor MD, a capacitor, and the like can be used in the driver circuit GD. Specifically, a transistor including a semiconductor film that can be formed at the same step as the transistor M can be used.

A transistor whose structure is different from the transistor that can be used for the switch SW1 can be used as the transistor MD. Specifically, a transistor including the conductive film 524 can be used as the transistor MD (see FIG. 2B).

The semiconductor film 508 is provided between the conductive films 524 and 504. The insulating film 516 is provided between the conductive film 524 and the semiconductor film 508. The insulating film 506 is provided between the semiconductor film 508 and the conductive film 504. For example, the conductive film 524 is electrically connected to a wiring supplying the same potential as that supplied to the conductive film 504.

Note that the transistor MD can have the same structure as the transistor M.

<<Driver Circuit SD>>

An integrated circuit can be used for the driver circuit SD, for example. Specifically, an integrated circuit formed on a silicon substrate can be used as the driver circuit SD.

For example, a chip on glass (COG) method can be used to mount the driver circuit SD on the terminal 519B electrically connected to the pixel circuit 530($i, j$). Specifically, an anisotropic conductive film can be used to mount the integrated circuit on the terminal 519B.

<Method for Controlling Resistivity of Oxide Semiconductor Film>

The method for controlling the resistivity of an oxide semiconductor film will be described.

An oxide semiconductor film with a predetermined resistivity can be used as the semiconductor film 508, the conductive film 524, or the like.

A method for controlling the concentration of impurities such as hydrogen and water contained in the oxide semiconductor film and/or the oxygen vacancies in the film can be used as the method for controlling the resistivity of the oxide semiconductor film, for example.

Specifically, plasma treatment can be used to increase or decrease the concentration of impurities such as hydrogen and water and/or the oxygen vacancies in the film.

Specifically, plasma treatment using a gas containing one or more kinds selected from a noble gas (He, Ne, Ar, Kr, or Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration greater than or equal to $1\times10^{22}$ atoms/cm$^3$ is formed in contact with the oxide semiconductor film, in which case hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor film with a hydrogen concentration measured by secondary ion mass spectrometry (SIMS) of greater than or equal to $8\times10^{19}$ atoms/cm$^3$, preferably greater than or equal to $1\times10^{20}$ atoms/cm$^3$, further preferably greater than or equal to $5\times10^{20}$ atoms/cm$^3$ can be suitably used for the conductive film 524.

Meanwhile, an oxide semiconductor film with a high resistivity can be used for a semiconductor film where a channel of a transistor is formed, specifically, the semiconductor film 508.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancies are filled and the hydrogen concentration is reduced can be referred to as a highly purified intrinsic or substantially highly purified intrinsic oxide semiconductor film. The term "substantially intrinsic" refers to the state in which an oxide semiconductor film has a carrier density lower than $8\times10^{11}$/cm$^3$, preferably lower than $1\times10^{11}$/cm$^3$, further preferably lower than $1\times10^{10}$/cm$^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1\times10^6$ μm and a channel length L of 10 μm, the off-state current can be lower than or equal to the measurement limit of a semiconductor parameter analyzer, that is, lower than or equal to $1\times10^{-13}$ A, at a voltage (drain voltage) between a source electrode and a drain electrode of from 1 V to 10 V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor film whose hydrogen concentration measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than $5\times10^{18}$ atoms/cm$^3$, further preferably lower than or equal to $1\times10^{18}$ atoms/cm$^3$, further preferably lower than or equal to $5\times10^{17}$ atoms/cm$^3$, further preferably lower than or equal to $1\times10^{16}$ atoms/cm$^3$ can be favorably used for a semiconductor film where a channel of a transistor is formed.

Note that an oxide semiconductor film that has a higher hydrogen concentration and/or a larger number of oxygen vacancies and that has a lower resistivity than that of the semiconductor film 508 is used as the conductive film 524.

A film whose hydrogen concentration is twice or more, preferably ten times or more that of the semiconductor film 508 can be used as the conductive film 524.

A film whose resistivity is greater than or equal to $1\times10^{-8}$ times and less than $1\times10^{-1}$ times that of the semiconductor film 508 can be used as the conductive film 524.

Specifically, a film whose resistivity is higher than or equal to $1\times10^{-3}$ Ωcm and lower than $1\times10^4$ Ωcm, preferably higher than or equal to $1\times10^{-3}$ Ωcm and lower than $1\times10^{-1}$ Ωcm can be used as the conductive film 524.

Note that this embodiment can be combined with any of the other embodiments in this specification as appropriate.

Embodiment 2

In this embodiment, the structure of an input/output device of one embodiment of the present invention will be described with reference to FIGS. 6A, 6B1, and 6B2, FIGS. 7A and 7B, FIGS. 8A and 8B, and FIGS. 9A, 9B1, and 9B2.

FIGS. 6A, 6B1, and 6B2 illustrate the structure of an input/output device 700TPA of one embodiment of the present invention. FIG. 6A is a top view illustrating the input/output device 700TPA of one embodiment of the present invention. FIG. 6B1 is a bottom view illustrating part of FIG. 6A, and FIG. 6B2 is a bottom view omitting some components illustrated in FIG. 6B1.

Figure 7A:
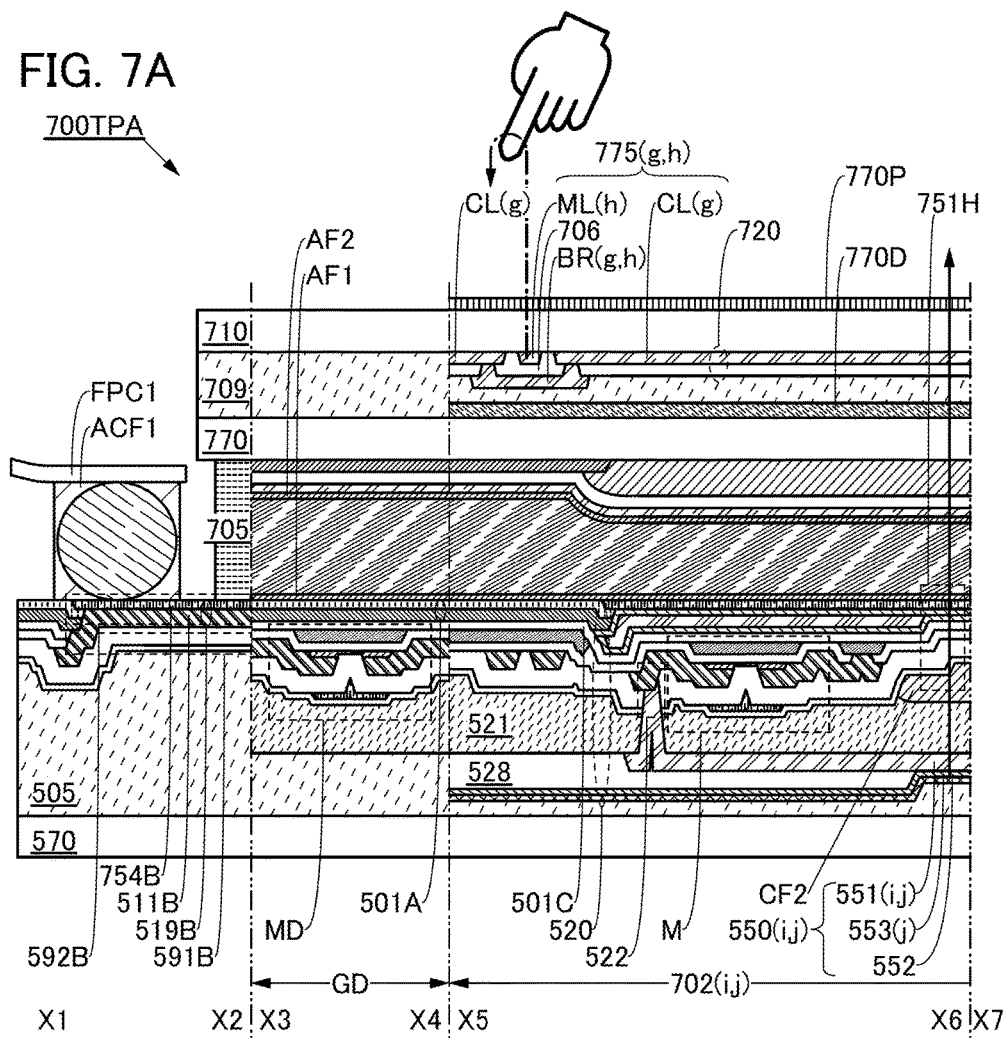
FIGS. 7A and 7B are cross-sectional views illustrating a cross-sectional structure of an input/output device of one embodiment.
Figure 7B:
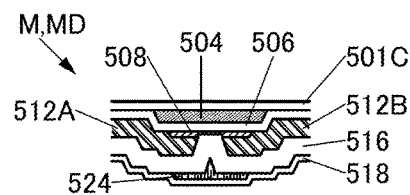

FIGS. 7A and 7B illustrate the structure of the input/output device 700TPA of one embodiment of the present invention. FIG. 7A is a cross-sectional view taken along cutting plane lines X1-X2, X3-X4, and X5-X6 in FIG. 6A, and FIG. 7B is a cross-sectional view illustrating some components of the input/output device 700TPA.

Figure 8A:
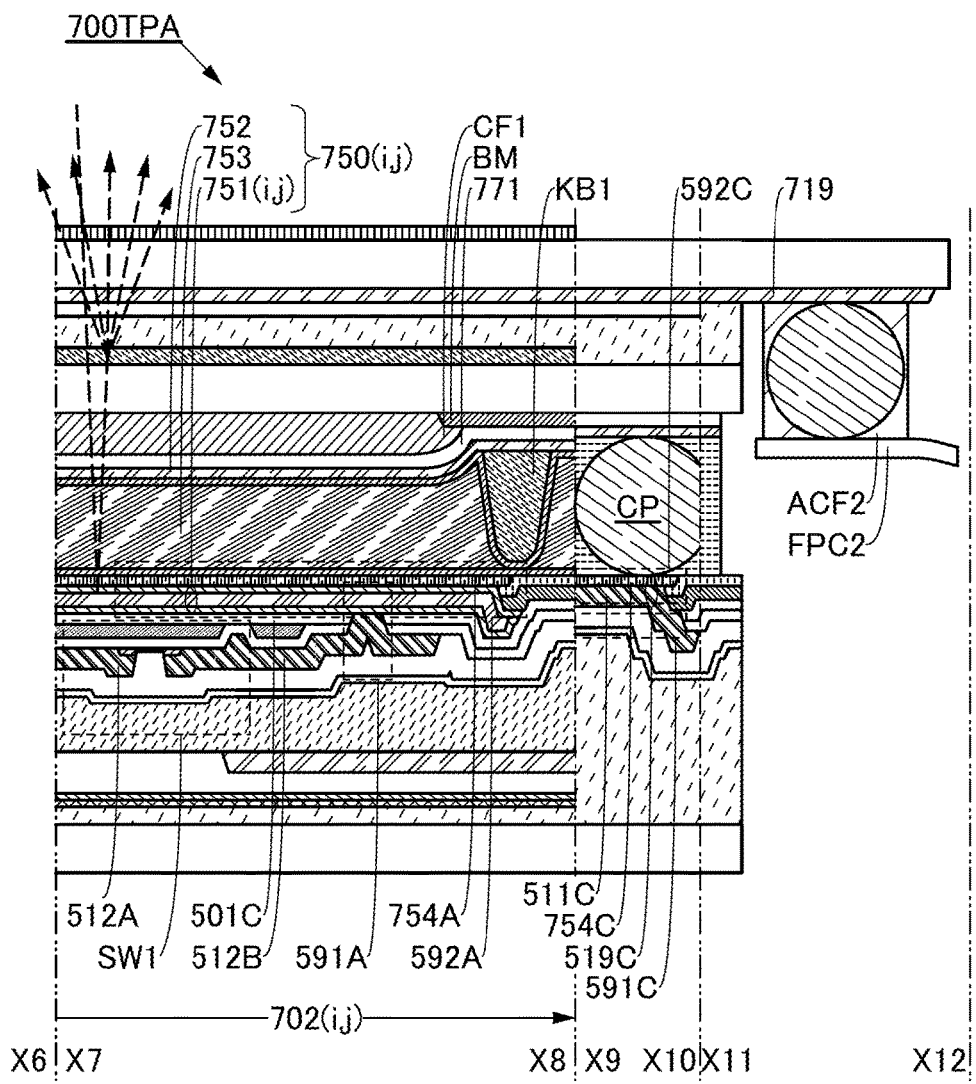
FIGS. 8A and 8B are cross-sectional views illustrating a cross-sectional structure of an input/output device of one embodiment.
Figure 8B:
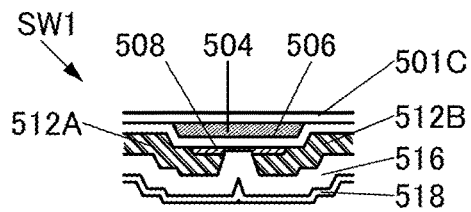

FIGS. 8A and 8B illustrate the structure of the input/output device 700TPA of one embodiment of the present invention. FIG. 8A is a cross-sectional view taken along cutting plane lines X7-X8, X9-X10, and X11-X12 in FIG. 7A, and FIG. 8B is a cross-sectional view illustrating some components of the input/output device 700TPA.

FIGS. 9A, 9B1, and 9B2 illustrate the structure of an input/output device of one embodiment of the present invention. FIG. 9A is a block diagram of an input portion of the input/output device of one embodiment of the present invention. FIG. 9B1 is a schematic diagram illustrating part of FIG. 9A. FIG. 9B2 is a schematic diagram illustrating part of FIG. 9B1.

STRUCTURE EXAMPLE 1 OF INPUT/OUTPUT DEVICE

The input/output device 700TPA described in this embodiment includes a display panel and an input portion (see FIG. 7A and FIG. 8A). For example, the display panel described in Embodiment 1 can be used for the input/output device.

The input portion includes a region overlapping with the display panel. The input portion has a function of detecting an object that approaches the region overlapping with the display panel. The input portion includes a control line CL(g), a signal line ML(h), and a sensing element 775(g, h) (see FIG. 7A).

The control line CL(g) extends in the row direction, and the signal line ML(h) extends in the column direction (see FIG. 9A).

The sensing element 775(g, h) has a light-transmitting property. The sensing element 775(g, h) includes a first electrode C(g) electrically connected to the control line CL(g) and a second electrode M(h) electrically connected to the signal line ML(h) (see FIG. 9B2).

The second electrode M(h) is provided so that an electric field that is partly blocked by the object approaching the region overlapping with the display panel is generated between the second electrode M(h) and the first electrode C(g) (see FIG. 7A and FIG. 9A).

The sensing element 775(g, h) of the input/output device described in this embodiment includes a region overlapping with the pixel 702(i, j).

The first electrode C(g) includes a light-transmitting conductive film. Alternatively, the second electrode M(h) includes a light-transmitting conductive film.

The input/output device described in this embodiment includes the light-transmitting sensing element in the region overlapping with the pixel. Accordingly, an object that approaches the region overlapping with the display panel can be sensed without disturbing display of the display panel. As a result, a novel input/output device that is highly convenient or highly reliable can be provided.

The input portion of the input/output device described in this embodiment includes a substrate 710 and a bonding layer 709 (see FIG. 7A).

The substrate 710 is provided so that the sensing element 775(g, h) lies between the substrate 710 and the substrate 770. The bonding layer 709 is provided between the substrate 770 and the sensing element 775(g, h).

The functional film 770P is provided so that the sensing element 775(g, h) lies between the functional film 770P and the first display element 750(i, j). Thus, the intensity of light reflected by the sensing element 775(g, h) can be reduced, for example.

The input/output device described in this embodiment includes a group consisting of sensing elements 775(g, 1) to 775(g, q) and another group consisting of sensing elements 775(1, h) to 775(p, h) (see FIG. 9A). Note that g is an integer greater than or equal to 1 and less than or equal to p, h is an integer greater than or equal to 1 and less than or equal to q, and p and q are each an integer greater than or equal to 1.

The group consisting of the sensing elements 775(g, 1) to 775(g, q) includes the sensing element 775(g, h) and is provided in the row direction (the direction indicated by the arrow R in the drawing).

The another group consisting of the sensing elements 775(1, h) to 775(p, h) includes the sensing element 775(g, h) and is provided in the column direction (the direction indicated by the arrow C in the drawing) that intersects the row direction.

The group consisting of the sensing elements 775(g, 1) to 775(g, q) provided in the row direction includes the first electrode C(g) that is electrically connected to the control line CL(g).

The another group consisting of the sensing elements 775(1, h) to 775(p, h) provided in the column direction includes the second electrode M(h) that is electrically connected to the signal line ML(h).

The control line CL(g) of the input/output device described in this embodiment includes a conductive film BR(g, h) (see FIG. 7A). The conductive film BR(g, h) includes a region overlapping with the signal line ML(h).

An insulating film 706 is provided between the signal line ML(h) and the conductive film BR(g, h). Thus, a short circuit between the signal line ML(h) and the conductive film BR(g, h) can be prevented.

The input/output device described in this embodiment includes an oscillator circuit OSC and a detection circuit DC (see FIG. 9A).

The oscillator circuit OSC is electrically connected to the control line CL(g) and has a function of supplying a search signal. For example, a rectangular wave, a sawtooth wave, a triangular wave, or the like can be used as the search signal.

The detection circuit DC is electrically connected to the signal line ML(h) and has a function of supplying a search signal on the basis of a change in the potential of the signal line ML(h).

Individual components included in the input/output device will be described below. Note that these components cannot be clearly distinguished from each other and one component may also serve as another component or include part of another component.

For example, a control line electrically connected to a sensing element serves as both the control line and an electrode of the sensing element. Furthermore, a control line electrically connected to a sensing element serves as both the signal line and an electrode of the sensing element.

The input/output device is different from the display panel described in Embodiment 1 with reference to FIGS. 1A, 1B1, and 1B2, FIGS. 2A and 2B, FIGS. 3A and 3B, FIG. 4, and FIGS. 5A, 5B1, and 5B2 in including the input portion. Different portions will be described in detail below, and the above description is referred to for the other similar portions.

STRUCTURE EXAMPLE 1

The input/output device described in this embodiment includes the display panel described in Embodiment 1, the substrate 710, and a functional layer 720 (see FIG. 7A and FIG. 8A).

The functional layer 720 includes a region between the substrate 770 and the substrate 710. The functional layer 720 includes the sensing element 775(g, h) and the insulating film 706.

The input/output device described in this embodiment also includes the bonding layer 709.

The bonding layer 709 lies between the functional layer 720 and the substrate 770 and has a function of bonding the functional layer 720 and the substrate 770 together.

The input/output device described in this embodiment also includes the terminal 719. The terminal 719 is electrically connected to the sensing element 775(g, h).

<<Substrate 710>>

A light-transmitting material can be used for the substrate 710, for example. Specifically, a material selected from the materials that can be used for the substrate 570 can be used for the substrate 710.

For example, aluminosilicate glass, tempered glass, chemically tempered glass, sapphire, or the like can be favorably used for the substrate 710 that is on a side closer to a user of the display panel. This can prevent breakage or damage of the display panel caused by the use.

<<Sensing Element 775(g, h)>>

As the sensing element 775(g, h), an element that senses electrostatic capacitance, illuminance, magnetic force, a radio wave, pressure, or the like and supplies data based on the sensed physical value can be used, for example.

Specifically, a capacitor, a photoelectric conversion element, a magnetic sensing element, a piezoelectric element, a resonator, or the like can be used as the sensing element 775(g, h).

When a finger or the like that has a higher dielectric constant than that of the air approaches a conductive film in the air, for example, electrostatic capacitance between the finger or the like and the conductive film changes. This electrostatic capacitance change can be sensed, and the sensed data can be supplied. Specifically, a self-capacitive sensing element can be used.

The first electrode C(g) and the second electrode M(h) can be used for the sensing element, for example. Specifically, the first electrode C(g) to which a search signal is supplied and the second electrode M(h) that is positioned so that an electric field part of which is blocked by an approaching object is generated between the second electrode M(h) and the first electrode C(g) can be used. Thus, the electric field that is changed when blocked by the approaching object can be sensed using the potential of the signal line ML(h), and a sensor signal can be supplied. As a result, the approaching object that blocks the electric field can be sensed. Specifically, a mutual capacitive sensing element can be used.

<<Control Line CL(g), First Electrode C(g), Signal Line ML(h), Second Electrode M(h), Conductive Film BR(g, h)>>

For the control line CL(g), the first electrode C(g), the signal line ML(h), the second electrode M(h), or the conductive film BR(g, h), a material having a visible-light-transmitting property and conductivity can be used, for example.

Specifically, a material used for the second electrode 752 can be used for the control line CL(g), the signal line ML(h), or the conductive film BR(g, h).

<<Insulating Film 706>>

For the insulating film 706 or the like, a material that can be used for the insulating film 521 can be used, for example. Specifically, a film containing silicon and oxygen can be used for the insulating film 706.

<<Terminal 719>>

A material that can be used for the wiring or the like can be used for the terminal 719, for example. Note that the terminal 719 can be electrically connected to a flexible printed circuit FPC2 using a conductive material ACF2, for example.

Note that a search signal can be supplied to the control line CL(g) using the terminal 719. Alternatively, a sensor signal can be supplied from the signal line ML(h).

<<Bonding Layer 709>>

A material that can be used for the sealant 705 can be used for the bonding layer 709, for example.

STRUCTURE EXAMPLE 2 OF INPUT/OUTPUT DEVICE

Another structure of the input/output device of one embodiment of the present invention will be described with reference to FIGS. 10A, 10B1, and 10B2, FIGS. 11A and 11B, and FIG. 12.

FIGS. 10A, 10B1, and 10B2 illustrate the structure of an input/output device 700TPB of one embodiment of the present invention. FIG. 10A is a top view of the input/output device 700TPB of one embodiment of the present invention. FIG. 10B1 is a schematic diagram illustrating part of an input portion of the input/output device of one embodiment of the present invention. FIG. 10B2 is a schematic diagram illustrating part of FIG. 10B1.

Figure 11A:
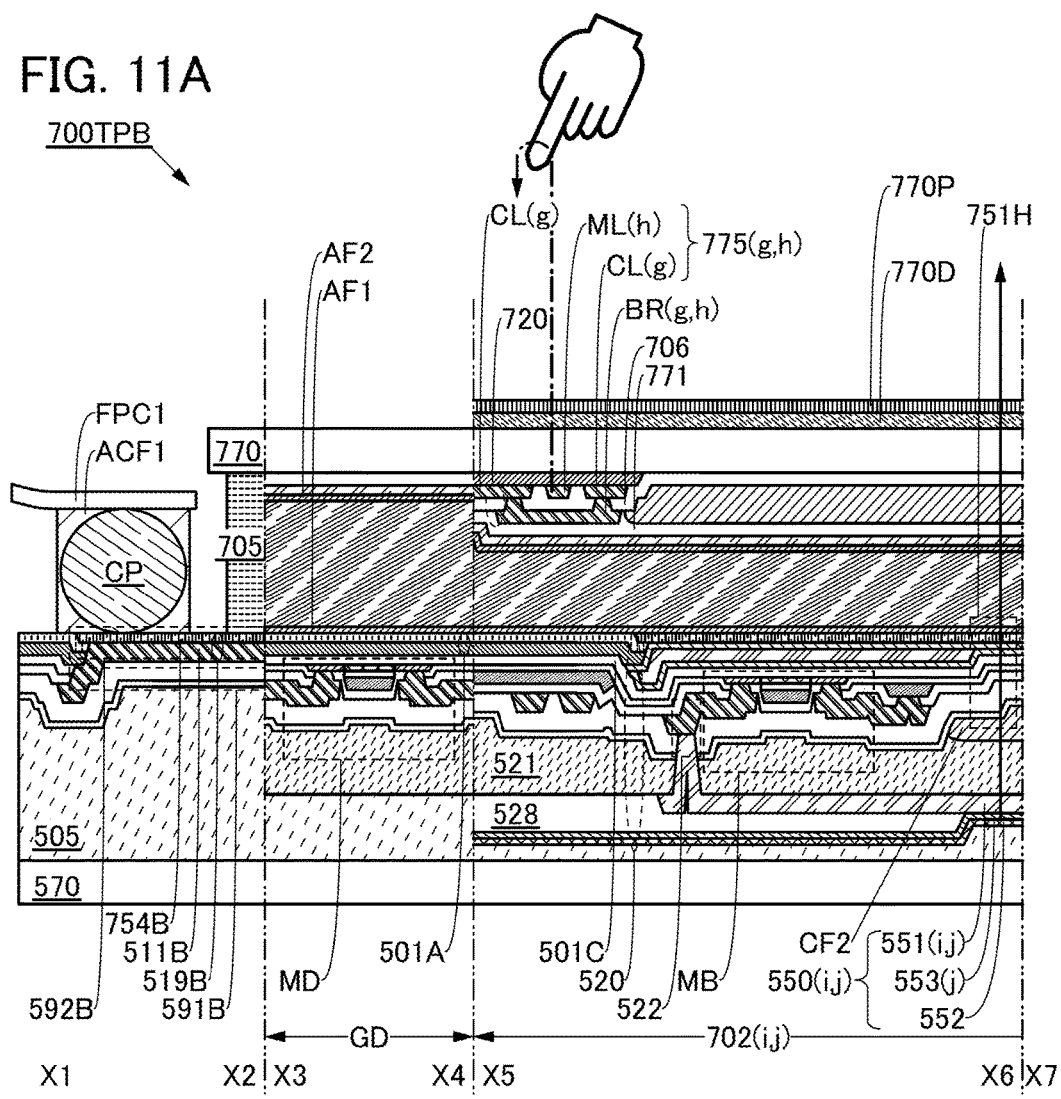
FIGS. 11A and 11B are cross-sectional views illustrating a cross-sectional structure of an input/output device of one embodiment.
Figure 11B:
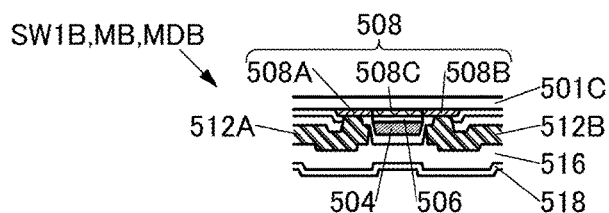
Figure 12:
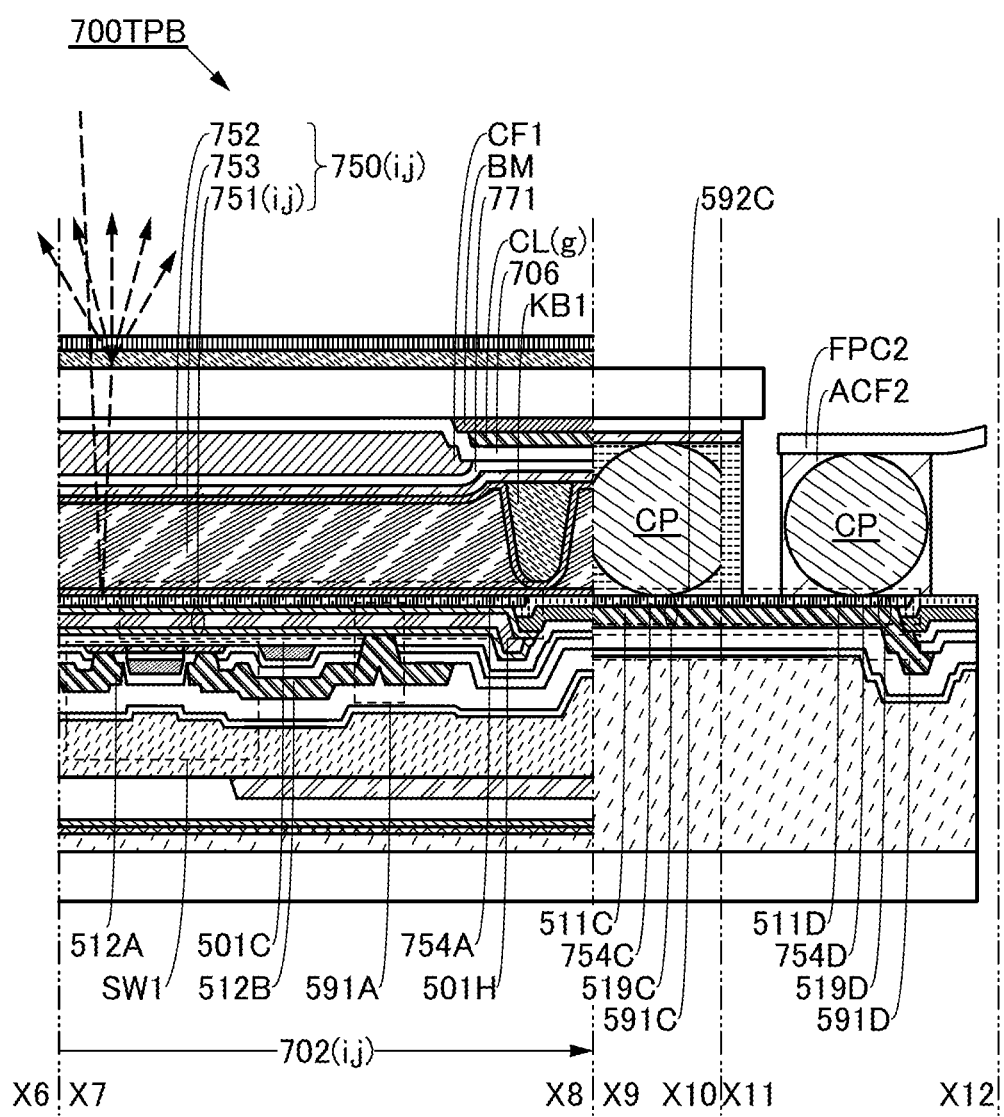
FIG. 12 is a cross-sectional view illustrating a cross-sectional structure of an input/output device of one embodiment.

FIGS. 11A and 11B and FIG. 12 are cross-sectional views illustrating the structure of the input/output device 700TPB of one embodiment of the present invention. FIG. 11A is a cross-sectional view taken along cutting plane lines X1-X2 and X3-X4 in FIG. 10A and cutting plane line X5-X6 in FIG. 10B2. FIG. 11B is a cross-sectional view illustrating part of the structure of the input/output device 700TPB.

FIG. 12 illustrates the structure of the input/output device 700TPB of one embodiment of the present invention. FIG. 12 is a cross-sectional view taken along cutting plane line X7-X8 in FIG. 10B2 and cutting plane lines X9-X10 and X11-X12 in FIG. 10A.

Note that the input/output device 700TPB is different from the input/output device 700TPA, which is described with reference to FIGS. 6A, 6B1, and 6B2, FIGS. 7A and 7B, FIGS. 8A and 8B, and FIGS. 9A, 9B1, and 9B2, in that a top-gate transistor is included; the functional layer 720 including the input portion is included in a region surrounded by the substrate 770, the insulating film 501C, and the sealant 705; the first electrode C(g) including an opening in a region overlapping with the pixel is included; the second electrode M(h) including an opening in a region overlapping with the pixel is included; a conductive film 511D electrically connected to the control line CL(g) or the signal line ML(h) is included; and a terminal 519D electrically connected to the conductive film 511D is included. Here, the different portions will be described in detail, and the above description is referred to for the other similar portions.

In the input/output device 700TPB described in this embodiment, the control line CL(g) is electrically connected to the first electrode C(g) provided with the opening, and the signal line ML(h) is electrically connected to the second electrode M(h) provided with the opening. The openings include the regions overlapping with the pixel. An opening of a conductive film included in the control line CL(g) includes a region overlapping with the pixel 702(i, j), for example (see FIGS. 10B1 and 10B2 and FIG. 11A). Note that the input/output device 700TPB further includes the light-blocking film BM between the sensing element 775(g, h) and the substrate 770 (see FIG. 11A). The light-blocking film BM has an opening in a region overlapping with the first display element 750(i, j). Moreover, the light-blocking film BM has a region overlapping with the sensing element 775(g, h).

In the input/output device 700TPB described in this embodiment, a gap greater than or equal to 0.2 μm and less than or equal to 16 μm, preferably greater than or equal to 1 μm and less than or equal to 8 μm, and further preferably greater than or equal to 2.5 μm and less than or equal to 4 μm, is provided between the control line CL(g) and the second electrode 752 or between the signal line ML(h) and the second electrode 752.

The input/output device of one embodiment of the present invention includes the first electrode provided with the opening in the region overlapping with the pixel and the second electrode provided with the opening in the region overlapping with the pixel. Accordingly, an object that approaches a region overlapping with the display panel can be sensed without disturbing display of the display panel. Furthermore, the thickness of the input/output device can be reduced. As a result, a novel input/output device that is highly convenient or highly reliable can be provided.

In the input/output device described in this embodiment, the functional layer 720 is provided in the region surrounded by the substrate 770, the insulating film 501C, and the sealant 705. Thus, the input/output device can be formed without using the substrate 710 and the bonding layer 709.

The input/output device described in this embodiment includes the conductive film 511D (see FIG. 12).

Note that a conductive material or the like can be provided between the control line CL(g) and the conductive film 511D to electrically connect the control line CL(g) and the conductive film 511D. Alternatively, a conductive material or the like can be provided between the signal line ML(h) and the conductive film 511D to electrically connect the signal line ML(h) and the conductive film 511D.

The input/output device described in this embodiment also includes the terminal 519D electrically connected to the conductive film 511D.

Note that the terminal 519D can be electrically connected to the flexible printed circuit FPC2 using the conductive material ACF2, for example. Accordingly, a search signal can be supplied to the control line CL(g) using the terminal 519D, or a sensor signal can be supplied from the signal line ML(h) using the terminal 519D, for example.

<<Conductive Film 511D>>

A material that can be used for the wiring or the like can be used for the conductive film 511D, for example.

<<Terminal 519D>>

A material that can be used for the wiring or the like can be used for the terminal 519D, for example. Specifically, the terminal 519D can have the same structure as the terminal 519B or the terminal 519C.

<<Switch SW1B, Transistor MB, Transistor MDB>>

A transistor that can be used for a switch SW1B, a transistor MB, and a transistor MDB each include the conductive film 504 having a region overlapping with the insulating film 501C and the semiconductor film 508 having a region that lies between the insulating film 501C and the conductive film 504. Note that the conductive film 504 functions as a gate electrode (see FIG. 11B).

The semiconductor film 508 includes a first region 508A, a second region 508B, and a third region 508C. The first region 508A and the second region 508B do not overlap with the conductive film 504. The third region 508C is positioned between the first region 508A and the second region 508B and overlaps with the conductive film 504.

The transistor MDB includes the insulating film 506 between the third region 508C and the conductive film 504. Note that the insulating film 506 functions as a gate insulating film.

The first region 508A and the second region 508B have a lower resistivity than that of the third region 508C, and function as a source region and a drain region.

Note that, for example, the method for controlling the resistivity of an oxide semiconductor film, which is described in detail in the end of Embodiment 1, can be used to form the first region 508A and the second region 508B in the semiconductor film 508. Specifically, plasma treatment using a gas containing a noble gas can be employed.

The conductive film 504 can be used as a mask, for example, in which case the third region 508C can be self-aligned to have a part having the same shape as an end portion of the conductive film 504.

The transistor MDB includes the conductive film 512A and the conductive film 512B that are in contact with the first region 508A and the second region 508B, respectively. The conductive film 512A and the conductive film 512B function as a source electrode and a drain electrode.

A transistor that can be fabricated in the same process as the transistor MDB can be used as the transistor MB.

STRUCTURE EXAMPLE 3 OF INPUT/OUTPUT DEVICE

Another structure of the input/output device of one embodiment of the present invention will be described with reference to FIGS. 32A and 32B and FIG. 33.

Figure 32A:
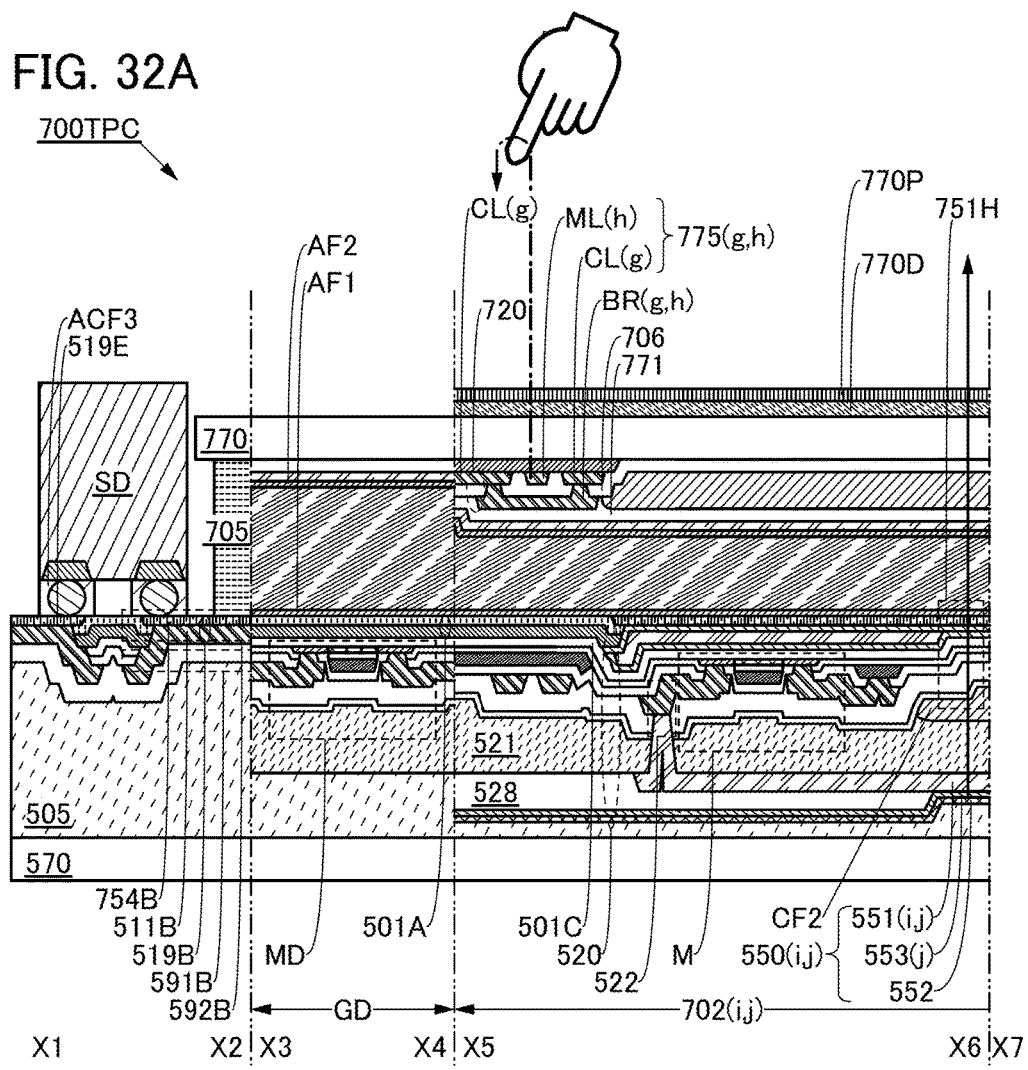
FIGS. 32A and 32B are cross-sectional views illustrating a cross-sectional structure of a display panel of one embodiment.
Figure 32B:
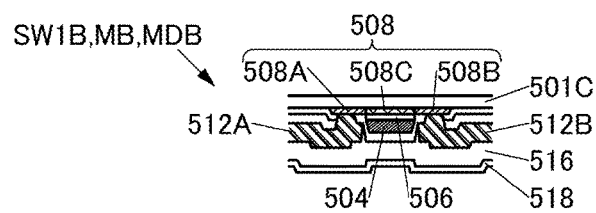
Figure 33:
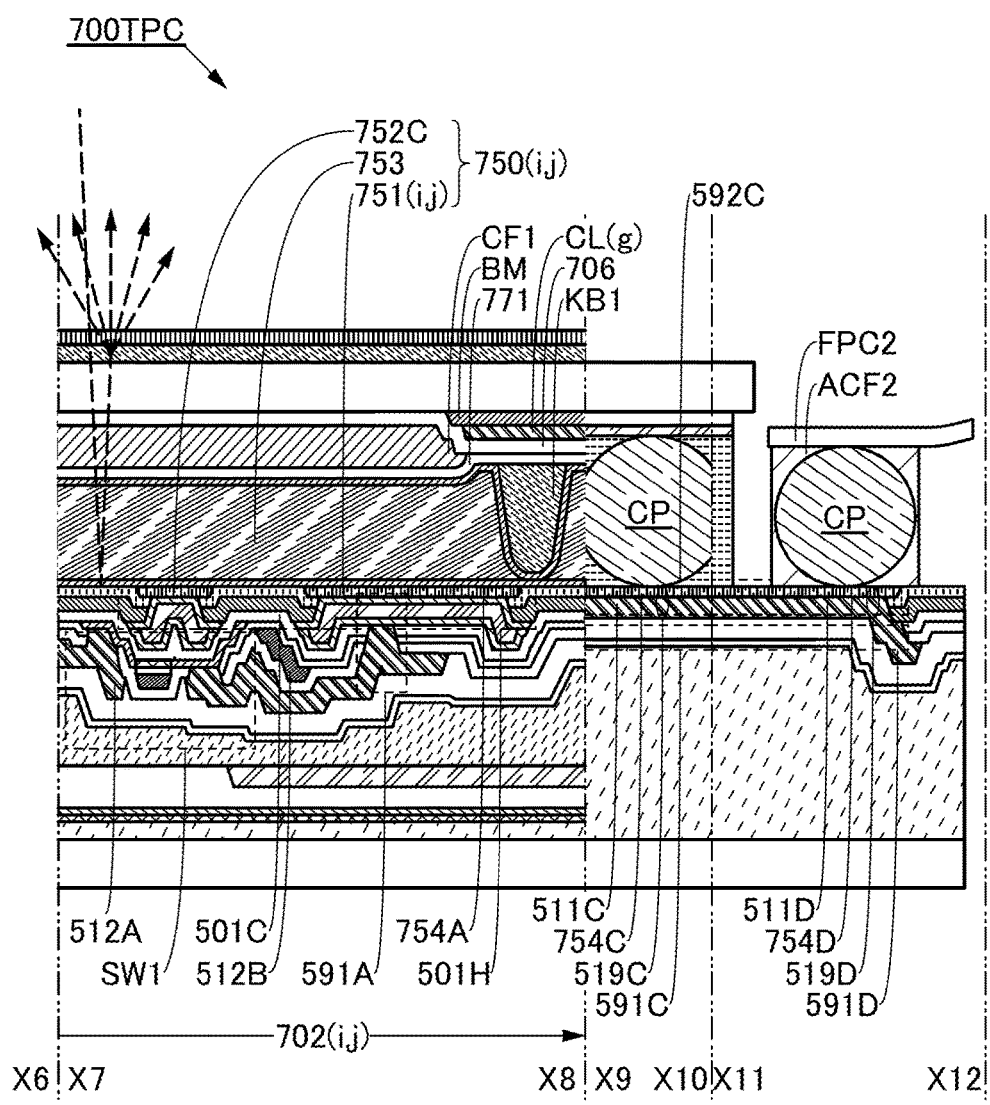
FIG. 33 is a cross-sectional view illustrating a cross-sectional structure of a display panel of one embodiment.

FIGS. 32A and 32B and FIG. 33 are cross-sectional views illustrating the structure of an input/output device of one embodiment of the present invention. FIG. 32A is a cross-sectional view of the input/output device that has a structure different from that illustrated in FIG. 11A. FIG. 32B illustrates part of FIG. 32A.

FIG. 33 is a cross-sectional view of the input/output device that has a structure different from that illustrated in FIG. 12.

Note that an input/output device 700TPC is different from the input/output device 700TPB, which is described with reference to FIGS. 10A, 10B1, and 10B2, FIGS. 11A and 11B, and FIG. 12, in that the driver circuit SD is electrically connected to a terminal using a chip on glass (COG) technique instead of a chip on film (COF) technique and in that the orientation of a liquid crystal material is controlled by, instead of an electric field in the thickness direction (also referred to as the vertical direction) of a liquid crystal layer, an electric field in the direction intersecting the vertical direction (also referred to as the horizontal direction or the diagonal direction). Here, the different portions will be described in detail, and the above description is referred to for the other similar portions.

<<Terminal 519E>>

For a terminal 519E, a material that can be used for the wiring or the like can be used, for example. Specifically, the terminal 519E can have the same structure as the terminal 519B. Note that the terminal 519E can be electrically connected to the driver circuit SD using a conductive material ACF3, for example. Furthermore, the terminal 519B can be electrically connected to the driver circuit SD.

<<Second Electrode 752C>>

A conductive film that can be formed in the same step as the first electrode 751(i, j) can be used for a second electrode 752C, for example. Accordingly, a liquid crystal element that can be driven in an in-plane-switching (IPS) mode can be used for the first display element 750(i, j), for example.

Note that this embodiment can be combined with any of the other embodiments in this specification as appropriate.

Embodiment 3

In this embodiment, the structure of a transistor that can be used for the display panel of one embodiment of the present invention will be described with reference to FIGS. 13A to 13D.

<Structure Example of Semiconductor Device>

Figure 13A:
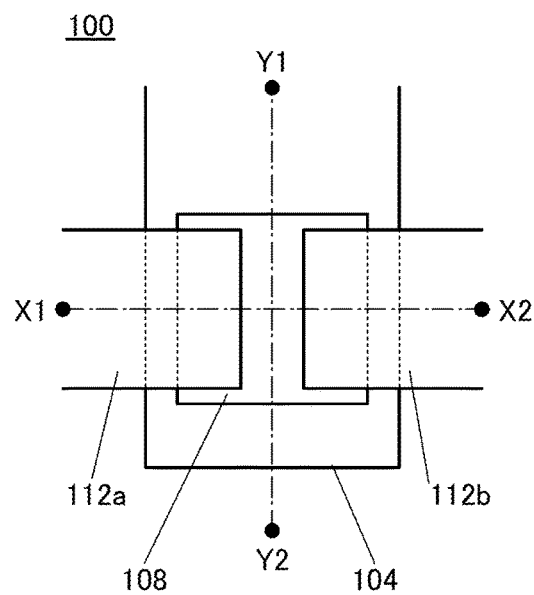
FIGS. 13A to 13D illustrate the structure of a transistor of one embodiment.

FIG. 13A is a top view of a transistor 100. FIG. 13C is a cross-sectional view taken along cutting plane line X1-X2 in FIG. 13A. FIG. 13D is a cross-sectional view taken along cutting plane line Y1-Y2 in FIG. 13A. Note that in FIG. 13A, some components of the transistor 100 (e.g., an insulating film serving as a gate insulating film) are not illustrated to avoid complexity. In some cases, the direction of the cutting plane line X1-X2 is referred to as a channel length direction and the direction of the cutting plane line Y1-Y2 is referred to as a channel width direction. As in FIG. 13A, some components might not be illustrated in some top views of transistors described below.

Note that the transistor 100 can be used in the display panel or the like described in Embodiment 1.

For example, when the transistor 100 is used for the switch SW1, a substrate 102, a conductive film 104, a stacked film of an insulating film 106 and an insulating film 107, an oxide semiconductor film 108, a conductive film 112a, a conductive film 112b, a stacked film of an insulating film 114 and an insulating film 116, and an insulating film 118 can be referred to as the insulating film 501C, the conductive film 504, the insulating film 506, the semiconductor film 508, the conductive film 512A, the conductive film 512B, the insulating film 516, and the insulating film 518, respectively.

The transistor 100 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, and the conductive films 112a and 112b functioning as source and drain electrodes electrically connected to the oxide semiconductor film 108. Over the transistor 100, specifically, over the conductive films 112a and 112b and the oxide semiconductor film 108, the insulating films 114, 116, and 118 are provided. The insulating films 114, 116, and 118 function as protective insulating films for the transistor 100.

The oxide semiconductor film 108 includes a first oxide semiconductor film 108a on the conductive film 104 side and a second oxide semiconductor film 108b over the first oxide semiconductor film 108a. The conductive film 104 serves as a gate electrode. Furthermore, the insulating films 106 and 107 function as gate insulating films of the transistor 100.

An In-M oxide (M is Ti, Ga, Sn, Y, Zr, La, Ce, Nd, or Hf) or an In-M-Zn oxide can be used for the oxide semiconductor film 108. It is particularly preferable to use an In-M-Zn oxide for the oxide semiconductor film 108.

The first oxide semiconductor film 108a includes a first region in which the atomic proportion of In is larger than the atomic proportion of M The second oxide semiconductor film 108b includes a second region in which the atomic proportion of In is smaller than that in the first oxide semiconductor film 108a. The second region includes a portion thinner than the first region.

The first oxide semiconductor film 108a including the first region in which the atomic proportion of In is larger than that of M can increase the field-effect mobility (also simply referred to as mobility or μFE) of the transistor 100. Specifically, the field-effect mobility of the transistor 100 can exceed 10 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the first oxide semiconductor film 108a including the first region in which the atomic proportion of In is larger than that of M makes it easier to change electrical characteristics of the transistor 100 in light irradiation. However, in the semiconductor device of one embodiment of the present invention, the second oxide semiconductor film 108b is formed over the first oxide semiconductor film 108a. In addition, the thickness of the channel region in the second oxide semiconductor film 108b is smaller than the thickness of the first oxide semiconductor film 108a.

Furthermore, the second oxide semiconductor film 108b includes the second region in which the atomic proportion of In is smaller than that in the first oxide semiconductor film 108a and thus has larger $E_g$ than that of the first oxide semiconductor film 108a. For this reason, the oxide semiconductor film 108 that is a layered structure of the first oxide semiconductor film 108a and the second oxide semiconductor film 108b has high resistance to a negative bias stress test with light irradiation.

The amount of light absorbed by the oxide semiconductor film 108 can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the oxide semiconductor film 108 will be described in detail with reference to FIG. 13B.

Figure 13B:
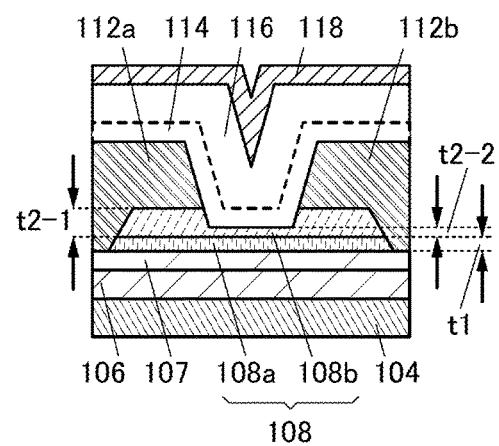
Figure 13C:
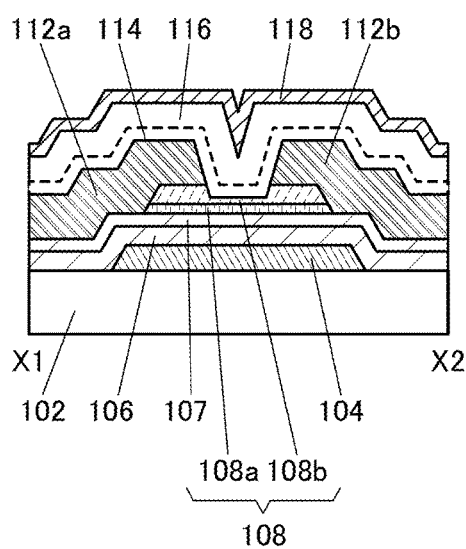
Figure 13D:
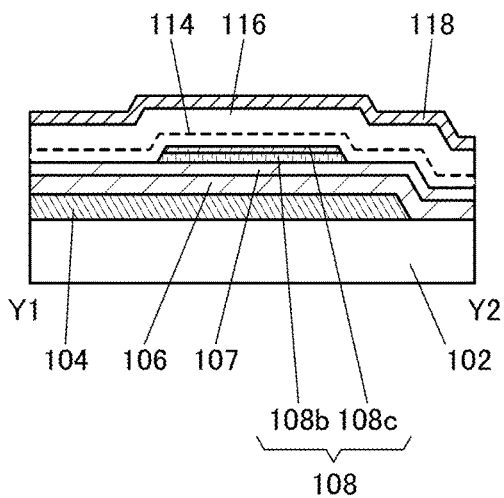

FIG. 13B is a cross-sectional enlarged view of the oxide semiconductor film 108 and the vicinity thereof in the transistor 100 illustrated in FIG. 13C.

In FIG. 13B, t1, t2-1, and t2-2 denote a thickness of the first oxide semiconductor film 108a, one thickness of the second oxide semiconductor film 108b, and the other thickness of the second oxide semiconductor film 108b, respectively. The second oxide semiconductor film 108b over the first oxide semiconductor film 108a prevents the first oxide semiconductor film 108a from being exposed to an etching gas, an etchant, or the like when the conductive films 112a and 112b are formed. This is why the first oxide semiconductor film 108a is not or is hardly reduced in thickness. In contrast, in the second oxide semiconductor film 108b, a portion not overlapping with the conductive films 112a and 112b is etched by formation of the conductive films 112a and 112b, so that a concave portion is formed in the etched region. In other words, a thickness of the second oxide semiconductor film 108*b* in a region overlapping with the conductive films 112*a* and 112*b* is t2-1, and a thickness of the second oxide semiconductor film 108*b* in a region not overlapping with the conductive films 112*a* and 112*b* is t2-2.

As for the relationships between the thicknesses of the first oxide semiconductor film 108*a* and the second oxide semiconductor film 108*b*, t2-1>t1>t2-2 is preferable. A transistor with the thickness relationships can have high field-effect mobility and less variation in threshold voltage in light irradiation.

When an oxygen vacancy is formed in the oxide semiconductor film 108 included in the transistor 100, electrons serving as carriers are generated; as a result, the transistor 100 tends to be normally on. Therefore, for stable transistor characteristics, it is important to reduce oxygen vacancies in the oxide semiconductor film 108, particularly oxygen vacancies in the first oxide semiconductor film 108*a*. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill an oxygen vacancy in the oxide semiconductor film 108, particularly in the first oxide semiconductor film 108*a*.

Note that it is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

To fill an oxygen vacancy in the first oxide semiconductor film 108*a*, the thickness of the portion including the channel region and the vicinity of the channel region in the second oxide semiconductor film 108*b* is preferably small, and t2-2 <t1 is preferably satisfied. For example, the thickness of the portion including the channel region and the vicinity of the channel region in the second oxide semiconductor film 108*b* is preferably more than or equal to 1 nm and less than or equal to 20 nm, further preferably more than or equal to 3 nm and less than or equal to 10 nm.

Other constituent elements of the semiconductor device of this embodiment will be described below in detail.

<<Substrate>>

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102.

Alternatively, a single crystal semiconductor substrate or a polycrystalline semiconductor substrate of silicon or silicon carbide, a compound semiconductor substrate of silicon germanium, an SOI substrate, or the like can be used.

Alternatively, any of these substrates provided with a semiconductor element, an insulating film, or the like may be used as the substrate 102.

Note that in the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<<Conductive Film Functioning as Gate Electrode, Source Electrode, and Drain Electrode>>

The conductive film 104 functioning as a gate electrode and the conductive films 112*a* and 112*b* functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 104, 112*a*, and 112*b* may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, an alloy film or a nitride film in which aluminum and one or more elements selected from titanium, tantalum, tungsten, molybdenum, chromium, neodymium, and scandium are combined may be used.

The conductive films 104, 112*a*, and 112*b* can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112*a*, and 112*b*. Use of a Cu—X alloy film enables the manufacturing cost to be reduced because wet etching process can be used in the processing.

<<Insulating Film Functioning as Gate Insulating Film>>

As each of the insulating films 106 and 107 functioning as gate insulating films of the transistor 100, an insulating film including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 functions as a blocking film that inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride have. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than that of hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than that of a silicon oxide film and needs a larger thickness for electrostatic capacitance equivalent to that of the silicon oxide film. Thus, when the silicon nitride film is included in the gate insulating film of the transistor 100, the physical thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

The oxide semiconductor film 108 can be formed using the materials described above.

In the case where an In-M-Zn oxide is used for the oxide semiconductor film 108, it is preferable that the atomic ratio of metal elements of a sputtering target used to form the In-M-Zn oxide satisfy In≥M and Zn≥M As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

In the case where an In-M-Zn oxide is used for the oxide semiconductor film 108, it is preferable to use a target including a polycrystalline In-M-Zn oxide as the sputtering target. The use of the target including a polycrystalline In-M-Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

The first oxide semiconductor film 108a can be formed using the sputtering target having an atomic ratio of In:M:Zn=2:1:3, In:M:Zn=3:1:2, or In:M:Zn=4:2:4.1. The second oxide semiconductor film 108b can be formed using the sputtering target having an atomic ratio of In:M:Zn=1:1:1 or In:M:Zn=1:1:1.2. Note that the atomic ratio of metal elements in a sputtering target used to form the second oxide semiconductor film 108b does not necessarily satisfy In≥M and Zn≥M and may satisfy In≥M and Zn<M, such as In:M:Zn=1:3:2.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the first oxide semiconductor film 108a, and an oxide semiconductor film having an energy gap more than or equal to 2.5 eV and less than or equal to 3.5 eV is preferably used as the second oxide semiconductor film 108b. Furthermore, the second oxide semiconductor film 108b preferably has a higher energy gap than that of the first oxide semiconductor film 108a.

Each thickness of the first oxide semiconductor film 108a and the second oxide semiconductor film 108b is more than or equal to 3 nm and less than or equal to 200 nm, preferably more than or equal to 3 nm and less than or equal to 100 nm, further preferably more than or equal to 3 nm and less than or equal to 50 nm. Note that the above-described thickness relationships between them are preferably satisfied.

An oxide semiconductor film with low carrier density is used as the second oxide semiconductor film 108b. For example, the carrier density of the second oxide semiconductor film 108b is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the first oxide semiconductor film 108a and the second oxide semiconductor film 108b be set to be appropriate.

Note that it is preferable to use, as the first oxide semiconductor film 108a and the second oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1 \times 10^6$ μm and a channel length L of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferable that hydrogen be reduced as much as possible in the oxide semiconductor film 108. Specifically, in the oxide semiconductor film 108, the concentration of hydrogen that is measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than or equal to $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, and further preferably lower than or equal to $1 \times 10^{16}$ atoms/cm$^3$.

When silicon or carbon that is one of elements belonging to Group 14 is included in the first oxide semiconductor film 108a, oxygen vacancies are increased in the first oxide pe film. Thus, the concentration of silicon or carbon (the concentration is measured by SIMS) in the first oxide semiconductor film 108a or the concentration of silicon or carbon (the concentration is measured by SIMS) in the vicinity of an interface with the first oxide semiconductor film 108a is set to be lower than or equal to $2 \times 10^{18}$ atoms/cm$^3$, preferably lower than or equal to $2 \times 10^{17}$ atoms/cm$^3$.

In addition, the concentration of alkali metal or alkaline earth metal of the first oxide semiconductor film 108a, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the first oxide semiconductor film 108a.

Furthermore, when including nitrogen, the first oxide semiconductor film 108a easily becomes n-type by generation of electrons serving as carriers and an increase of carrier density. Thus, a transistor including an oxide semiconductor film that contains nitrogen is likely to have normally-on characteristics. For this reason, nitrogen in the oxide semiconductor film is preferably reduced as much as possible; the concentration of nitrogen that is measured by SIMS is preferably set to be, for example, lower than or equal to $5 \times 10^{18}$ atoms/cm$^3$.

Each of the first oxide semiconductor film 108a and the second oxide semiconductor film 108b may have a non-single-crystal structure. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Film Functioning as Protective Insulating Film of Transistor>>

The insulating films 114 and 116 each have a function of supplying oxygen to the oxide semiconductor film 108. The insulating film 118 functions as a protective insulating film of the transistor 100. The insulating films 114 and 116 include oxygen. Furthermore, the insulating film 114 is an insulating film that can transmit oxygen. The insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that not all oxygen entering the insulating film 114 from the outside moves to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in thermal desorption spectroscopy (TDS) analysis; the amount of released ammonia is typically greater than or equal to $1 \times 10^{18}/cm^3$ and less than or equal to $5 \times 10^{19}/cm^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typified by $NO_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typified by heat treatment at a temperature higher than or equal to 300° C. and lower than 350° C., a first signal that appears at a g-factor greater than or equal to 2.037 and less than or equal to 2.039, a second signal that appears at a g-factor greater than or equal to 2.001 and less than or equal to 2.003, and a third signal that appears at a g-factor greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 correspond to signals attributed to nitrogen oxide ($NO_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a film surface temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114 has.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films that are described above can be formed by a sputtering method or a PECVD method, such films may be formed by another method, e.g., a thermal chemical vapor deposition (CVD) method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas that is obtained by vaporizing liquid containing a solvent and a hafnium precursor compound (e.g., a hafnium alkoxide or a hafnium amide such as tetrakis(dimethylamide) hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas that is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced plural times to form an initial tungsten film, and then a $WF_6$ gas and an $H_2$ gas are used, so that a tungsten film is formed. Note that a $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by mixing these gases. Note that although an $H_2O$ gas that is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Note that this embodiment can be combined with any of the other embodiments in this specification as appropriate.

Embodiment 4

In this embodiment, the structure of a transistor that can be used in the display panel of one embodiment of the present invention will be described with reference to FIGS. 14A to 14C.

<Structure Example of Semiconductor Device>

Figure 14A:
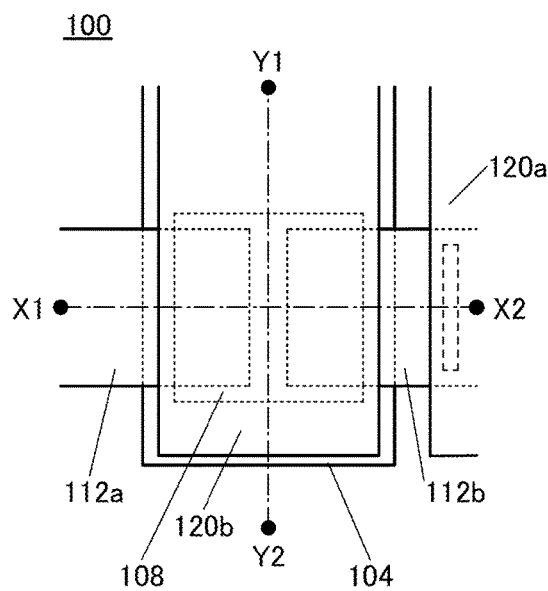
FIGS. 14A to 14C illustrate the structure of a transistor of one embodiment.
Figure 14B:
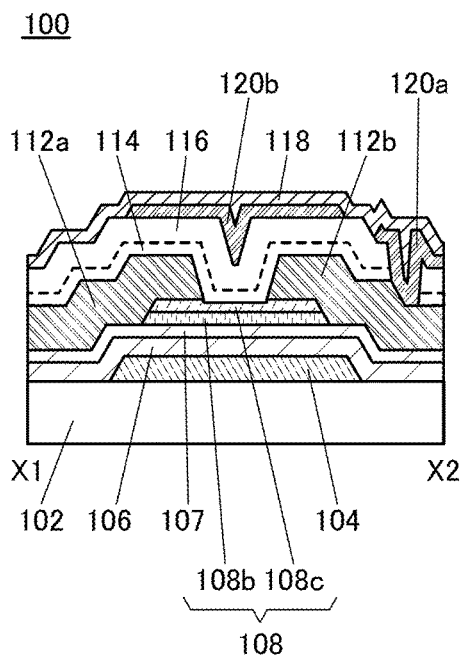
Figure 14C:
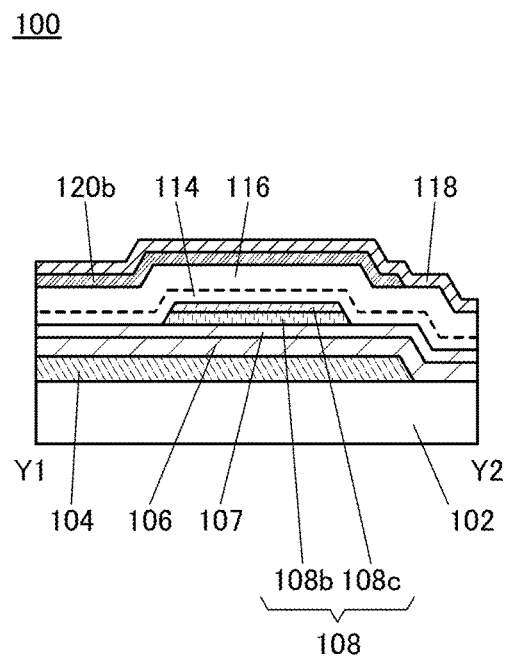

FIG. 14A is a top view of the transistor 100. FIG. 14B is a cross-sectional view taken along cutting plane line X1-X2 in FIG. 14A. FIG. 14C is a cross-sectional view taken along cutting plane line Y1-Y2 in FIG. 14A. Note that in FIG.

14A, some components of the transistor 100 (e.g., an insulating film serving as a gate insulating film) are not illustrated to avoid complexity. Furthermore, the direction of the cutting plane line X1-X2 may be called a channel length direction, and the direction of the cutting plane line Y1-Y2 may be called a channel width direction. As in FIG. 14A, some components are not illustrated in some cases in top views of transistors described below.

The transistor 100 can be used for the display panel or the like described in Embodiment 1.

For example, when the transistor 100 is used as the transistor M or the transistor MD, the substrate 102, the conductive film 104, a stacked film of the insulating film 106 and the insulating film 107, the oxide semiconductor film 108, the conductive film 112a, the conductive film 112b, a stacked film of the insulating film 114 and the insulating film 116, the insulating film 118, and a conductive film 120b can be referred to as the insulating film 501C, the conductive film 504, the insulating film 506, the semiconductor film 508, the conductive film 512A, the conductive film 512B, the insulating film 516, the insulating film 518, and the conductive film 524, respectively.

The transistor 100 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, and the conductive films 112a and 112b functioning as source and drain electrodes electrically connected to the oxide semiconductor film 108, the insulating films 114 and 116 over the oxide semiconductor film 108 and the conductive films 112a and 112b, a conductive film 120a that is over the insulating film 116 and electrically connected to the conductive film 112b, the conductive film 120b over the insulating film 116, and the insulating film 118 over the insulating film 116 and the conductive films 120a and 120b.

The insulating films 106 and 107 function as a first gate insulating film of the transistor 100. The insulating films 114 and 116 function as a second gate insulating film of the transistor 100. The insulating film 118 functions as a protective insulating film of the transistor 100.

The conductive film 120b can be used for a second gate electrode of the transistor 100.

In the case where the transistor 100 is used in the display panel, the conductive film 120a can be used for an electrode of a display element, or the like.

The oxide semiconductor film 108 includes the oxide semiconductor film 108b (on the conductive film 104 side) that functions as a first gate electrode and an oxide semiconductor film 108c over the oxide semiconductor film 108b. The oxide semiconductor films 108b and 108c contain In, M (M is Al, Ga, Y, or Sn), and Zn.

The oxide semiconductor film 108b preferably includes a region in which the atomic proportion of In is larger than the atomic proportion of M, for example. The oxide semiconductor film 108c preferably includes a region in which the atomic proportion of In is smaller than that in the oxide semiconductor film 108b.

The oxide semiconductor film 108b including the region in which the atomic proportion of In is larger than that of M can increase the field-effect mobility (also simply referred to as mobility or μFE) of the transistor 100. Specifically, the field-effect mobility of the transistor 100 can exceed 10 $cm^2/Vs$, and preferably exceed 30 $cm^2/Vs$.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108b including the region in which the atomic proportion of In is larger than that of M makes it easier to change electrical characteristics of the transistor 100 in light irradiation. However, in the semiconductor device of one embodiment of the present invention, the oxide semiconductor film 108c is formed over the oxide semiconductor film 108b. Furthermore, the oxide semiconductor film 108c including the region in which the atomic proportion of In is smaller than that in the oxide semiconductor film 108b has larger $E_g$ than that of the oxide semiconductor film 108b. For this reason, the oxide semiconductor film 108 that is a layered structure of the oxide semiconductor film 108b and the oxide semiconductor film 108c has high resistance to a negative bias stress test with light irradiation.

Impurities such as hydrogen or moisture entering the channel region of the oxide semiconductor film 108, particularly the oxide semiconductor film 108b adversely affect the transistor characteristics and therefore cause a problem. Moreover, it is preferable that the amount of impurities such as hydrogen or moisture in the channel region of the oxide semiconductor film 108b be as small as possible. Furthermore, oxygen vacancies formed in the channel region in the oxide semiconductor film 108b adversely affect the transistor characteristics and therefore cause a problem. For example, oxygen vacancies formed in the channel region in the oxide semiconductor film 108b are bonded to hydrogen to serve as a carrier supply source. The carrier supply source generated in the channel region in the oxide semiconductor film 108b causes a change in the electrical characteristics, typically, shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with the oxide semiconductor film 108, specifically the insulating film 107 formed under the oxide semiconductor film 108 and the insulating films 114 and 116 formed over the oxide semiconductor film 108 include excess oxygen. Oxygen or excess oxygen is transferred from the insulating film 107 and the insulating films 114 and 116 to the oxide semiconductor film 108, whereby the oxygen vacancies in the oxide semiconductor film can be reduced. As a result, a change in electrical characteristics of the transistor 100, particularly a change in the transistor 100 due to light irradiation, can be reduced.

In one embodiment of the present invention, a manufacturing method is used in which the number of manufacturing steps is not increased or an increase in the number of manufacturing steps is extremely small, because the insulating film 107 and the insulating films 114 and 116 are made to contain excess oxygen. Thus, the transistors 100 can be manufactured with high yield.

Specifically, in the step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in the step of forming the conductive films 120a and 120b, the conductive films 120a and 120b are formed by a sputtering method in an atmosphere containing an oxygen gas, whereby oxygen or excess oxygen is added to the insulating film 116 over which the conductive films 120a and 120b are formed. Note that in some cases, oxygen or excess oxygen is added also to the insulating film 114 and the oxide semiconductor film 108 under the insulating film 116 when oxygen or excess oxygen is added to the insulating film 116.

<Oxide Conductor>

Next, an oxide conductor is described. In the step of forming the conductive films 120a and 120b, the conductive films 120a and 120b serve as a protective film for suppressing release of oxygen from the insulating films 114 and 116. The conductive films 120a and 120b serve as semiconductors before the step of forming the insulating film 118 and serve as conductors after the step of forming the insulating film 118.

To allow the conductive films 120a and 120b to serve as conductors, an oxygen vacancy is formed in the conductive films 120a and 120b and hydrogen is added from the insulating film 118 to the oxygen vacancy, whereby a donor level is formed in the vicinity of the conduction band. As a result, the conductivity of each of the conductive films 120a and 120b is increased, so that the conductive films 120a and 120b become conductors. The conductive films 120a and 120b having become conductors can each be referred to as an oxide conductor. Oxide semiconductors generally have a visible-light-transmitting property because of their large energy gap. An oxide conductor is an oxide semiconductor having a donor level in the vicinity of the conduction band. Therefore, the influence of absorption due to the donor level is small in an oxide conductor, and an oxide conductor has a visible-light-transmitting property comparable to that of an oxide semiconductor.

<Components Of Semiconductor Device>

Components of the semiconductor device of this embodiment will be described below in detail.

As materials described below, materials described in Embodiment 2 can be used.

The material that can be used for the substrate 102 described in Embodiment 2 can be used for the substrate 102 in this embodiment. Furthermore, the materials that can be used for the insulating films 106 and 107 described in Embodiment 2 can be used for the insulating films 106 and 107 in this embodiment.

In addition, the materials that can be used for the conductive films functioning as the gate electrode, the source electrode, and the drain electrode described in Embodiment 2 can be used for the conductive films functioning as the first gate electrode, the source electrode, and the drain electrode in this embodiment.

<<Oxide Semiconductor Film>>

The oxide semiconductor film 108 can be formed using the materials described above.

In the case where an In-M-Zn oxide is used for the oxide semiconductor film 108b, it is preferable that the atomic ratio of metal elements of a sputtering target used to form the In-M-Zn oxide satisfy In>M. The atomic ratio between metal elements in such a sputtering target is, for example, In:M:Zn=2:1:3, In:M:Zn=3:1:2, or In:M:Zn=4:2:4.1.

In the case where an In-M-Zn oxide is used for the oxide semiconductor film 108c, it is preferable that the atomic ratio of metal elements of a sputtering target used to form a film of the In-M-Zn oxide satisfy In The atomic ratio of metal elements in such a sputtering target is, for example, In:M:Zn=1:1:1, In:M:Zn=1:1:1.2, In:M:Zn=1:3:2, In:M:Zn=1:3:4, In:M:Zn=1:3:6, or In:M:Zn=1:4:5.

In the case where an In-M-Zn oxide is used for the oxide semiconductor films 108b and 108c, it is preferable to use a target including a polycrystalline In-M-Zn oxide as the sputtering target. The use of the target including a polycrystalline In-M-Zn oxide facilitates formation of the oxide semiconductor films 108b and 108c having crystallinity. Note that the atomic ratios of metal elements in each of the formed oxide semiconductor films 108b and 108c vary from the above atomic ratio of metal elements of the sputtering target within a range of ±40% as an error. For example, when a sputtering target of the oxide semiconductor film 108b with an atomic ratio of In to Ga and Zn of 4:2:4.1 is used, the atomic ratio of In to Ga and Zn in the oxide semiconductor film 108b may be 4:2:3 or in the vicinity of 4:2:3.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108b, and an oxide semiconductor film having an energy gap more than or equal to 2.5 eV and less than or equal to 3.5 eV is preferably used as the oxide semiconductor film 108c. Furthermore, the oxide semiconductor film 108c preferably has a higher energy gap than that of the oxide semiconductor film 108b.

Each thickness of the oxide semiconductor film 108b and the oxide semiconductor film 108c is more than or equal to 3 nm and less than or equal to 200 nm, preferably more than or equal to 3 nm and less than or equal to 100 nm, further preferably more than or equal to 3 nm and less than or equal to 50 nm.

An oxide semiconductor film with low carrier density is used as the oxide semiconductor film 108c. For example, the carrier density of the oxide semiconductor film 108c is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as the oxide semiconductor film 108b and the oxide semiconductor film 108c, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ µm and a channel length L of 10 µm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, and alkaline earth metal are given.

Hydrogen included in the oxide semiconductor film reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferable that hydrogen be reduced as much as possible in the oxide semiconductor film 108. Specifically, in the oxide semiconductor film 108, the concentration of hydrogen that is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The oxide semiconductor film 108b preferably includes a region in which hydrogen concentration is smaller than that in the oxide semiconductor film 108c. A semiconductor device including the oxide semiconductor film 108b having the region in which hydrogen concentration is smaller than that in the oxide semiconductor film 108c can be increased in reliability.

When silicon or carbon that is one of elements belonging to Group 14 is included in the oxide semiconductor film 108b, oxygen vacancies are increased in the oxide semiconductor film 108b, and the oxide semiconductor film 108b becomes an n-type film. Thus, the concentration of silicon or carbon (the concentration is measured by SIMS) in the oxide semiconductor film 108b or the concentration of silicon or carbon (the concentration is measured by SIMS) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108b.

Furthermore, when including nitrogen, the oxide semiconductor film 108b easily becomes n-type by generation of electrons serving as carriers and an increase of carrier density. Thus, a transistor including an oxide semiconductor film that contains nitrogen is likely to have normally-on characteristics. For this reason, nitrogen in the oxide semiconductor film is preferably reduced as much as possible; the concentration of nitrogen that is measured by SIMS is preferably set to be, for example, lower than or equal to $5\times10^{18}$ atoms/cm$^3$.

The oxide semiconductor film 108b and the oxide semiconductor film 108c may have a non-single-crystal structure. The non-single crystal structure includes CAAC-OS, a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Films Functioning As Second Gate Insulating Film>>

The insulating films 114 and 116 function as a second gate insulating film of the transistor 100. In addition, the insulating films 114 and 116 each have a function of supplying oxygen to the oxide semiconductor film 108. That is, the insulating films 114 and 116 contain oxygen. Furthermore, the insulating film 114 is an insulating film that can transmit oxygen. Note that the insulating film 114 also functions as a film that relieves damage to the oxide semiconductor film 108 at the time of forming the insulating film 116 in a later step.

For example, the insulating films 114 and 116 described in Embodiment 2 can be used as the insulating films 114 and 116 in this embodiment.

<<Oxide Semiconductor Film Functioning as Conductive Film and Oxide Semiconductor Film Functioning as Second Gate Electrode>>

The material of the oxide semiconductor film 108 described above can be used for the conductive film 120a functioning as a conductive film and the conductive film 120b functioning as the second gate electrode.

That is, the conductive film 120a functioning as a conductive film and the conductive film 120b functioning as a second gate electrode contain a metal element that is the same as that contained in the oxide semiconductor film 108 (the oxide semiconductor film 108b and the oxide semiconductor film 108c). For example, the conductive film 120b functioning as a second gate electrode and the oxide semiconductor film 108 (the oxide semiconductor film 108b and the oxide semiconductor film 108c) contain the same metal element; thus, the manufacturing cost can be reduced.

For example, in the case where an In-M-Zn oxide is used for each of the conductive film 120a functioning as a conductive film and the conductive film 120b functioning as a second gate electrode, the atomic ratio of metal elements in a sputtering target used to form the In-M-Zn oxide preferably satisfies In M. The atomic ratio of metal elements in such a sputtering target is In:M:Zn=2:1:3, In:M:Zn=3:1:2, In:M:Zn=4:2:4.1, or the like.

The conductive film 120a functioning as a conductive film and the conductive film 120b functioning as a second gate electrode can each have a single-layer structure or a stacked-layer structure of two or more layers. Note that in the case where the conductive film 120a and the conductive film 120b each have a stacked-layer structure, the composition of the sputtering target is not limited to that described above.

<<Insulating Film Functioning as Protective Insulating Film of Transistor>>

The insulating film 118 serves as a protective insulating film of the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one or both of hydrogen and nitrogen to the conductive film 120a functioning as a conductive film and the conductive film 120b functioning as a second gate electrode. The insulating film 118 preferably includes hydrogen and has a function of supplying the hydrogen to the conductive films 120a and 120b. The conductive films 120a and 120b supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films that are described above can be formed by a sputtering method or a PECVD method, such films may be formed by another method, e.g., a thermal chemical vapor deposition (CVD) method. Examples of the thermal CVD method include a metal organic chemical vapor deposition (MOCVD) method and an atomic layer deposition (ALD) method. Specifically, the methods described in Embodiment 3 can be used.

Note that this embodiment can be combined with any of the other embodiments in this specification as appropriate.

Embodiment 5

In this embodiment, a method for manufacturing a display panel of one embodiment of the present invention will be described with reference to FIG. 15, FIGS. 16A to 16C, FIGS. 17A to 17C, FIGS. 18A to 18C, FIGS. 19A to 19C, FIGS. 20A and 20B, FIGS. 21A and 21B, FIGS. 22A and 22B, and FIGS. 23A and 23B.

Figure 15:
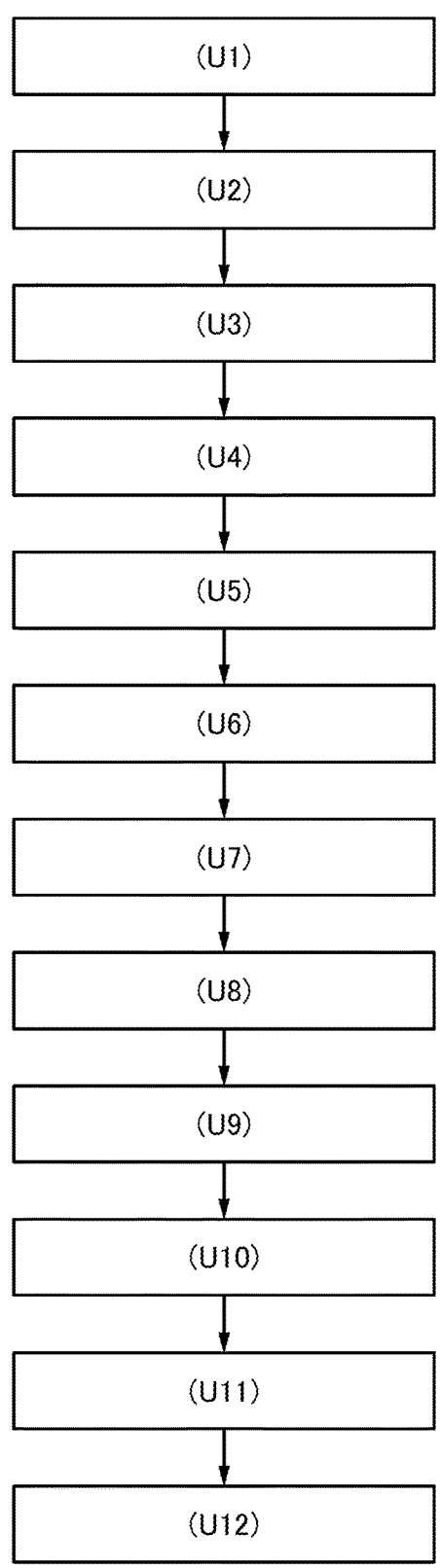
FIG. 15 is a flow chart showing a method for manufacturing a display panel of one embodiment.

FIG. 15 is a flow chart showing the method for manufacturing the display panel of one embodiment of the present invention.

Figure 18A:
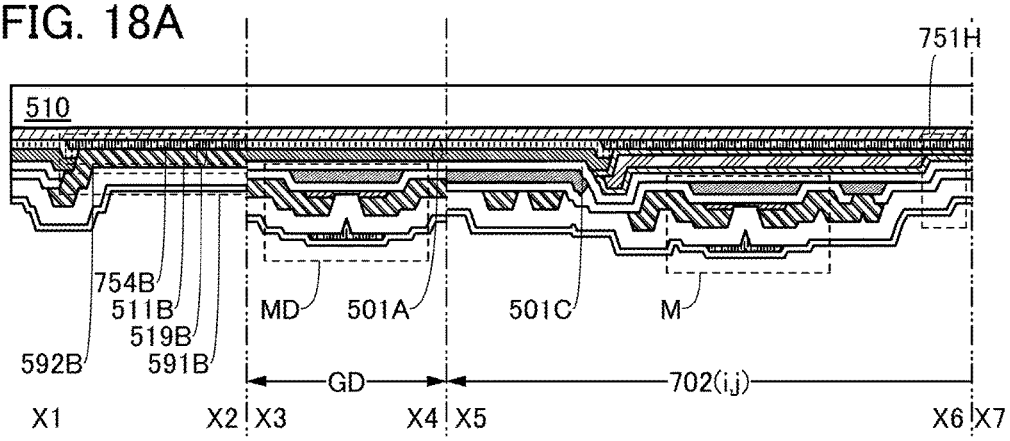
FIGS. 18A to 18C illustrate a method for manufacturing a display panel of one embodiment.
Figure 18B:
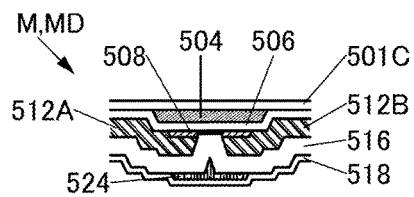

FIGS. 16A to 16C, FIGS. 17A to 17C, FIGS. 18A to 18C, FIGS. 19A to 19C, FIGS. 20A and 20B, FIGS. 21A and 21B, FIGS. 22A and 22B, and FIGS. 23A and 23B each illustrate the structure of the display panel of one embodiment of the present invention in a manufacturing process. FIGS. 16A to 16C, FIGS. 18A to 18C, FIGS. 20A and 20B, and FIGS. 22A and 22B are cross-sectional views taken along cutting plane lines X1-X2, X3-X4, and X5-X6 in FIG. 1A. FIGS. 17A to 17C, FIGS. 19A to 19C, FIGS. 21A and 21B, and FIGS. 23A and 23B are cross-sectional views taken along cutting plane lines X7-X8, X9-X10, and X11-X12 in FIG. 1A. Note that FIG. 18B illustrates part of FIG. 18A and FIG. 19B illustrates part of FIG. 19A.

<Method for Manufacturing Display Panel>

The method for manufacturing the display panel described in this embodiment includes the following 12 steps.

<<First Step>>

Figure 16A:
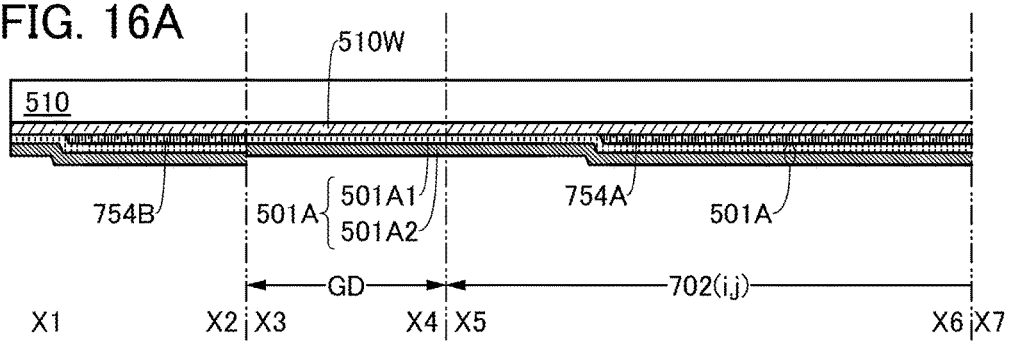
FIGS. 16A to 16C illustrate a method for manufacturing a display panel of one embodiment.

In a first step, the first intermediate film 754A and the second intermediate film 754B each of which includes a region overlapping with a process substrate are formed (see (U1) in FIG. 15, FIG. 16A, and FIG. 17A). Furthermore, the intermediate film 754C is formed.

A substrate 510 over which a separation film 510W is stacked can be used as the process substrate, for example. For the first intermediate film 754A, the second intermediate film 754B, and the intermediate film 754C, a material that can be separated from the substrate 510 in a later step is used. In that case, the intermediate films can be separated from the substrate 510 with the separation film 510W remain on the substrate 510 side. Alternatively, the separation film 510W can be separated from the substrate 510 together with the intermediate films.

For the separation film 510W, for example, an inorganic material, an organic resin, or the like can be used.

A single-layer material or a material in which a plurality of films are stacked can be used for the separation film 510W, for example.

Specifically, an inorganic material such as metal containing an element selected from tungsten, molybdenum, titanium, tantalum, niobium, nickel, cobalt, zirconium, zinc, ruthenium, rhodium, palladium, osmium, iridium, and silicon, an alloy containing any of the elements, or a compound containing any of the elements can be used for the separation film 510W.

A film containing tungsten, or a material in which a film containing tungsten and a film containing an oxide of tungsten are stacked can be used for the separation film 510W.

A film containing an oxide of tungsten can be formed using a method in which a film is stacked on a film containing tungsten. Specifically, a film containing silicon and oxygen is stacked on a film containing tungsten. For example, the film containing silicon and oxygen is formed using a gas containing nitrous oxide ($N_2O$).

A surface of a film containing tungsten can be subjected to any of a variety of treatments to form a film containing an oxide of tungsten. For example, thermal oxidation treatment, oxygen plasma treatment, nitrous oxide ($N_2O$) plasma treatment, treatment using a solution with high oxidizing power (e.g., ozone water), or the like is performed.

Specifically, a 30-nm-thick film containing tungsten having a surface subjected to plasma treatment in an atmosphere containing nitrous oxide ($N_2O$) can be used for the separation film 510W. Alternatively, a 30-nm-thick film containing tungsten having a surface subjected to plasma treatment in an atmosphere containing silane and nitrous oxide ($N_2O$) can be used for the separation film 510W.

An organic material such as polyimide, polyester, polyolefin, polyamide, polycarbonate, or an acrylic resin can be used for the separation film 510W. Specifically, a film containing polyimide can be used for the separation film 510W. A film containing polyimide has heat resistance of higher than or equal to 200° C., preferably higher than or equal to 250° C., further preferably higher than or equal to 300° C., and still further preferably higher than or equal to 350° C. can be used for the separation film 510W.

A material having heat resistance high enough to withstand heat treatment in the manufacturing process can be used for the substrate 510.

A large-sized glass substrate, for example, having any of the following sizes can be used as the substrate 510: the 6th generation (1500 mm×1850 mm), the 7$^{th}$ generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

An inorganic material such as glass, ceramic, or metal can be used for the substrate 510, for example.

Specifically, non-alkali glass, soda-lime glass, potash glass, crystal glass, quartz, sapphire, or the like can be used for the substrate 510. Specifically, an inorganic oxide film, an inorganic nitride film, an inorganic oxynitride film, or the like can be used for the substrate 510. For example, a silicon oxide film, a silicon nitride film, a silicon oxynitride film, an aluminum oxide film, or the like can be used for the substrate 510. For example, stainless steel or aluminum can be used for the substrate 510.

For the intermediate films, a material in which a film containing a conductive oxide or an oxide semiconductor and a film functioning as an etching stopper are stacked can be used. For example, a film containing indium, tin, and oxygen can be used for the film functioning as an etching stopper. Alternatively, a film containing indium, tin, silicon, and oxygen can be used for the film functioning as an etching stopper.

Specifically, a 50-nm-thick film containing indium, gallium, zinc, and oxygen can be used for the first intermediate film 754A.

The intermediate films can be formed by a sputtering method, for example. Specifically, a sputtering method using a material containing indium, gallium, and zinc at a ratio of 1:1:1 as a target can be employed. Alternatively, a sputtering method using a material containing indium, gallium, and zinc at a ratio of 4:2:3 as a target can be employed.

<<Second Step>>

In a second step, the insulating film 501A that covers the first intermediate film 754A and the second intermediate film 754B is formed (see (U2) in FIG. 15, FIG. 16A, and FIG. 17A). The insulating film 501A also covers the intermediate film 754C. Note that a material that can be separated from the substrate 510 in a later step can be used for the insulating film 501A.

The insulating film 501A can be formed by a chemical vapor deposition method using silane or the like as a source gas, for example.

Specifically, a material in which a film 501A1 and a film 501A2 are stacked in this order can be used for the insulating film 501A.

A film with a thickness greater than or equal to 200 nm and less than or equal to 600 nm can be used for the film 501A1, for example. A material containing silicon and oxygen or a material containing silicon, oxygen, and nitrogen can be used for the film 501A1.

A film with a thickness of approximately 200 nm can be used for the film 501A2, for example. A material containing silicon and nitrogen can be used for the film 501A2.

The insulating film 501A has a function of supplying hydrogen when heated in a later step. The film 501A2 has a function of preventing hydrogen passage. Hydrogen supplied by heating the insulating film 501A in a later step is diffused toward an interface between the insulating film 501A and the separation film 510W or an interface between the separation film 510W and the intermediate films.

<<Third Step>>

In a third step, the insulating film 501A is heated (see (U3) in FIG. 15). For example, the insulating film 501A is heated at 450° C. for one hour.

Accordingly, the insulating film 501A supplies hydrogen. The hydrogen reaches the separation film 510W or passes the intermediate films and then reaches the separation film 510W. Thus, a structure with which the intermediate films and the insulating film 501A can be separated from the substrate 510 in a later step is formed between the substrate 510 and the intermediate films 754 and between the insulating film 501A and the substrate 510.

<<Fourth Step>>

Figure 16B:
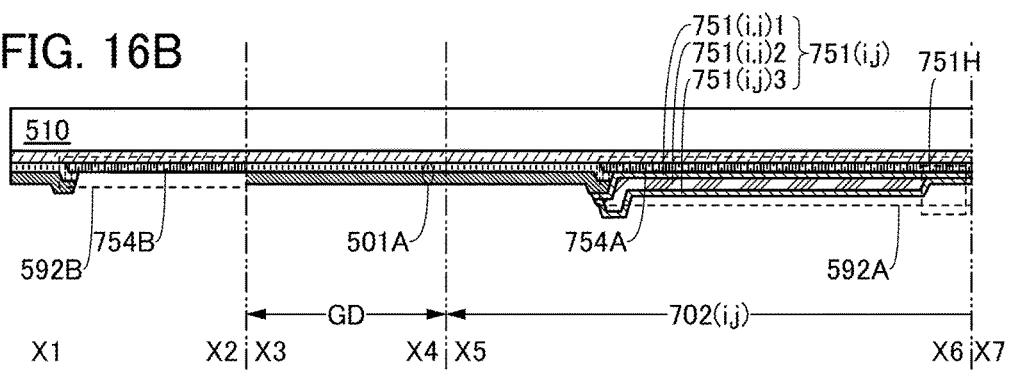

In a fourth step, the first opening 592A and the second opening 592B are formed in the insulating film 501A (see (U4) in FIG. 15, FIG. 16B, and FIG. 17B). Furthermore, the opening 592C is formed.

Processing into a predetermined shape can be performed by a photolithography method and an etching method, for example.

<<Fifth Step>>

In a fifth step, a first conductive film including a region overlapping with the first intermediate film 754A is formed (see (U5) in FIG. 15, FIG. 16B and FIG. 17B). Note that the first electrode 751(*i, j*) can be used for the first conductive film.

The first electrode 751(*i, j*) is processed into a predetermined shape by a photolithography method and an etching method, for example. Specifically, the opening 751H and a region that can reflect external light entering through the first electrode 751(*i, j*) are formed.

For the first electrode 751(*i, j*), a material in which a film 751(*i, j*)1 with conductivity functioning as an etching stopper, a film 751(*i, j*)2 that reflects light, and a film 751(*i, j*)3 with conductivity functioning as an etching stopper are stacked can be used, for example.

Specifically, a 20-nm-thick film containing indium, tin, and oxygen or a 20-nm-thick film containing indium, tin, silicon, and oxygen can be used for the film 751(*i, j*)1. A 100-nm-thick film containing silver can be used for the film 751(*i, j*)2. A 100-nm-thick film containing indium, tin, and oxygen or a 100-nm-thick film containing indium, tin, silicon, and oxygen can be used for the film 751(*i, j*)3. Thus, a reduction in the thickness of the first conductive film during processing of the insulating film 501C into a predetermined shape in a later step can be suppressed.

The first electrode 751(*i, j*) is formed such that, for example, a region in contact with the first intermediate film 754A has an area greater than or equal to 400 μm$^2$ and less than or equal to 1900 μm$^2$. Accordingly, a problem such as unintended separation, peeling, or lifting-off of the first electrode 751(*i, j*) from the process substrate in a later step can be prevented.

<<Sixth Step>>

Figure 16C:
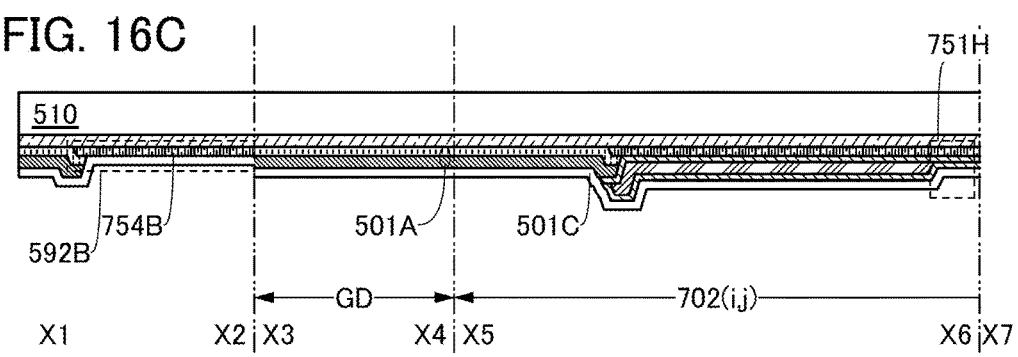

In a sixth step, the insulating film 501C is formed (see (U6) in FIG. 15 and FIG. 16C).

Specifically, an insulating material with a thickness of approximately 200 nm can be used for the insulating film 501C. For example, a material containing silicon and oxygen or a material containing silicon, oxygen, and nitrogen can be used for the insulating film 501C.

<<Seventh Step>>

Figure 19A:
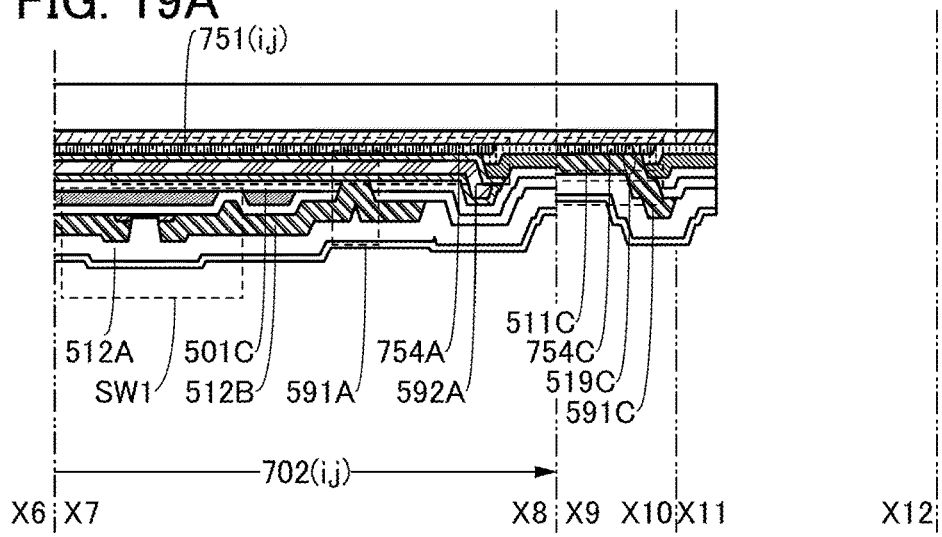
FIGS. 19A to 19C illustrate a method for manufacturing a display panel of one embodiment.

In a seventh step, the opening 591A is formed in the insulating film 501C in a region overlapping with the first insulating film, the opening 591B is formed in the insulating film 501C in a region overlapping with the second intermediate film 754B, and the second conductive film overlapping with the opening 591A, the third conductive film 511B, and the pixel circuit 530(i, j) are formed (see (U7) in FIG. 15, FIG. 18A, and FIG. 19A). Furthermore, the conductive film 511C is formed.

For the second conductive film, the conductive film 512B functioning as a source electrode or a drain electrode of a transistor that can be used for the switch SW1 can be used, for example. Alternatively, a conductive film that can be formed in the same step as the conductive film 512B can be used as the conductive film 511B or the conductive film 511C.

Figure 18C:
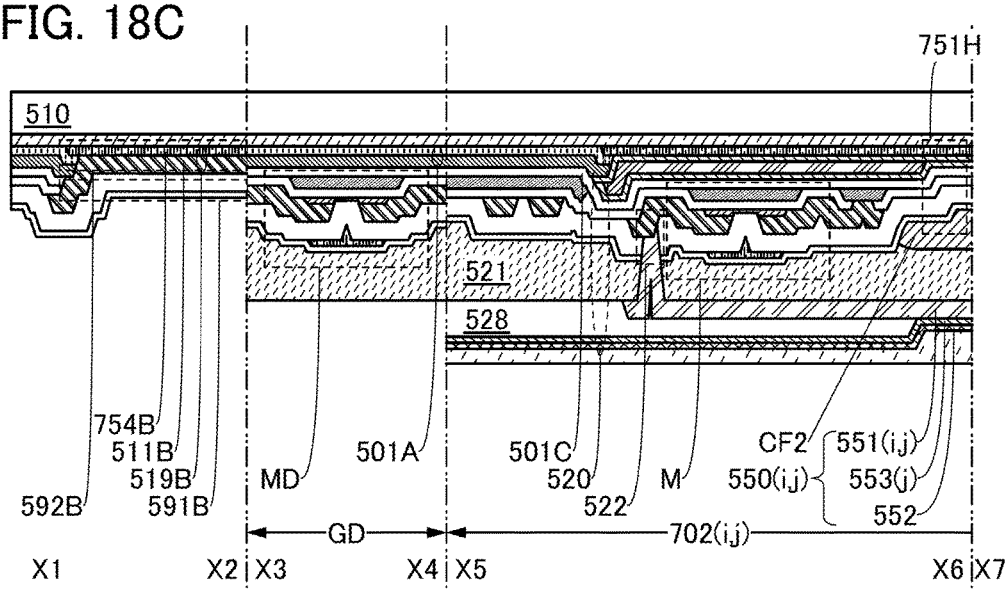
Figure 19B:
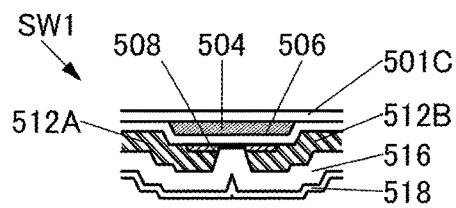
Figure 19C:
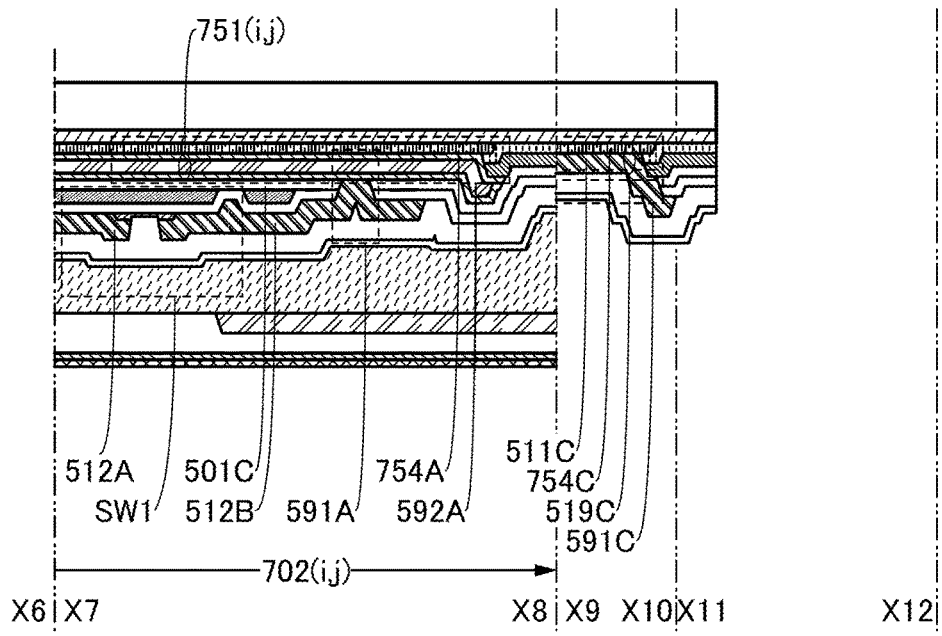

In the formation of the pixel circuit 530(i, j), for example, the opening 591A, the opening 591B, and the opening 591C are formed in the insulating film 501C (see FIG. 18C and FIG. 19C). Specifically, a photolithography method and an etching method are employed.

Next, the conductive film 512B is formed in a region overlapping with the opening 591A, the conductive film 511B is formed in a region overlapping with the opening 591B, and the conductive film 511C is formed in a region overlapping with the opening 591C. Accordingly, the second conductive film is electrically connected to the first conductive film in the opening 591A. Note that a material in which the film 751(i, j)1 with conductivity and the film 751(i, j)3 are stacked can be provided between the conductive film 511B and the second intermediate film 754B. Furthermore, a material in which the film 751(i, j)1 with conductivity and the film 751(i, j)3 are stacked can be provided between the conductive film 511C and the intermediate film 754C.

In the formation of the pixel circuit 530(i, j), for example, the first electrode 751(i, j) and the conductive film 512B can be electrically connected to each other through a conductive film that can be formed in the same step as the conductive film 504.

In the case where the area of a region where the second intermediate film 754B is in contact with the third conductive film 511B is greater than or equal to 0.02 mm², for example, a conductive film that can be formed in the same step as or a later step than the conductive film functioning as the source electrode or the drain electrode of the transistor that can be used for the switch SW1 can be used for the third conductive film 511B. In that case, a problem such as unintended separation, peeling, or lifting-off of the third conductive film 511B from the process substrate, which is caused by heat treatment or the like performed in the formation of the transistor that can be used for the switch SW1, can be prevented.

<<Eighth Step>>

In an eighth step, the second display element 550(i, j) electrically connected to the pixel circuit 530(i, j) is formed (see (U8) in FIG. 15, FIG. 18C, and FIG. 19C).

<<Ninth Step>>

Figure 20A:
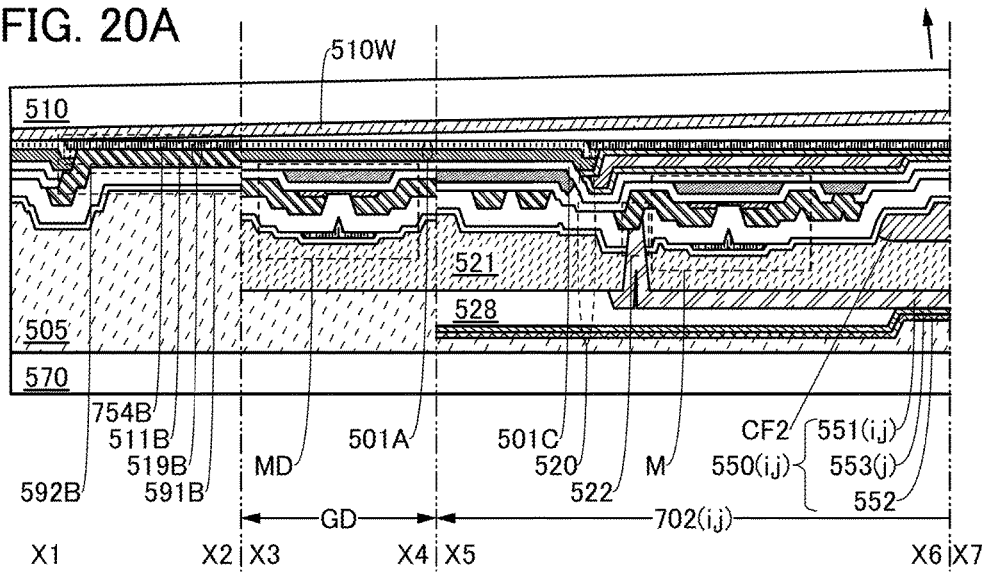
FIGS. 20A and 20B illustrate a method for manufacturing a display panel of one embodiment.
Figure 21A:
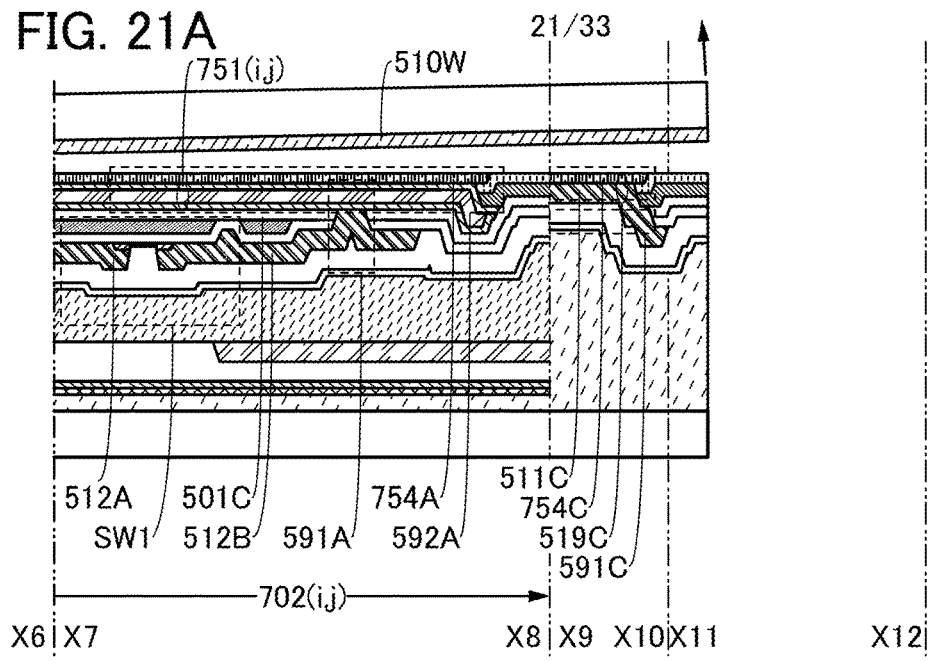
FIGS. 21A and 21B illustrate a method for manufacturing a display panel of one embodiment.

In a ninth step, the second substrate 570 is stacked such that the second display element 550(i, j) is positioned between the process substrate and the second substrate 570 (see (U9) in FIG. 15, FIG. 20A, and FIG. 21A).

The bonding layer 505 is formed by a printing method, a coating method, or the like, and the second substrate 570 is bonded to the functional layer 520 using the bonding layer 505, for example.

<<Tenth Step>>

Figure 20B:
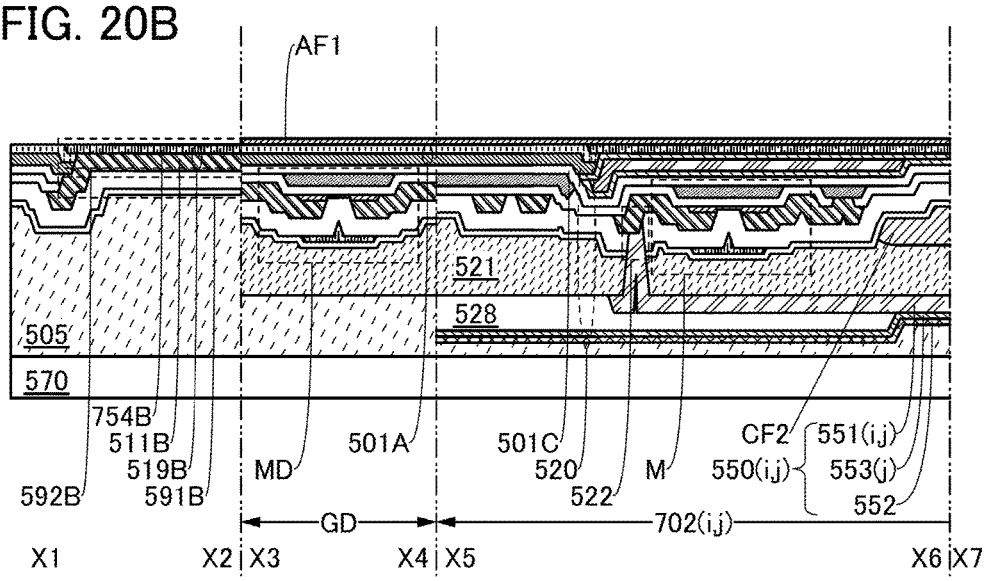
Figure 21B:
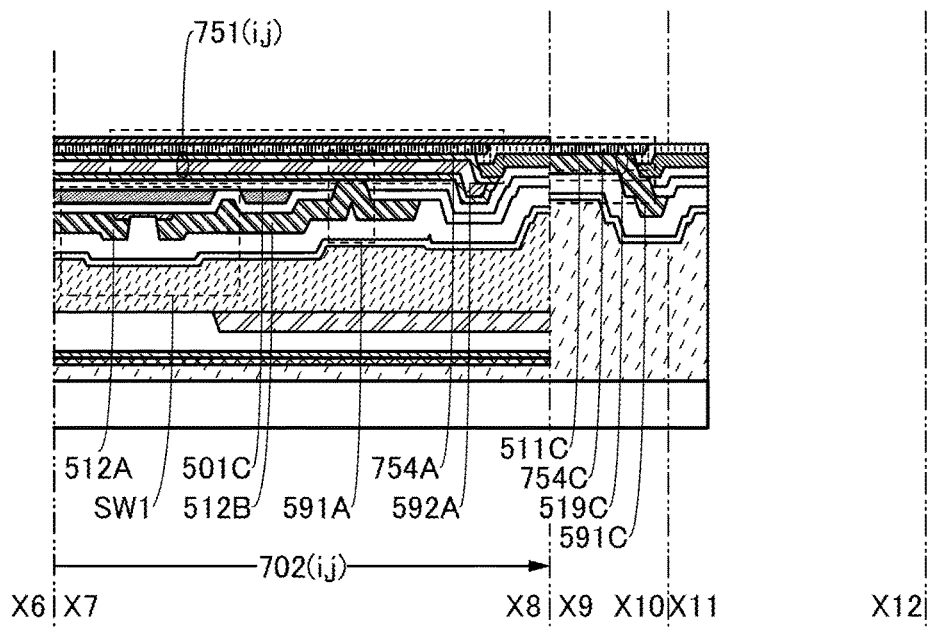
Figure 22A:
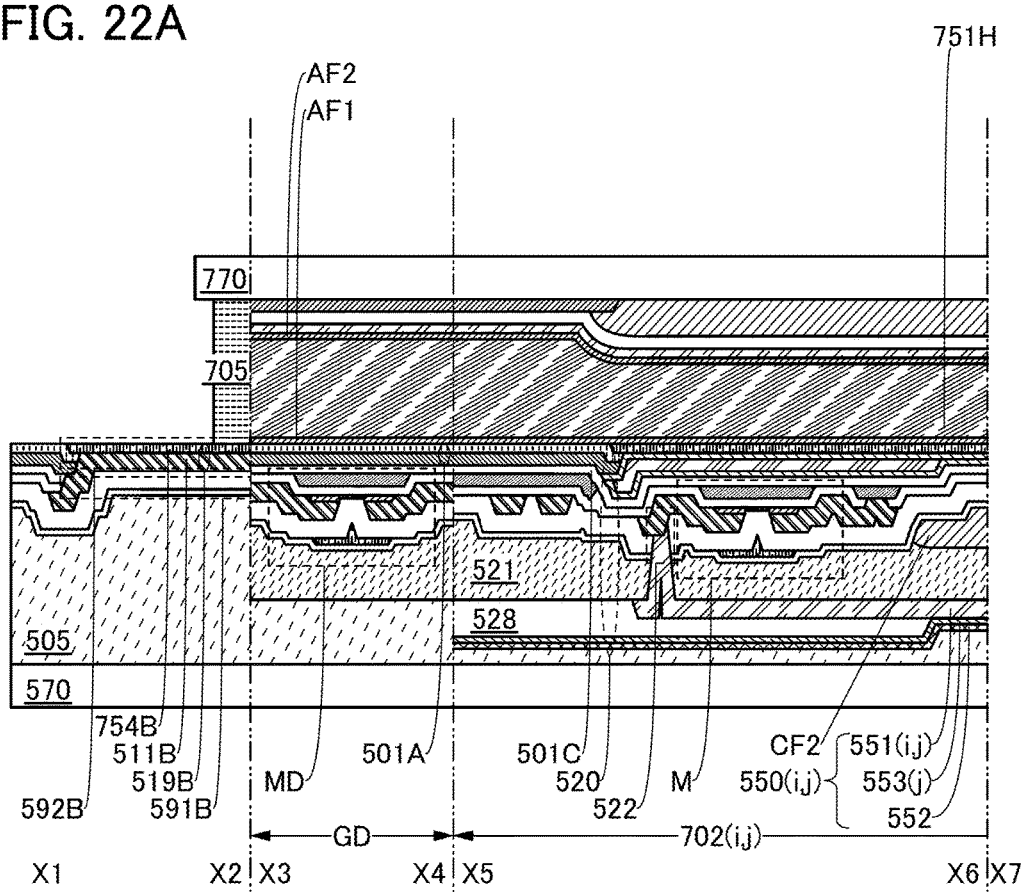
FIGS. 22A and 22B illustrate a method for manufacturing a display panel of one embodiment.
Figure 22B:
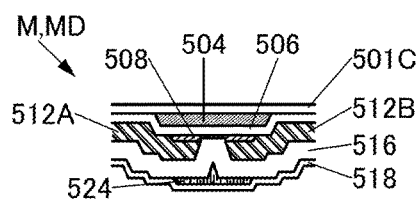
Figure 23A:
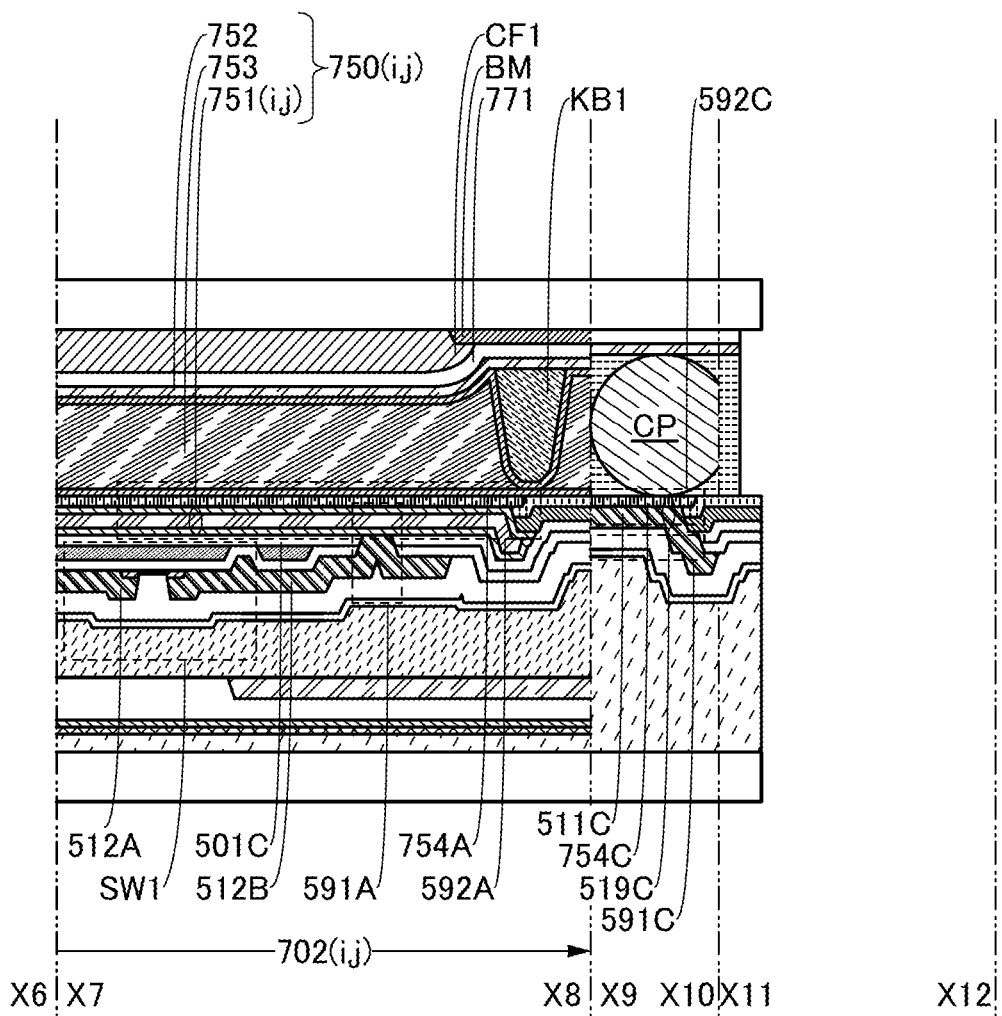
FIGS. 23A and 23B illustrate a method for manufacturing a display panel of one embodiment.
Figure 23B:
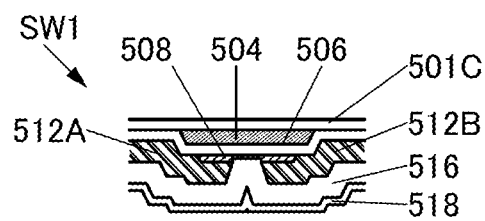

In a tenth step, separation from the process substrate is performed (see (U10) in FIG. 15, FIG. 20B, and FIG. 21B).

For example, the insulating film 501A and the intermediate films are separated from the separation film 510W. Specifically, a separation trigger where part of the insulating film 501A is separated from the process substrate is formed. Subsequently, a region in which the process substrate is separated from the insulating film 501A or the intermediate films 754 is gradually extended from the separation trigger; as a result, the insulating film 501A and the intermediate films 754 are separated from the process substrate.

The separation trigger can be formed by, for example, a method using a laser (specifically, a laser ablation method) or a method using a cutter with a sharp tip. Alternatively, the insulating film 501A is separated from the process substrate while a liquid is injected between the separation film 510W and the insulating film 501A, for example. Specifically, the insulating film 501A is separated while a liquid containing water is injected. Accordingly, the stress applied to the insulating film 501A at the time of the separation can be reduced, and the breakdown of the insulating film 501A in the process can be prevented.

Note that in the separation of the intermediate films from the separation film 510W, part of the separation film 510W in contact with the intermediate films might be separated from the other part and might remain on the intermediate films. In that case, part of the separation film 510W remaining on the intermediate films can be removed by an etching method. Accordingly, the intermediate films can be exposed.

<<Eleventh Step>>

In an eleventh step, the alignment film AF1 is formed such that the first intermediate film 754A is positioned between the first conductive film and the alignment film AF1 (see (U11) in FIG. 15, FIG. 20B, and FIG. 21B).

The alignment film AF1 can be formed by a printing method, for example. Note that a film containing soluble polyimide formed by a printing method can be used for the alignment film AF1. Temperature required for forming the alignment film AF1 can be lower in a method using soluble polyimide than in a method using a precursor of polyimide such as a polyamic acid. Accordingly, damage to the second display element 550(i, j) due to heating can be reduced. As a result, a method for manufacturing a novel display panel that is highly convenient or highly reliable can be provided.

<<Twelfth Step>>

In a twelfth step, the substrate 770 is stacked such that the alignment film AF1 is positioned between the first conductive film and the substrate 770 (see (U12) in FIG. 15, FIGS. 22A and 22B, and FIGS. 23A and 23B).

The method for manufacturing a display panel of one embodiment of the present invention includes the step of forming the first intermediate film and the second intermediate film, the step of forming the second insulating film that covers the first intermediate film and the second intermediate film, and the step of separation from the process substrate. Accordingly, a region where the first intermediate film is not covered with the second insulating film and a region where the second intermediate film is not covered with the second insulating film can be formed. As a result, a method for manufacturing a novel display panel that is highly convenient or highly reliable can be provided.

The method for manufacturing the display panel of one embodiment of the present invention further includes the step of forming the first conductive film, the step of forming the first insulating film that includes the region overlapping with the first conductive film and the opening overlapping with the first conductive film, the step of forming the pixel circuit electrically connected to the first conductive film such that the first insulating film is positioned between the pixel circuit and the first conductive film, the step of forming the second display element electrically connected to the pixel circuit, and the step of forming the first display element electrically connected to the first conductive film. This method allows the display panel to be manufactured through the steps performed in the following descending order of the degree of difficulty required for the steps: the step for forming the pixel circuit that requires the highest temperature; the step for forming the second display element that requires a high degree of vacuum; and the step for forming the first display element that does not require a high temperature or a high degree of vacuum. Thus, a method for manufacturing a novel display panel that is highly convenient or highly reliable can be provided.

Note that this embodiment can be combined with any of the other embodiments in this specification as appropriate.

Embodiment 6

In this embodiment, the structure of a data processor of one embodiment of the present invention will be described with reference to FIGS. 24A to 24C, FIGS. 25A to 25C, and FIGS. 26A and 26B.

Figure 24A:
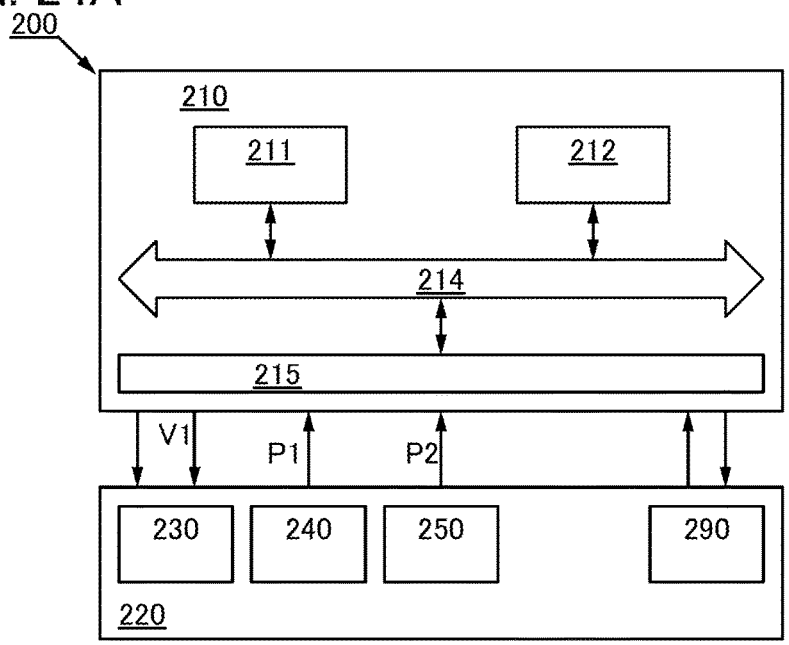
FIGS. 24A to 24C are a block diagram and projection views each illustrating the structure of a data processor of one embodiment.
Figure 24B:
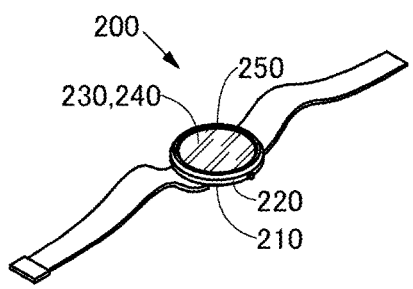
Figure 24C:
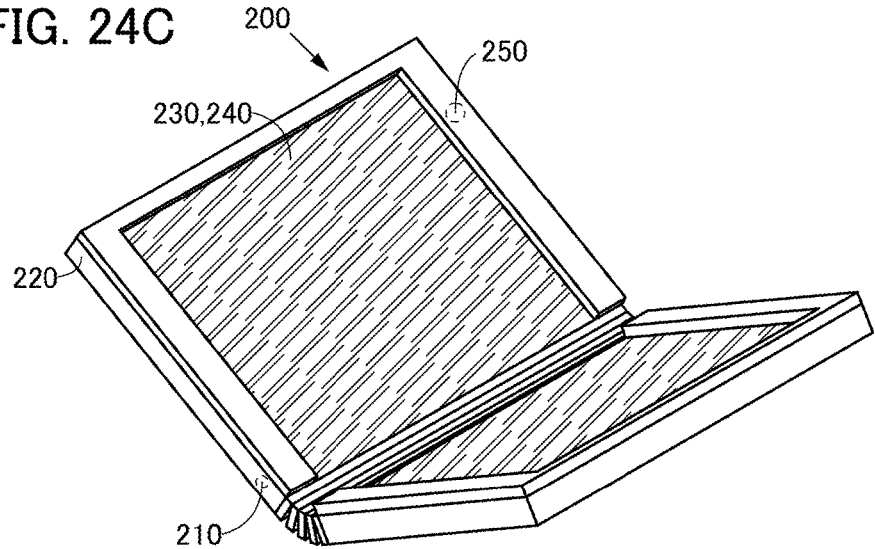

FIG. 24A is a block diagram illustrating the structure of a data processor 200. FIGS. 24B and 24C are projection views illustrating examples of external views of the data processor 200.

Figure 25A:
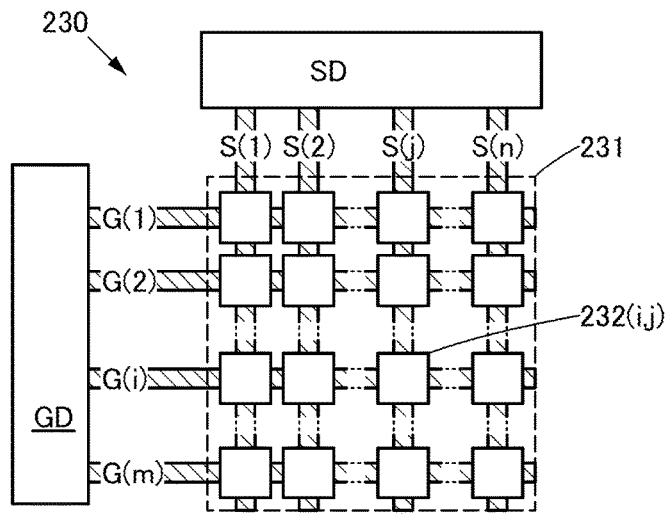
FIGS. 25A to 25C are block diagrams and a circuit diagram each illustrating the structure of a display portion of one embodiment.
Figure 25B:
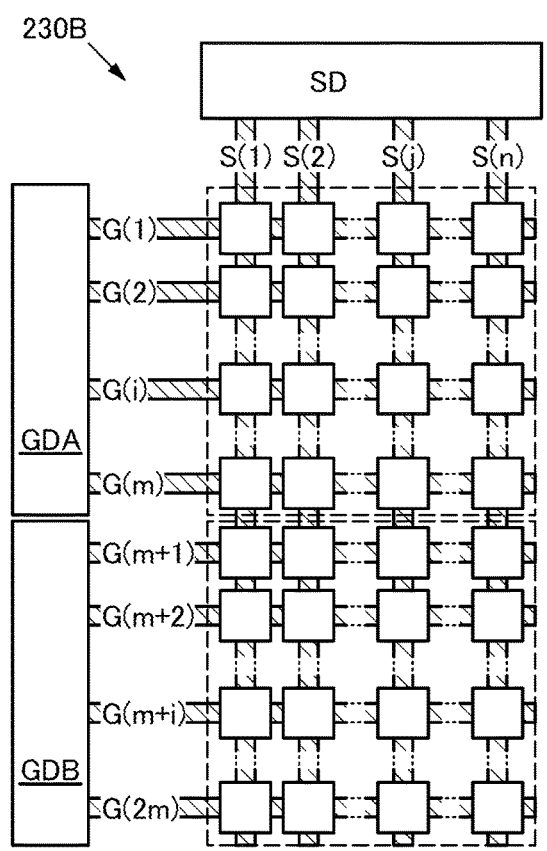
Figure 25C:
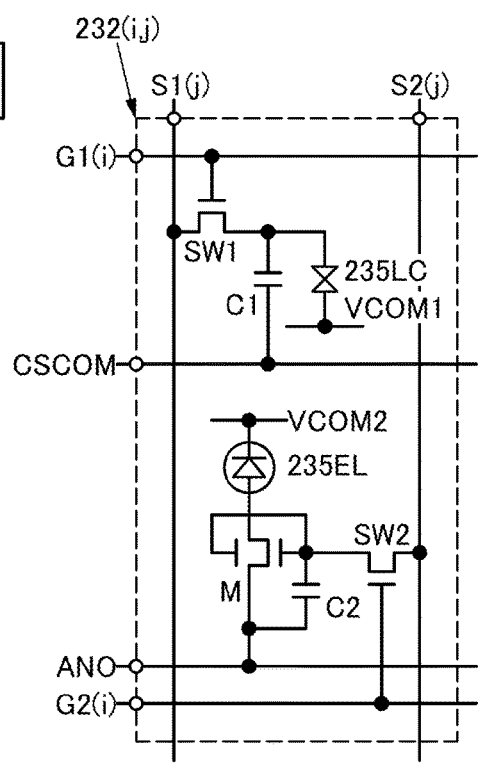

FIG. 25A is a block diagram illustrating a configuration of a display portion 230. FIG. 25B is a block diagram illustrating a configuration of a display portion 230B. FIG. 25C is a circuit diagram illustrating a configuration of a pixel 232($i, j$).

<Example of Structure of Data Processor>

The data processor 200 described in this embodiment includes an input/output device 220 and an arithmetic device 210 (see FIG. 24A).

The input/output device 220 is configured to supply positional data P1 and pressure data and to receive image data V1 and control data. For example, a crown that can be pushed in a housing, a pressure sensor in contact with the crown or the like, or the like can be used.

The arithmetic device 210 is configured to receive the positional data P1 and the pressure data and to supply the image data V1 and the control data.

The arithmetic device 210 is configured to generate the image data V1 and the control data in accordance with the pressure data.

The input/output device 220 includes the display portion 230 that displays the image data V1, an input portion 240 that supplies the positional data P1, and a sensor portion 250 that supplies the pressure data.

The display portion 230 has a display panel. The sensor portion 250 includes a pressure sensor and is configured to generate the pressure data in accordance with a signal from the pressure sensor.

The arithmetic device 210 includes an arithmetic portion 211 and a memory portion 212.

The memory portion 212 stores a program executed by the arithmetic portion 211.

The program includes the step of selecting a first mode when pressure data exceeding a predetermined threshold is supplied and the step of selecting a second mode when pressure data exceeding a predetermined threshold is not supplied for more than a predetermined period.

The arithmetic portion 211 is configured to supply a control signal in the first mode that is different from a control signal supplied in the second mode.

The control signal includes a signal for refreshing display of the display panel.

The arithmetic device 210 is configured to supply the control signal in the second mode so that the frequency of refreshing the display of the display panel is lower than that in the first mode.

The above-described data processor of one embodiment of the present invention includes the input/output device that supplies pressure data and the arithmetic device that supplies control data that varies in accordance with the pressure data.

With such a structure, the mode of the data processor can be switched with the push, for example. Thus, a novel data processor that is highly convenient or reliable can be provided.

<Structure>

The data processor of one embodiment of the present invention includes the arithmetic device 210 or the input/output device 220.

<<Arithmetic Device 210>>

The arithmetic device 210 includes the arithmetic portion 211, the memory portion 212, a transmission path 214, and an input/output interface 215 (see FIG. 24A).

<<Arithmetic Portion 211>>

The arithmetic portion 211 is configured to execute a program, for example. A CPU described in Embodiment 7 can be used, for example. In that case, power consumption can be sufficiently reduced.

<<Memory Portion 212>>

The memory portion 212 is configured to, for example, store the program executed by the arithmetic portion 211, initial data, setting data, an image, or the like.

Specifically, a hard disk, a flash memory, a memory including a transistor including an oxide semiconductor, or the like can be used.

<<Input/Output Interface 215, Transmission Path 214>>

The input/output interface 215 includes a terminal or a wiring and is configured to supply and receive data. For example, the input/output interface 215 can be electrically connected to the transmission path 214 and the input/output device 220.

The transmission path 214 includes a wiring and is configured to supply and receive data. For example, the transmission path 214 can be electrically connected to the input/output interface 215. In addition, the transmission path 214 can be electrically connected to the arithmetic portion 211, the memory portion 212, or the input/output interface 215.

<<Input/Output Device 220>>

The input/output device 220 includes the display portion 230, the input portion 240, the sensor portion 250, or a communication portion 290. For example, the input/output device described in Embodiment 2 can be used. Accordingly, power consumption can be reduced.

<<Display Portion 230>>

The display portion 230 includes a display region 231, the driver circuit GD, and the driver circuit SD (see FIG. 25A).

A display region 231 includes pixels 232($i$, 1) to 232 ($i, n$) arranged in a row direction, pixels 232(1, $j$) to 232 ($m, j$) arranged in a column direction, a scan line G1($i$) and a scan line G2($i$) which are electrically connected to the pixels 232($i$, 1) to 232($i, n$), and the signal line S1($j$) and the signal line S2($j$) which are electrically connected to the pixels 232(1, $j$) to 232 ($m, j$). Note that i is an integer greater than or equal to 1 and less than or equal to m, j is an integer greater than or equal to 1 and less than or equal to n, and each of m and n is an integer greater than or equal to 1.

Note that the pixel 232($i, j$) is electrically connected to the scan line G1($i$), the scan line G2($i$), the signal lines S1($j$) and S2(*j*), the wiring ANO, the wiring CSCOM, the wiring VCOM1, and the wiring VCOM2 (see FIG. 25C).

The display portion can include a plurality of driver circuits. For example, the display portion 230B can include a driver circuit GDA and a driver circuit GDB (see FIG. 25B).

<<Driver Circuit GD>>

The driver circuit GD is configured to supply a selection signal in accordance with the control data.

For example, the driver circuit GD is configured to supply a selection signal to one scan line at a frequency of 30 Hz or higher, preferably 60 Hz or higher, in accordance with the control data. Accordingly, moving images can be smoothly displayed.

For example, the driver circuit GD is configured to supply a selection signal to one scan line at a frequency of lower than 30 Hz, preferably lower than 1 Hz, further preferably less than once per minute, in accordance with the control data. Accordingly, a still image can be displayed while flickering is suppressed.

For example, in the case where a plurality of driver circuits is provided, the driver circuits GDA and GDB may supply the selection signals at different frequencies. Specifically, the selection signal can be supplied at a higher frequency to a region on which moving images are smoothly displayed than to a region on which a still image is displayed in a state where flickering is suppressed.

<<Driver Circuit SD>>

The driver circuit SD is configured to supply an image signal in accordance with the image data V1.

<<Pixel 232(*i, j*)>>

The pixel 232(*i, j*) includes a first display element 235LC and a second display element 235EL overlapping with the first display element 235LC. The pixel 232(*i, j*) further includes a pixel circuit for driving the first display element 235LC and a pixel circuit for driving the second display element 235EL (see FIG. 25C).

<<First Display Element 235LC>>

As the first display element 235LC, for example, a display element having a function of controlling transmission or reflection of light can be used. For example, a combined structure of a polarizing plate and a liquid crystal element or a MEMS shutter display element can be used. The use of a reflective display element can reduce power consumption of a display panel. Specifically, a reflective liquid crystal display element can be used as the first display element 235LC.

The first display element 235LC includes a first electrode, a second electrode, and a liquid crystal layer. The liquid crystal layer contains a liquid crystal material whose orientation is controlled by voltage applied between the first electrode and the second electrode. For example, the orientation of the liquid crystal material can be controlled by an electric field in the thickness direction of the liquid crystal layer (also referred to as the vertical direction) or an electric field in the direction intersecting the vertical direction (also referred to as the horizontal direction or the diagonal direction).

<<Second Display Element 235EL>>

A display element having a function of emitting light can be used as the second display element 235EL, for example. Specifically, an organic EL element can be used.

More specifically, an organic EL element that emits white light can be used as the second display element 235EL. Alternatively, an organic EL element that emits blue light, green light, or red light can be used as the second display element 235EL.

<<Pixel Circuit>>

A pixel circuit including a circuit that is configured to drive the first display element 235LC or the second display element 235EL can be used.

A switch, a transistor, a diode, a resistor, an inductor, a capacitor, or the like can be used in the pixel circuit.

For example, one or a plurality of transistors can be used for a switch. Alternatively, a plurality of transistors connected in parallel, in series, or in combination of parallel connection and series connection can be used for a switch.

<<Transistor>>

For transistors in the driver circuit and the pixel circuit, semiconductor films formed at the same step can be used, for example.

For example, bottom-gate transistors, top-gate transistors, or the like can be used.

A manufacturing line for a bottom-gate transistor including amorphous silicon as a semiconductor can be easily remodeled into a manufacturing line for a bottom-gate transistor including an oxide semiconductor as a semiconductor, for example. Furthermore, for example, a manufacturing line for a top-gate transistor including polysilicon as a semiconductor can be easily remodeled into a manufacturing line for a top-gate transistor including an oxide semiconductor as a semiconductor.

For example, a transistor including a semiconductor containing an element of Group 14 can be used. Specifically, a semiconductor containing silicon can be used for a semiconductor film. For example, single crystal silicon, polysilicon, microcrystalline silicon, amorphous silicon, or the like can be used for the semiconductor film of the transistor.

Note that the temperature for forming a transistor using polysilicon in a semiconductor is lower than the temperature for forming a transistor using single crystal silicon in a semiconductor.

In addition, the transistor using polysilicon in a semiconductor has higher field-effect mobility than that of the transistor using amorphous silicon in a semiconductor, and therefore a pixel including the transistor using polysilicon can have a high aperture ratio. Moreover, pixels arranged at high resolution, a gate driver circuit, and a source driver circuit can be formed over the same substrate. As a result, the number of components included in an electronic device can be reduced.

In addition, the transistor using polysilicon in a semiconductor has higher reliability than that of the transistor using amorphous silicon in a semiconductor.

For example, a transistor including an oxide semiconductor can be used. Specifically, an oxide semiconductor containing indium or an oxide semiconductor containing indium, gallium, and zinc can be used for a semiconductor film.

For example, a transistor having lower leakage current in an off state than a transistor that uses amorphous silicon for a semiconductor film can be used. Specifically, a transistor that uses an oxide semiconductor for a semiconductor film can be used.

In that case, the pixel circuit can hold an image signal for a longer time than a pixel circuit including the transistor that uses amorphous silicon for the semiconductor film. Specifically, the selection signal can be supplied at a frequency of lower than 30 Hz, preferably lower than 1 Hz, further preferably less than once per minute while flickering is suppressed. Consequently, eyestrain on a user of the data processor can be reduced, and power consumption for driving can be reduced.

Alternatively, for example, a transistor including a compound semiconductor can be used. Specifically, a semiconductor containing gallium arsenide can be used for a semiconductor film.

For example, a transistor including an organic semiconductor can be used. Specifically, an organic semiconductor containing any of polyacenes and graphene can be used for the semiconductor film.

<<Input Portion 240>>

Any of a variety of human interfaces or the like can be used as the input portion 240 (see FIG. 24A).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes data on the position, track, or the like of the finger on the touch panel and determines that a specific gesture is supplied when the analysis results meet predetermined conditions. Therefore, the user can supply a predetermined operation instruction associated with a predetermined gesture by using the gesture.

For instance, the user can supply a "scrolling instruction" for changing a portion where image data is displayed by using a gesture of touching and moving his/her finger on the touch panel.

<<Sensor Portion 250>>

The sensor portion 250 is configured to supply data P2, such as pressure data, by sensing its surroundings.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

For example, when the arithmetic device 210 determines that the ambient light level measured by an illuminance sensor of the sensor portion 250 is sufficiently higher than the predetermined illuminance, image data is displayed using the first display element 235LC. When the arithmetic device 210 determines that it is dim, image data is displayed using the first display element 235LC and the second display element 235EL. When the arithmetic device 210 determines that it is dark, image data is displayed using the second display element 235EL.

Specifically, an image is displayed with a reflective liquid crystal element and/or an organic EL element depending on the ambient brightness.

Thus, image data can be displayed in such a manner that, for example, a reflective display element is used under strong ambient light, a reflective display element and a self-luminous display element are used in dim light, and a self-luminous display element is used in dark light. As a result, a novel data processor that has low power consumption and is highly convenient or reliable can be provided.

For example, a sensor measuring chromaticity of ambient light, such as a CCD camera, can be used in the sensor portion 250. Owing to this, white balance can be adjusted in accordance with the chromaticity of ambient light sensed by the sensor portion 250.

Specifically, in the first step, imbalance disruption of white balance of ambient light is measured.

In the second step, the intensity of light of a color that is insufficient in an image to be displayed by the first display element using reflection of ambient light is estimated.

In the third step, ambient light is reflected by the first display element, and light is emitted from the second display element so that light of the insufficient color is supplemented, whereby the image is displayed.

In this manner, display can be performed with adjusted white balance by utilizing light reflected by the first display element and light emitted from the second display element. Thus, a novel data processor that can perform display with low power consumption or with adjusted white balance and that is highly convenient and reliable can be provided.

<<Communication Portion 290>>

The communication portion 290 is configured to supply and acquire data to/from a network.

<Program>

A program of one embodiment of the present invention will be described with reference to FIGS. 26A and 26B.

Figure 26A:
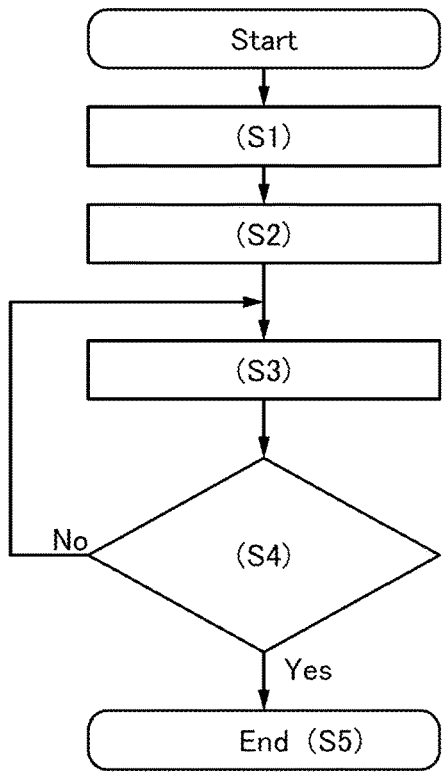
FIGS. 26A and 26B are flow charts each showing a program of one embodiment.
Figure 26B:
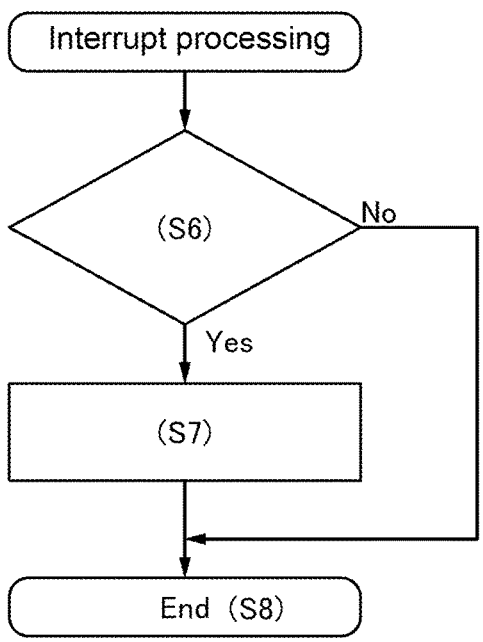

FIG. 26A is a flow chart showing main processing of the program of one embodiment of the present invention, and FIG. 26B is a flow chart showing interrupt processing.

The program of one embodiment of the present invention includes the following steps (see FIG. 26A).

<<First Step>>

In the first step, setting is initialized (see (S1) in FIG. 26A).

For example, predetermined image data that is to be displayed on starting and data for specifying a method of displaying the image data are acquired from the memory portion 212. Specifically, a still image can be used as the predetermined image data. A method of refreshing image data at a frequency lower than that in the case of using a moving image can be used as the method of displaying image data. For example, the second mode can be used as the method of displaying image data.

<<Second Step>>

In the second step, interrupt processing is permitted (see (S2) in FIG. 26A). Note that an arithmetic device allowed to execute the interrupt processing can perform the interrupt processing in parallel with the main processing. The arithmetic device that has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is ready to be executed after the program is started up.

<<Third Step>>

In the third step, image data is displayed in a mode selected in the first step or the interrupt processing (see (S3) in FIG. 26A). Note that the method of displaying image data is specified by a mode.

For example, the first mode or the second mode can be selected.

<<First Mode>>

Specifically, a method of supplying selection signals to a scan line at a frequency of 30 Hz or more, preferably 60 Hz or more, and performing display in accordance with the selection signals can be used in the first mode.

The supply of selection signals at a frequency of 30 Hz or more, preferably 60 Hz or more, can display a smooth moving image.

For example, an image is refreshed at a frequency of 30 Hz or more and preferably 60 Hz or more, so that an image smoothly following the user's operation can be displayed on the data processor 200 the user operates.

<<Second Mode>>

Specifically, a method of supplying selection signals to a scan line at a frequency of less than 30 Hz, preferably less than 1 Hz, further preferably once a minute and performing display in accordance with the selection signals can be used in the second mode.

The supply of selection signals at a frequency of less than 30 Hz, preferably less than 1 Hz, further preferably once a minute, can perform display with flickers reduced. Furthermore, power consumption can be reduced.

For example, when a light-emitting element is used as the second display element, the light-emitting element can be configured to emit light in a pulsed manner so as to display image data. Specifically, an organic EL element can be configured to emit light in a pulsed manner, and its afterglow can be used for display. The organic EL element has excellent frequency characteristics; thus, time for driving the light-emitting element can be shortened, and thus power consumption can be reduced in some cases. Alternatively, heat generation can be inhibited, and thus the deterioration of the light-emitting element can be suppressed in some cases.

For example, when the data processor 200 is used for a clock or watch, the display can be refreshed at a frequency of once a second or once a minute.

<<Fourth Step>>

In the fourth step, the program moves to the fifth step when a termination instruction is supplied, and the program moves to the third step when the termination instruction is not supplied (see (S4) in FIG. 26A).

For example, the termination instruction supplied in the interrupt processing can be used.

<<Fifth Step>>

In the fifth step, the program terminates (see (S5) in FIG. 26A).

<<Interrupt Processing>>

The interrupt processing includes sixth to eighth steps described below (see FIG. 26B).

<<Sixth Step>>

In the sixth step, the processing proceeds to the seventh step when a predetermined event has been supplied, whereas the processing proceeds to the eighth step when the predetermined event has not been supplied (see (S6) in FIG. 26B). For example, whether the predetermined event is supplied in a predetermined period or not can be a branch condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

<<Seventh Step>>

In the seventh step, the mode is changed (see (S7) in FIG. 26B). Specifically, the mode is changed to the second mode when the first mode has been selected, or the mode is changed to the first mode when the second mode has been selected.

<<Eighth Step>>

In the eighth step, the interrupt processing terminates (see (S8) in FIG. 26B).

<<Predetermined Event>>

The following events can be used, for example: events supplied using a pointing device such as a mouse (e.g., "click" and "drag") and events supplied to a touch panel with a finger or the like used as a pointer (e.g., "tap," "drag," or "swipe").

For example, the position of a slide bar pointed by a pointer, the swipe speed, and the drag speed can be used as parameters assigned to an instruction associated with the predetermined event.

Data sensed by the sensor portion 250 can be compared to the set threshold, and the compared results can be used for the event, for example.

Specifically, for example, a crown that can be pushed in a housing or a pressure sensor in contact with the crown or the like can be used for the sensor portion 250 (see FIG. 24B).

For example, a photoelectric conversion element provided in a housing can be used in the sensor portion 250 (see FIG. 24C).

<<Instruction Associated with Predetermined Event>>

The termination instruction can be associated with a predetermined event, for example.

For example, "page-turning instruction" for switching displayed image data from one to another can be associated with a predetermined event. Note that a parameter for determining the page-turning speed or the like when the "page-turning instruction" is executed can be supplied using the predetermined event.

For example, "scroll instruction" for moving the display position of part of image data and displaying another part continuing from that part can be associated with a predetermined event. Note that a parameter for determining the moving speed of the display position or the like when the "scroll instruction" is executed can be supplied using the predetermined event.

For example, an instruction for generating image data can be associated with a predetermined event. Note that the ambient luminance sensed by the sensor portion 250 may be used for a parameter for determining the brightness of a generated image.

For example, an instruction or the like for acquiring data distributed via a push service using the communication portion 290 can be associated with a predetermined event. Note that positional data sensed by the sensor portion 250 may be used for the determination of the presence or absence of a qualification for acquiring data. Specifically, the determination of the presence of a qualification for acquiring data may be taken when the user is in a predetermined class room, school, conference room, office, or building. For example, educational materials can be fed from a classroom of a school, a university, or the like and displayed, so that the data processor 200 can be used as a schoolbook or the like (see FIG. 24C). Alternatively, materials distributed from a conference room in, for example, a company can be received and displayed.

Note that this embodiment can be combined with any of the other embodiments in this specification as appropriate.

Embodiment 7

In this embodiment, a semiconductor device (memory device) that can retain stored data even when not powered and that has an unlimited number of write cycles, and a CPU including the semiconductor device will be described. The CPU described in this embodiment can be used for the data processor described in Embodiment 6, for example.

<Memory Device>

Figure 27A:
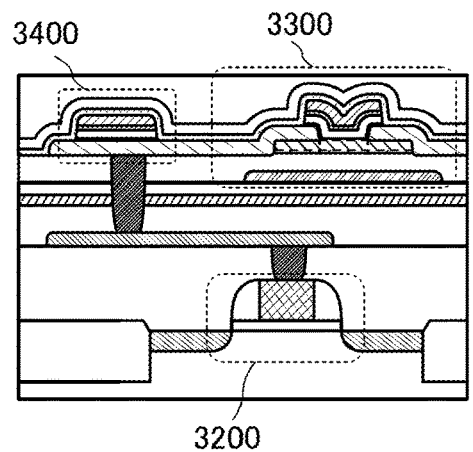
FIGS. 27A to 27C are a cross-sectional view and circuit diagrams each illustrating the structure of a semiconductor device of one embodiment.
Figure 27B:
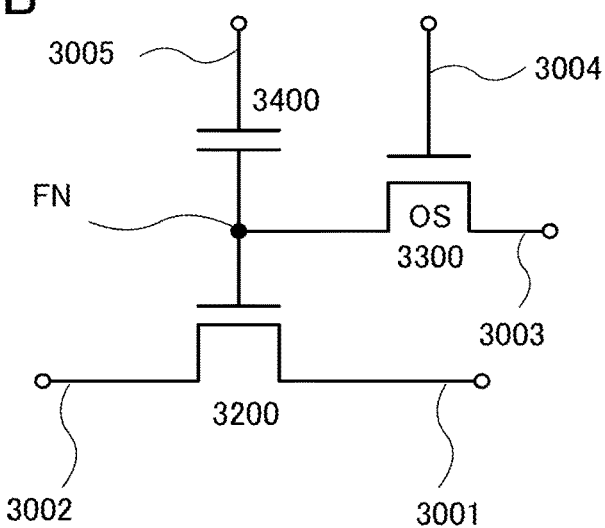
Figure 27C:
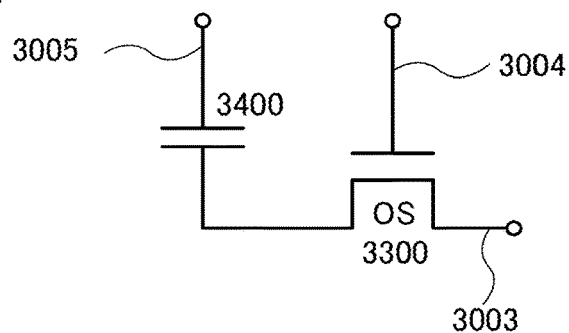

An example of a semiconductor device (memory device) that can retain stored data even when not powered and that has an unlimited number of write cycles is shown in FIGS. 27A to 27C. Note that FIG. 27B is a circuit diagram of the structure in FIG. 27A.

The semiconductor device illustrated in FIGS. 27A and 27B includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 27B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 27A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that only data of a desired memory cell can be read. For example, the fifth wiring 3005 of memory cells from which data is not read may be supplied with a potential at which the transistor 3200 is turned off regardless of the potential supplied to the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the potential supplied to the gate electrode, that is, a potential higher than $V_{th\_L}$, whereby only data of a desired memory cell can be read.

The semiconductor device illustrated in FIG. 27C is different from the semiconductor device illustrated in FIG. 27A in that the transistor 3200 is not provided. Also in this case, writing and retaining operation of data can be performed in a manner similar to case of the semiconductor device illustrated in FIG. 27A.

Next, reading of data of the semiconductor device illustrated in FIG. 27C is described. When the transistor 3300 is turned on, the third wiring 3003 that is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device described in this embodiment does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The above memory device can also be used in an LSI such as a digital signal processor (DSP), a custom LSI, or a programmable logic device (PLD) and radio frequency identification (RF-ID), in addition to a central processing unit (CPU), for example.

<CPU>

A CPU including the above memory device will be described below.

Figure 28:
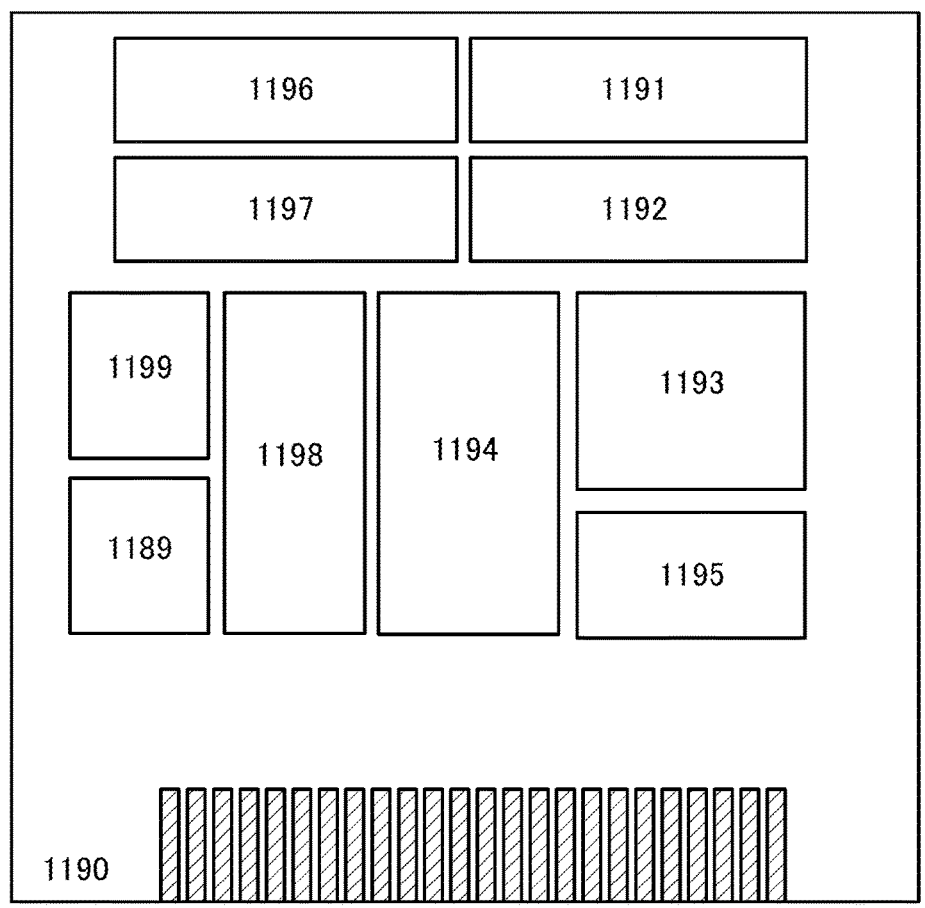
FIG. 28 is a block diagram illustrating the structure of a CPU of one embodiment.

FIG. 28 is a block diagram illustrating a configuration example of the CPU including the above memory device.

The CPU illustrated in FIG. 28 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 28 is only an example in which the configuration is simplified, and an actual CPU may have a variety of configurations depending on the application. For example, the CPU may have the following configuration: a structure including the CPU illustrated in FIG. 28 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 28, a memory cell is provided in the register 1196.

In the CPU illustrated in FIG. 28, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 29:
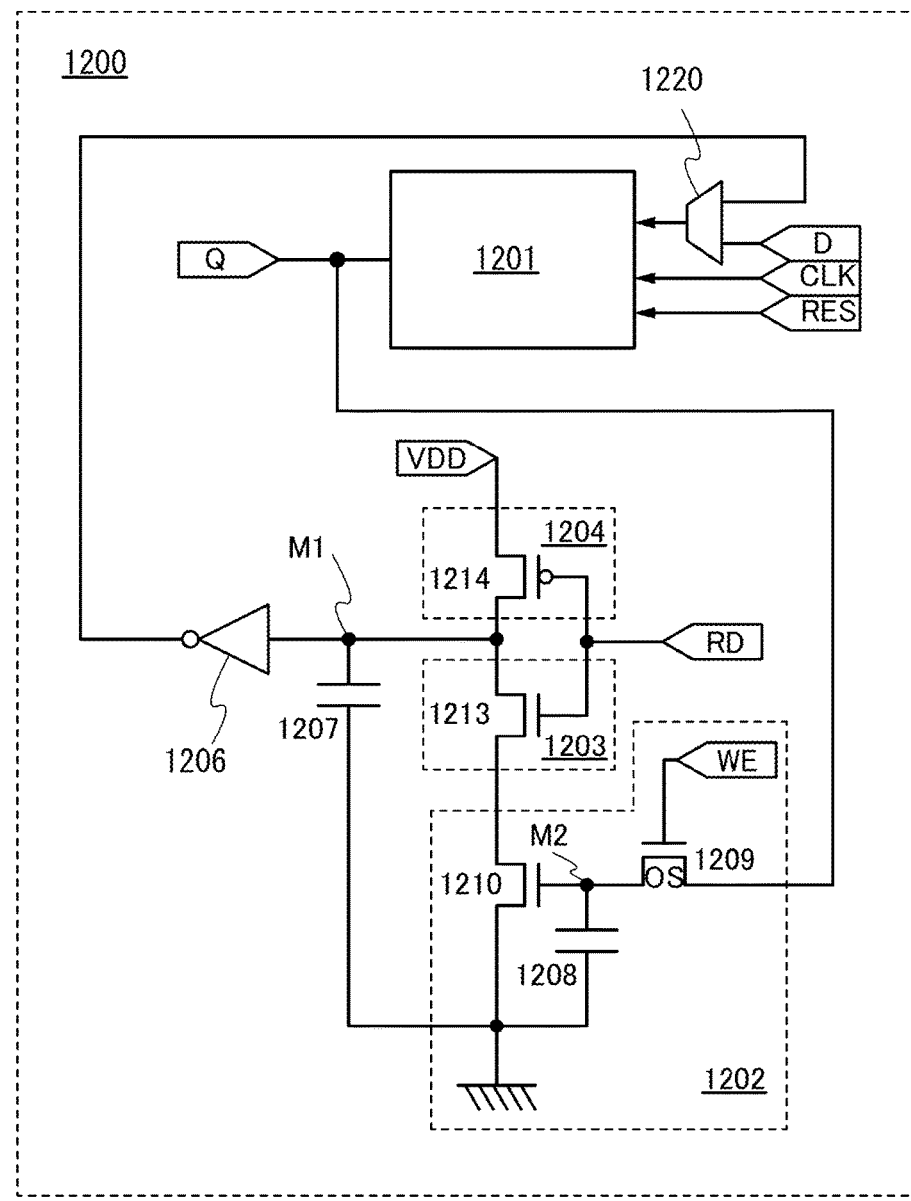
FIG. 29 is a circuit diagram illustrating the structure of a memory element of one embodiment.

FIG. 29 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used for the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node Ml. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to a first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 29 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 29, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 29, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 1200. Further alternatively, in the memory element 1200, a transistor in which a channel is formed in an oxide semiconductor film can be included besides the transistor 1209, and a transistor in which a channel is formed in a layer formed using a semiconductor other than an oxide semiconductor or the substrate 1190 can be used for the rest of the transistors.

As the circuit 1201 in FIG. 29, for example, a flip-flop circuit can be used. As the logic element 1206, for example, an inverter or a clocked inverter can be used.

In a period during which the memory element 1200 is not supplied with the power supply voltage, the semiconductor device described in this embodiment can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor in which a channel is formed in an oxide semiconductor film is used as the transistor 1209, a signal is retained in the capacitor 1208 for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the state (the on state or the off state) of the transistor 1210 is determined in accordance with the signal retained by the capacitor 1208 and can be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and radio frequency identification (RF-ID).

At least part of this embodiment can be implemented in combination with any of the other embodiments described in this specification as appropriate.

Embodiment 8

In this embodiment, a display module and electronic devices that include a display panel of one embodiment of the present invention are described with reference to FIGS. 30A to 30H.

FIGS. 30A to 30G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 30A:
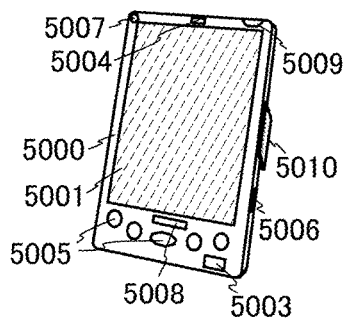
FIGS. 30A to 30H each illustrate the structure of an electronic device of one embodiment.
Figure 30B:
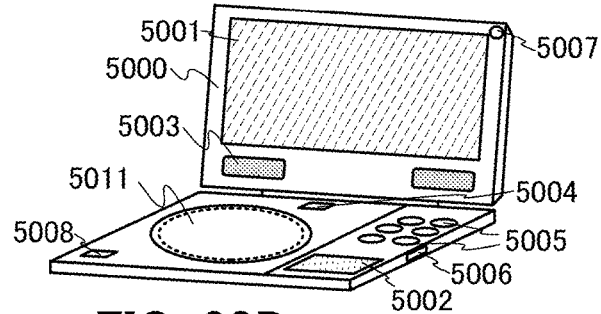
Figure 30C:
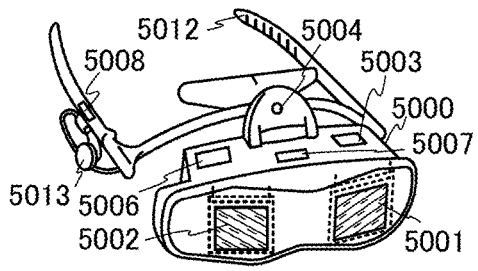
Figure 30D:
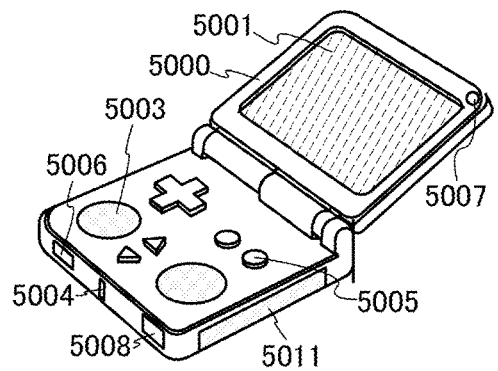
Figure 30E:
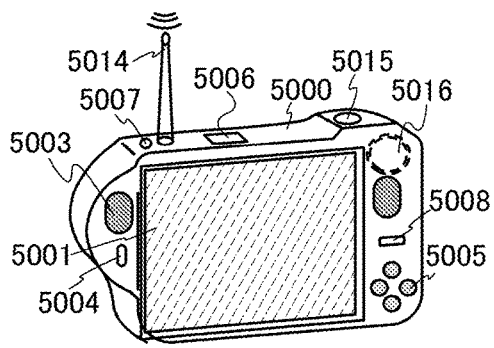
Figure 30F:
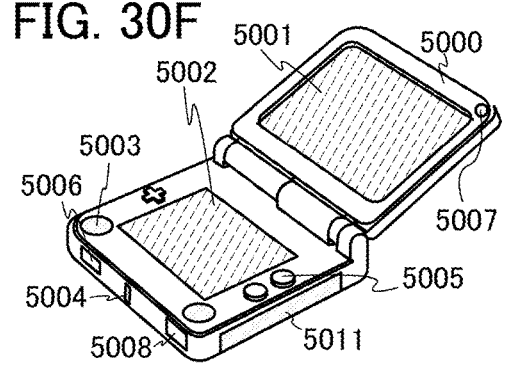
Figure 30G:
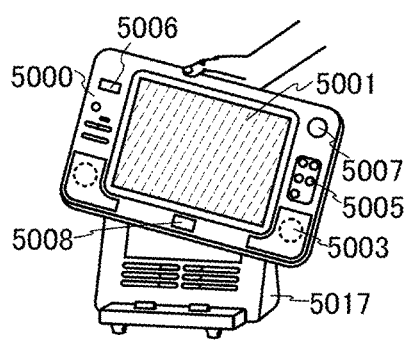

FIG. 30A illustrates a mobile computer that can include a switch 5009, an infrared port 5010, and the like in addition to the above components. FIG. 30B illustrates a portable image reproducing device (e.g., a DVD reproducing device) provided with a recording medium, and the portable image reproducing device can include a second display portion 5002, a recording medium reading portion 5011, and the like in addition to the above components. FIG. 30C illustrates a goggle-type display that can include the second display portion 5002, a support portion 5012, an earphone 5013, and the like in addition to the above components. FIG. 30D illustrates a portable game console that can include the recording medium reading portion 5011 and the like in addition to the above components. FIG. 30E illustrates a digital camera with a television reception function, and the digital camera can include an antenna 5014, a shutter button 5015, an image receiving portion 5016, and the like in addition to the above components. FIG. 30F illustrates a portable game console that can include the second display portion 5002, the recording medium reading portion 5011, and the like in addition to the above components. FIG. 30G illustrates a portable television receiver that can include a charger 5017 capable of transmitting and receiving signals, and the like in addition to the above components.

The electronic devices in FIGS. 30A to 30G can have a variety of functions such as a function of displaying a variety of data (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 30A to 30G are not limited thereto, and the electronic devices can have a variety of functions.

Figure 30H:
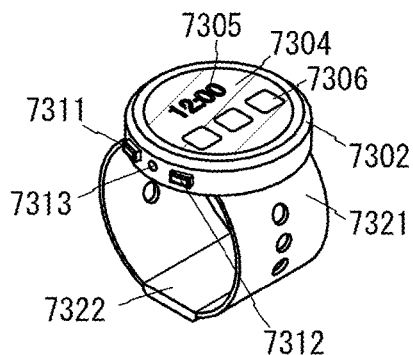

FIG. 30H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 30H can have a variety of functions such as a function of displaying a variety of data (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

This embodiment can be combined with any of the other embodiments in this specification as appropriate.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

EXAMPLE 1

In this example, a fabricated display panel of one embodiment of the present invention will be described with reference to FIGS. 31A and 31B.

Figure 31A:
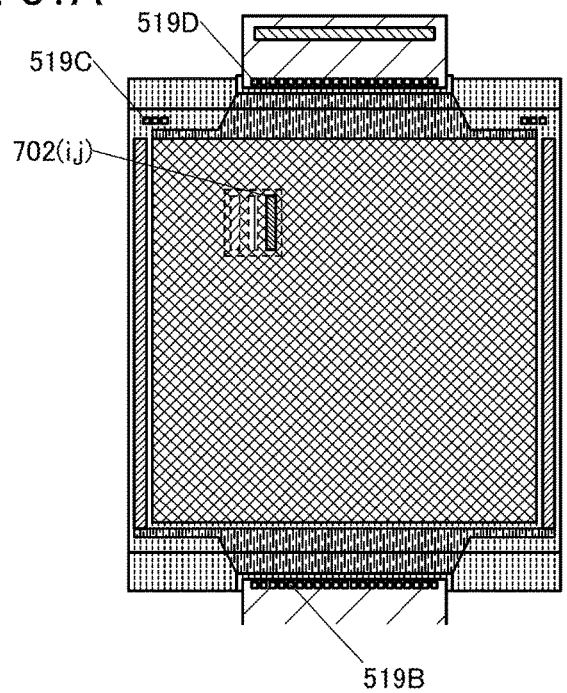
FIGS. 31A and 31B illustrate the structure of a display panel of Example.

FIG. 31A is a top view illustrating the structure of the fabricated display panel. FIG. 31B is a cross-sectional view illustrating part of the structure of the fabricated display panel.

The table below lists the specifications of the fabricated display panel.

TABLE 1

|  | Structure |  | Dimension and area of region | | | Evaluation |
|---|---|---|---|---|---|---|
|  |  |  | length/μm | width/μm | area/μm² |  |
| First electrode 751 (i, j) | Intermediate film | First conductive film | 82 | 23 | 1886 | Good |
| Terminal 519B | Intermediate film | Third conductive film | 3000 | 130 | 390000 | Good |
| Terminal 519C | Intermediate film | Third conductive film | 2500 | 19 | 47500 | Good |
| Terminal 519D | Intermediate film | Third conductive film | 1100 | 1100 | 1210000 | Good |

<Structure>

The area of a region where a conductive film is in contact with an intermediate film in each of the terminals 519B, 519C, and 519D is larger than the area of a region where the first electrode 751(i, j) is in contact with the corresponding intermediate film (see Table 1).

<<Intermediate Film>>

Figure 31B:
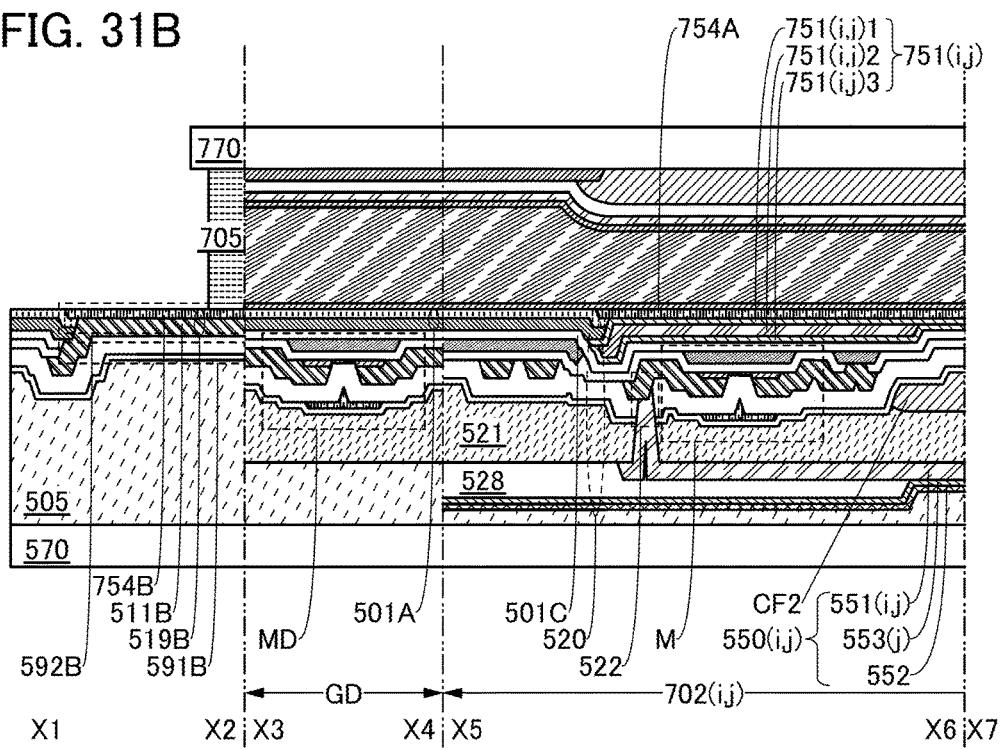

Film containing an oxide semiconductor were used for the intermediate films (see FIG. 31B). Specifically, 50-nm-thick films containing indium, gallium, zinc, and oxygen were used for the intermediate film 754A and the intermediate film 754B.

<<First Electrode 751(i, j)>>

A material in which the film 751(i, j)1 with conductivity functioning as an etching stopper, the film 751(i, j)2 with conductivity that reflects visible light, and the film 751(i, j)3 with conductivity functioning as an etching stopper were stacked was used for the first electrode 751(i, j). Specifically, a 20-nm-thick film containing indium, tin, silicon, and oxygen was used for the film 751(i, j)1, a 100-nm-thick film containing silver was used for the film 751(i, j)2, and a 100-nm-thick film containing indium, tin, silicon, and oxygen was used for the film 751(i, j)3.

<<Third Conductive Film or the Like>>

A conductive film that can be formed in the same step as a conductive film, which functions as a source electrode or a drain electrode of a transistor that can be used for the switch SW1, was used for the terminal 519B, the terminal 519C, and the terminal 519D. Specifically, a material in which a 50-nm-thick tungsten film, a 400-nm-thick aluminum film, and a 100-nm-thick titanium film were stacked in this order was used.

<Evaluation>

The first electrode 751(i, j) was able to be formed favorably without lifting-off from a process substrate in the manufacturing process.

The terminal 519B, the terminal 519C, and the terminal 519D were able to be formed favorably without lifting-off of the third conductive film from the process substrate in the manufacturing process.

Note that when a conductive film formed in the same step as a first conductive film was used instead of the conductive film functioning as the source electrode or the drain electrode of the transistor, lifting-off of the conductive film occurred in the terminal 519B, the terminal 519C, and the terminal 519D.

EXPLANATION OF REFERENCE

ACF1: conductive material, ACF2: conductive material, AF1: alignment film, AF2: alignment film, BM: light-blocking film, BR(g, h): conductive film, C1: capacitor, C2: capacitor, CF1: coloring film, CF2: coloring film, DC: detection circuit, OSC: oscillator circuit, FPC1: flexible printed circuit, FPC2: flexible printed circuit, G1(i): scan line, G2(i): scan line, GD: driver circuit, GDA: driver circuit, GDB: driver circuit, SD: driver circuit, KB1: structure body, M1: node, M2: node, M: transistor, MB: transistor, MD: transistor, MDB: transistor, P1: positional data, P2: data, S1(j): signal line, S2(j): signal line, SW1: switch, SW1B: switch, SW2: switch, V1: image data, C(g): first electrode, CL(g): control line, M(h): second electrode, ML(h): signal line, ANO: wiring, CSCOM: wiring, VCOM1: wiring, VCOM2: wiring, 100: transistor, 102: substrate, 104: conductive film, 106: insulating film, 107: insulating film, 108: oxide semiconductor film, 108a: oxide semiconductor film, 108b: oxide semiconductor film, 108c: oxide semiconductor film, 112a: conductive film, 112b: conductive film, 114: insulating film, 116: insulating film, 118: insulating film, 120a: conductive film, 120b: conductive film, 200: data processor, 210: arithmetic unit, 211: arithmetic portion, 212: memory portion, 214: transmission path, 215: input/output interface, 220: input/output device, 230: display portion, 230B: display portion, 231: display region, 232: pixel, 235EL: display element, 235LC: display element, 240: input portion, 250: sensor portion, 290: communication portion, 501A: insulating film, 501A1: film, 501A2: film, 501C: insulating film, 504: conductive film, 505: bonding layer, 506: insulating film, 508: semiconductor film, 508A: region, 508B: region, 508C: region, 510: substrate, 510W: separation film, 511B: conductive film, 511C: conductive film, 511D: conductive film, 512A: conductive film, 512B: conductive film, 516: insulating film, 518: insulating film, 519B: terminal, 519C: terminal, 519D: terminal, 520: functional layer, 521: insulating film, 522: connection portion, 524: conductive film, 528: insulating film, 530: pixel circuit, 550: display element, 551: electrode, 552: electrode, 553: layer, 570: substrate, 591A: opening, 591B: opening, 591C: opening, 592A: opening, 592B: opening, 592C: opening, 700: display panel, 700TPA: input/output device, 700TPB: input/output device, 702: pixel, 705: sealant, 706: insulating film, 709: bonding layer, 710: substrate, 719: terminal, 720: functional layer, 750: display element, 751(i, j): electrode, 751(i, j)1: film, 751(i, j)2: film, 751(i, j)3: film, 751H: opening, 752: electrode, 753: layer, 754: intermediate film, 754A: intermediate film, 754B: intermediate film, 754C: intermediate film, 770: substrate, 770D: functional film, 770P: functional film, 771: insulating film, 775: sensing element, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 3001: wiring, 3002: wiring, 3003: wiring, 3004: wiring, 3005: wiring, 3200: transistor, 3300: transistor, 3400: capacitor, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: recording medium reading portion, 5012: support portion, 5013: earphone, 5014: antenna, 5015: shutter button, 5016: image receiving portion, 5017: charger, 7302: housing, 7304: display panel, 7305: icon, 7306: icon, 7311: operation button, 7312: operation button, 7313: connection terminal, 7321: band, and 7322: clasp.

This application is based on Japanese Patent Application serial no. 2015-201639 filed with Japan Patent Office on Oct. 12, 2015, the entire contents of which are hereby incorporated by reference.

The invention claimed is:

1. A display panel comprising:
a first signal line;
a pixel; and
a terminal,
wherein the pixel is electrically connected to the first signal line,
wherein the pixel comprises a pixel circuit, a second display element, a second conductive film, a first conductive film, a first insulating film, a first display element, and a first intermediate film,
wherein the pixel circuit is electrically connected to the first signal line,
wherein the second display element is electrically connected to the pixel circuit,
wherein the second conductive film is electrically connected to the pixel circuit,
wherein the first conductive film comprises a first region overlapping with the second conductive film,
wherein the first insulating film comprises a second region between the second conductive film and the first conductive film,
wherein the first insulating film comprises an opening in the second region,
wherein the second conductive film is electrically connected to the first conductive film in the opening,
wherein the first display element is electrically connected to the first conductive film,
wherein the first display element comprises a first electrode electrically connected to the first conductive film,
wherein the first conductive film is between a third region of the first intermediate film and the first insulating film,
wherein the first intermediate film comprises a fourth region in contact with the first electrode,
wherein the terminal is electrically connected to the first signal line,
wherein the terminal comprises a third conductive film and a second intermediate film,
wherein the third conductive film is electrically connected to the first signal line,
wherein the second intermediate film comprises a fifth region in contact with the third conductive film, and
wherein an area of the fifth region is larger than an area of the fourth region.

2. The display panel according to claim 1,
wherein the first intermediate film contains a conductive oxide or an oxide semiconductor, and
wherein the second intermediate film contains a conductive oxide or an oxide semiconductor.

3. The display panel according to claim 1, wherein the area of the fourth region is greater than or equal to 400 μm$^2$ and less than or equal to 1900 μm$^2$.

4. The display panel according to claim 1, wherein the area of the fifth region is greater than or equal to 0.02 mm$^2$.

5. The display panel according to claim 1, further comprising a second insulating film,
wherein the second insulating film comprises a first opening and a second opening,
wherein the first opening comprises a sixth region overlapping with the first intermediate film and the first electrode or a seventh region overlapping with the first intermediate film and the first insulating film
wherein the second opening comprises an eighth region overlapping with the second intermediate film and the third conductive film,
wherein the second insulating film comprises a ninth region that is along an outer edge of the first opening and is between the first intermediate film and the first insulating film, and
wherein the second insulating film comprises a tenth region that is along an outer edge of the second opening and is between the second intermediate film and the third conductive film.

6. The display panel according to claim 5,
wherein the first intermediate film comprises a side end portion covered with the second insulating film, and
wherein the second intermediate film comprises a side end portion covered with the second insulating film.

7. The display panel according to claim 1, wherein the second display element is positioned so that display using the second display element can be seen from part of a region where display using the first display element can be seen.

8. The display panel according to claim 1, wherein the second display element is configured to perform display in a region surrounded by a region where the first display element performs display.

9. The display panel according to claim 1,
wherein the first display element comprises a reflective film,
wherein the first display element is configured to control an intensity of reflected light,
wherein the reflective film is configured to reflect incident light,
wherein the reflective film comprises an opening, and
wherein the second display element is configured to emit light toward the opening of the reflective film.

10. The display panel according to claim 1, further comprising:
a group of pixels;
another group of pixels; and
a scan line,
wherein the pixel is included in the group of pixels,
wherein the group of pixels are arranged in a row direction,
wherein the pixel is also included in the another group of pixels,
wherein the another group of pixels are arranged in a column direction intersecting the row direction,
wherein the scan line is electrically connected to the group of pixels arranged in the row direction,
wherein the another group of pixels arranged in the column direction are electrically connected to the first signal line, and wherein a pixel adjacent to one pixel in the row direction or the column direction comprises an opening in a position different from a position of an opening in the one pixel.

11. An input/output device comprising the display panel according to claim 1,
wherein the input/output device comprises an input portion,
wherein the input portion comprises a region overlapping with the display panel,
wherein the input portion is configured to sense an object approaching the region overlapping with the display panel,
wherein the input portion comprises a control line, a second signal line, and a sensing element,
wherein the control line extends in a row direction,
wherein the second signal line extends in a column direction intersecting the row direction,
wherein the sensing element has a light-transmitting property,
wherein the sensing element comprises a first electrode electrically connected to the control line and a second electrode electrically connected to the second signal line, and
wherein the second electrode is positioned so that an electric field that is partly blocked by the object approaching the region overlapping with the display panel is generated between the first electrode and the second electrode.

12. The input/output device according to claim 11,
wherein the sensing element comprises a region overlapping with the pixel,
wherein the first electrode comprises a light-transmitting conductive film, and
wherein the second electrode comprises a light-transmitting conductive film.

13. A data processor comprising the display panel according to claim 1,
wherein the data processor comprises one or more of a keyboard, a hardware button, a pointing device, a touch sensor, an illuminance sensor, an imaging device, an audio input device, a sight input device, and an attitude detection device.

* * * * *